(12) United States Patent
Koezuka et al.

(10) Patent No.: US 10,438,815 B2
(45) Date of Patent: *Oct. 8, 2019

(54) MANUFACTURING METHOD OF SEMICONDUCTOR DEVICE COMPRISING OXIDE SEMICONDUCTOR FILM

(71) Applicant: Semiconductor Energy Laboratory Co., Ltd., Atsugi-shi, Kanagawa-ken (JP)

(72) Inventors: Junichi Koezuka, Tochigi (JP); Daisuke Kurosaki, Tochigi (JP); Yukinori Shima, Gunma (JP); Takuya Handa, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/893,748

(22) Filed: Feb. 12, 2018

(65) Prior Publication Data

US 2018/0174862 A1 Jun. 21, 2018

Related U.S. Application Data

(63) Continuation of application No. 14/849,852, filed on Sep. 10, 2015, now Pat. No. 9,905,435.

(30) Foreign Application Priority Data

Sep. 12, 2014 (JP) .................................. 2014-186092

(51) Int. Cl.
*H01L 21/477* (2006.01)
*H01L 21/02* (2006.01)
(Continued)

(52) U.S. Cl.
CPC ........ *H01L 21/477* (2013.01); *H01L 21/0214* (2013.01); *H01L 21/02164* (2013.01);
(Continued)

(58) Field of Classification Search
None
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Andres Munoz
(74) *Attorney, Agent, or Firm* — Fish & Richardson P.C.

(57) ABSTRACT

In a semiconductor device including an oxide semiconductor, a change in electrical characteristics is inhibited and reliability is improved. The semiconductor device is manufactured by a method including first to fourth steps. The first step includes a step of forming an oxide semiconductor film, the second step includes a step of forming an oxide insulating film over the oxide semiconductor film, the third step includes a step of forming a protective film over the oxide insulating film, and the fourth step includes a step of adding oxygen to the oxide insulating film through the protective (Continued)

film. In the first step, the oxide semiconductor film is formed under a condition in which an oxygen vacancy is formed. The oxygen from the oxide insulating film fills the oxygen vacancy after the fourth step.

19 Claims, 46 Drawing Sheets

(51) Int. Cl.
  *H01L 29/49* (2006.01)
  *H01L 29/66* (2006.01)
  *H01L 29/786* (2006.01)

(52) U.S. Cl.
  CPC .. *H01L 21/02172* (2013.01); *H01L 21/02274* (2013.01); *H01L 21/02323* (2013.01); *H01L 21/02554* (2013.01); *H01L 21/02565* (2013.01); *H01L 21/02614* (2013.01); *H01L 21/02631* (2013.01); *H01L 29/4908* (2013.01); *H01L 29/66969* (2013.01); *H01L 29/7869* (2013.01); *H01L 29/78648* (2013.01); *H01L 29/78693* (2013.01)

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,767,505 B2 | 8/2010 | Son et al. |
| 8,148,721 B2 | 4/2012 | Hayashi et al. |
| 8,551,824 B2 | 10/2013 | Yamazaki et al. |
| 8,723,176 B2 | 5/2014 | Yamazaki |
| 8,748,240 B2 | 6/2014 | Yamazaki |
| 8,785,258 B2 | 7/2014 | Yamazaki |
| 8,828,794 B2 | 9/2014 | Yamazaki et al. |
| 8,828,811 B2 | 9/2014 | Yamazaki |
| 8,865,534 B2 | 10/2014 | Yamazaki |
| 8,945,982 B2 | 2/2015 | Yamazaki |
| 9,496,412 B2 | 11/2016 | Koezuka et al. |
| 9,564,535 B2 | 2/2017 | Yamazaki et al. |
| 9,640,555 B2 | 5/2017 | Okazaki et al. |
| 9,905,435 B2 * | 2/2018 | Koezuka ............. H01L 21/477 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0284844 A1 | 11/2011 | Endo et al. |
| 2013/0137232 A1 | 5/2013 | Ito et al. |
| 2013/0161611 A1 * | 6/2013 | Yamazaki ............. H01L 29/786 257/43 |
| 2013/0187150 A1 | 7/2013 | Yamazaki et al. |
| 2013/0277672 A1 | 10/2013 | Sano et al. |
| 2014/0001467 A1 | 1/2014 | Yamazaki et al. |
| 2014/0038351 A1 | 2/2014 | Yamazakis et al. |
| 2014/0103337 A1 | 4/2014 | Yamazaki et al. |
| 2014/0103338 A1 | 4/2014 | Yamazaki et al. |
| 2014/0103340 A1 | 4/2014 | Yamazaki et al. |
| 2014/0106504 A1 * | 4/2014 | Yamazaki ............. C23C 14/086 438/104 |
| 2014/0113405 A1 | 4/2014 | Tsubuku et al. |
| 2014/0151686 A1 | 6/2014 | Yamazaki et al. |
| 2014/0154837 A1 | 6/2014 | Yamazaki |

(56) References Cited

U.S. PATENT DOCUMENTS

| | | | |
|---|---|---|---|
| 2014/0175435 | A1 | 6/2014 | Yamazaki et al. |
| 2014/0225103 | A1 | 8/2014 | Tezuka et al. |
| 2015/0076496 | A1 | 3/2015 | Tanaka et al. |
| 2015/0249157 | A1* | 9/2015 | Yamazaki ............ H01L 29/7869 257/43 |
| 2015/0249160 | A1* | 9/2015 | Yamazaki ............... H01L 29/26 257/43 |
| 2015/0372022 | A1* | 12/2015 | Okazaki .............. H01L 27/1225 257/43 |
| 2016/0020329 | A1* | 1/2016 | Koezuka ............. H01L 29/7869 257/43 |
| 2017/0047435 | A1* | 2/2017 | Koezuka ............. H01L 29/7869 |

FOREIGN PATENT DOCUMENTS

| | | | |
|---|---|---|---|
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2006-165529 | A | 6/2006 |
| JP | 2011-199272 | A | 10/2011 |
| JP | 2012-009836 | A | 1/2012 |
| JP | 2013-131582 | A | 7/2013 |
| WO | WO-2004/114391 | | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorhpous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters), 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MoO3 As a Charge-Generation Layer", Adv. Mater. (Advanced Materials), 2006, vol. 18, No. 3, 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2: Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—BO Systems [A; Fe; Ga, or Al; B; Mg, Mn, Fe, Ni, Cu, or Zn] at Temperatures Over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

(56) References Cited

OTHER PUBLICATIONS

Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C. et al., "Modulated Structures of Homologous Compounds InMo3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1994.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, 899-902.
Oba.F et al., "Defect energetics in ZnO: A hybrid Hartree-Fock density functional study", Phys. Rev. B. (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, vol. 18, No. 5, pp. 501-515.
Orita.M et al., "Mechanism of Electrical Conductivity of Transparent InGaZnO4", Phys. Rev B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

FIG. 3A    FIG. 3B    FIG. 3C
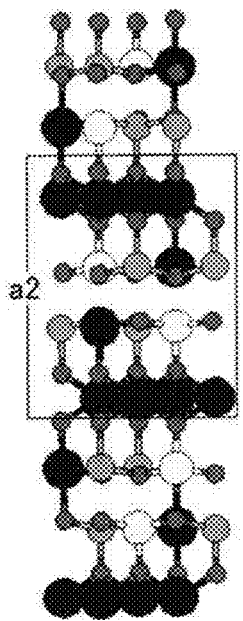
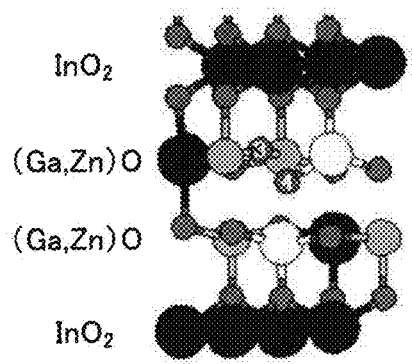
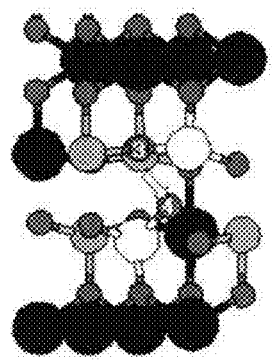
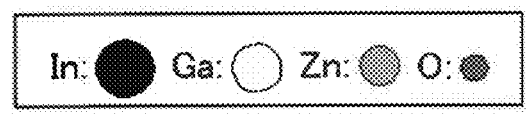

FIG. 4A
FIG. 4B
FIG. 4C
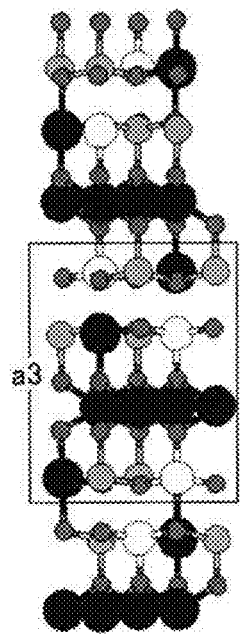
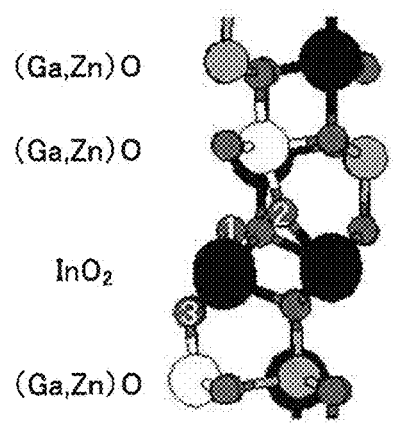
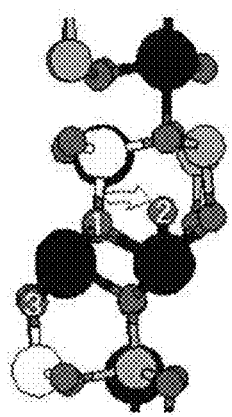
(Ga,Zn)O
(Ga,Zn)O
InO$_2$
(Ga,Zn)O
In: ● Ga: ○ Zn: ● O: ●

(Ga,Zn)O
(Ga,Zn)O
InO$_2$
(Ga,Zn)O

In: ● Ga: ○ Zn: ● O: ●

FIG. 7A  FIG. 7B  FIG. 7C
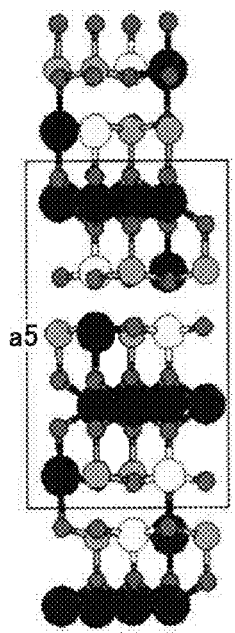
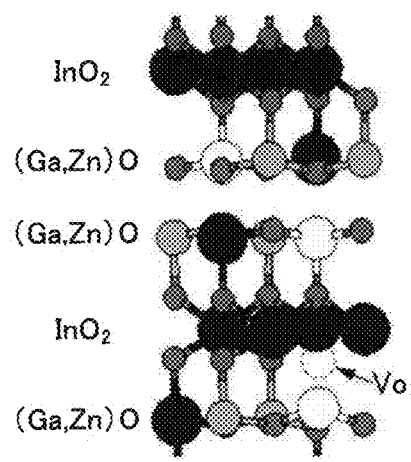
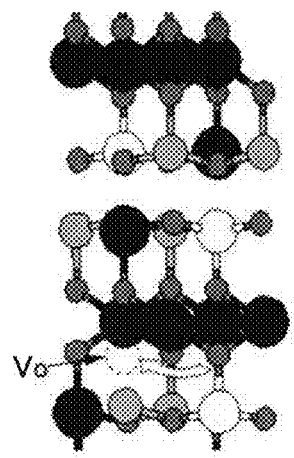
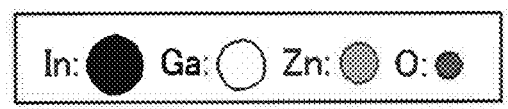

250

250

250

FIG. 25A
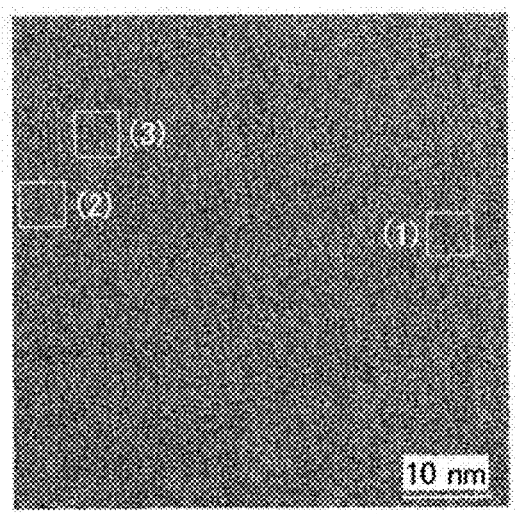
FIG. 25B          FIG. 25C          FIG. 25D
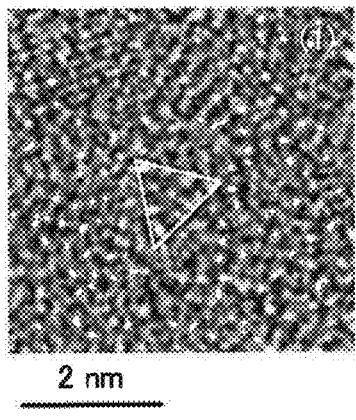 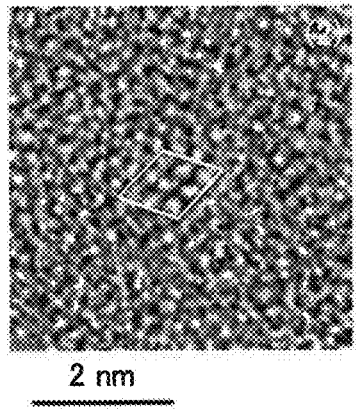 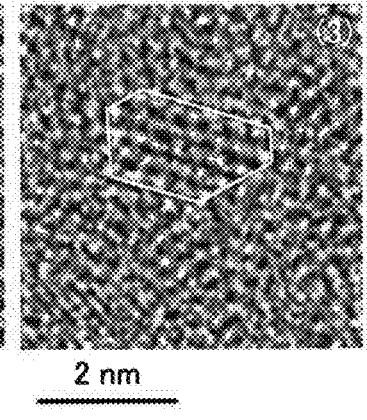

out-of-plane method
CAAC-OS in-plane method φ scan
CAAC-OS in-plane method φ scan
Single crystal OS

MANUFACTURING METHOD OF SEMICONDUCTOR DEVICE COMPRISING OXIDE SEMICONDUCTOR FILM

CROSS-REFERENCE TO RELATED APPLICATIONS

This application is a continuation of U.S. application Ser. No. 14/849,852, filed Sep. 10, 2015, now allowed, which claims the benefit of a foreign priority application filed in Japan as Serial No. 2014-186092 on Sep. 12, 2014, both of which are incorporated by reference.

BACKGROUND OF THE INVENTION

1. Field of the Invention

One embodiment of the present invention relates to a manufacturing method of a semiconductor device including an oxide semiconductor film.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. In particular, one embodiment of the present invention relates to a semiconductor device, a display device, a liquid crystal display device, a light-emitting device, a power storage device, a memory device, a driving method thereof, or a manufacturing method thereof.

2. Description of the Related Art

Attention has been focused on a technique for forming a transistor using a semiconductor thin film formed over a substrate having an insulating surface (also referred to as a field-effect transistor (FET) or a thin film transistor (TFT)). Such transistors are applied to a wide range of electronic devices such as an integrated circuit (IC) and an image display device (display device). A semiconductor material typified by silicon is widely known as a material for a semiconductor thin film that can be used in a transistor. As another material, an oxide semiconductor has been attracting attention (e.g., Patent Document 1).

Furthermore, for example, Patent document 2 discloses a semiconductor device in which, to reduce oxygen vacancies in an oxide semiconductor layer, an insulating layer which releases oxygen by heating is used as a base insulating layer of the oxide semiconductor layer where a channel is formed.

In addition, a method for manufacturing a semiconductor device in which an oxide semiconductor layer is highly purified in the following manner is disclosed: an oxide insulating layer is formed over the oxide semiconductor layer; oxygen is introduced (added) through the oxide insulating layer; heat treatment is performed; and impurities such as hydrogen, moisture, a hydroxyl group, or hydride are removed from the oxide semiconductor layer by the introduction of oxygen and the heat treatment (e.g., Patent Document 3).

REFERENCE

Patent Document

[Patent Document 1] Japanese Published Patent Application No. 2006-165529

[Patent Document 2] Japanese Published Patent Application No. 2012-009836

[Patent Document 3] Japanese Published Patent Application No. 2011-199272

SUMMARY OF THE INVENTION

In the case where a transistor is manufactured using an oxide semiconductor film for a channel region, oxygen vacancies formed in the channel region of the oxide semiconductor film adversely affect the transistor characteristics; therefore, the oxygen vacancies cause a problem. For example, oxygen vacancies formed in the channel region of the oxide semiconductor film are bonded to hydrogen to serve as a carrier supply source. The carrier supply source generated in the channel region of the oxide semiconductor film causes a change in the electrical characteristics, typically, a shift in the threshold voltage, of the transistor including the oxide semiconductor film. Further, there is a problem in that electrical characteristics fluctuate among the transistors. Therefore, it is preferable that the amount of oxygen vacancies in the channel region of the oxide semiconductor film be as small as possible.

In view of the above problem, an object of one embodiment of the present invention is to inhibit a change in electrical characteristics and to improve reliability in a semiconductor device including an oxide semiconductor. Another object of one embodiment of the present invention is to provide a manufacturing method of a semiconductor device including an oxide semiconductor in which a change in electrical characteristics is inhibited and reliability is improved. Another object of one embodiment of the present invention is to provide a manufacturing method of a semiconductor device with low power consumption. Another object of one embodiment of the present invention is to provide a novel semiconductor device. Another object of one embodiment of the present invention is to provide a method for manufacturing a novel semiconductor device. Another object of one embodiment of the present invention is to provide a novel display device.

Note that the description of the above objects does not disturb the existence of other objects. In one embodiment of the present invention, there is no need to achieve all of these objects. Other objects are apparent from and can be derived from the description of the specification and the like.

One embodiment of the present invention is a manufacturing method of a semiconductor device including a first step, a second step, a third step, and a fourth step. In the manufacturing method, the first step includes a step of forming an oxide semiconductor film, the second step includes a step of forming an oxide insulating film over the oxide semiconductor film, the third step includes a step of forming a protective film over the oxide insulating film, and the fourth step includes a step of adding oxygen to the oxide insulating film through the protective film. In the first step, the oxide semiconductor film is formed under a condition in which an oxygen vacancy is formed. The oxygen from the oxide insulating film fills the oxygen vacancy after the fourth step.

One embodiment of the present invention is a manufacturing method of a semiconductor device including a first step, a second step, a third step, a fourth step, and a fifth step. In the manufacturing method, the first step includes a step of forming an oxide semiconductor film, the second step includes a step of forming an oxide insulating film over the oxide semiconductor film, the fifth step includes a step of heating the oxide insulating film, the third step includes a step of forming a protective film over the oxide insulating film, and the fourth step includes a step of adding oxygen to the oxide insulating film through the protective film. In the first step, the oxide semiconductor film is formed under a condition in which an oxygen vacancy is formed. The oxygen from the oxide insulating film fills the oxygen vacancy after the fourth step.

One embodiment of the present invention is a manufacturing method of a semiconductor device including a first step, a second step, a third step, a fourth step, a fifth step, and a sixth step. In the manufacturing method, the first step includes a step of forming an oxide semiconductor film, the second step includes a step of forming an oxide insulating film over the oxide semiconductor film, the fifth step includes a step of heating the oxide insulating film, the third step includes a step of forming a protective film over the oxide insulating film, the fourth step includes a step of adding oxygen to the oxide insulating film through the protective film, and the sixth step includes a step of removing the protective film. In the first step, the oxide semiconductor film is formed under a condition in which an oxygen vacancy is formed. The oxygen from the oxide insulating film fills the oxygen vacancy after the fourth step.

One embodiment of the present invention is a manufacturing method of a semiconductor device including a first step, a second step, a third step, a fourth step, a fifth step, a sixth step, and a seventh step. In the manufacturing method, the first step includes a step of forming an oxide semiconductor film, the second step includes a step of forming an oxide insulating film over the oxide semiconductor film, the fifth step includes a step of heating the oxide insulating film, the third step includes a step of forming a protective film over the oxide insulating film, the fourth step includes a step of adding oxygen to the oxide insulating film through the protective film, the sixth step includes a step of removing the protective film, and the seventh step includes a step of forming a nitride insulating film over the oxide insulating film. In the first step, the oxide semiconductor film is formed under a condition in which an oxygen vacancy is formed. The oxygen from the oxide insulating film fills the oxygen vacancy after the fourth step.

One embodiment of the present invention is a manufacturing method of a semiconductor device including a first step, a second step, a third step, a fourth step, a fifth step, a sixth step, a seventh step, an eighth step, a ninth step, and a tenth step. In the manufacturing method, the eighth step includes a step of forming a gate electrode, the ninth step includes a step of forming a gate insulating film over the gate electrode, the first step includes a step of forming an oxide semiconductor film over the gate insulating film, the tenth step includes a step of forming a source electrode and a drain electrode over the oxide semiconductor film, the second step includes a step of forming an oxide insulating film over the oxide semiconductor film, the source electrode, and the drain electrode, the fifth step includes a step of heating the oxide insulating film, the third step includes a step of forming a protective film over the oxide insulating film, the fourth step includes a step of adding oxygen to the oxide insulating film through the protective film, the sixth step includes a step of removing the protective film, and the seventh step includes a step of forming a nitride insulating film over the oxide insulating film. In the first step, the oxide semiconductor film is formed under a condition in which an oxygen vacancy is formed. The oxygen from the oxide insulating film fills the oxygen vacancy after the fourth step.

In each of the above-described structures, the oxide semiconductor film is preferably formed with a sputtering apparatus in the first step, and the condition in which the oxygen vacancy is formed is preferably an oxygen partial pressure in the sputtering apparatus of higher than 0% and lower than 50%.

In each of the above-described structures, a step of heating the oxide semiconductor film is preferably further performed after the first step, and an oxygen vacancy is preferably formed in the oxide semiconductor film in the step of heating the oxide semiconductor film. Moreover, the step of heating the oxide semiconductor film is preferably performed in an atmosphere in which an oxygen partial pressure is lower than or equal to 1%.

In each of the above-described structures, the step of adding oxygen is preferably performed with a plasma treatment apparatus.

In each of the above-described structures, the protective film preferably includes at least one element selected from In, Zn, Ga, Sn, Ti, Al, W, Ta, Mo, and Si.

In each of the above-described structures, the oxide semiconductor film preferably includes In, Zn, and M, where M is Ti, Ga, Y, Zr, La, Ce, Nd, Sn, or Hf. Moreover, the oxide semiconductor film preferably includes a crystal part, and the crystal part preferably includes a portion whose c-axis is parallel to a normal vector of a surface over which the oxide semiconductor film is formed.

With one embodiment of the present invention, a change in electrical characteristics can be inhibited and reliability can be improved in a semiconductor device including an oxide semiconductor. With one embodiment of the present invention, a manufacturing method of a semiconductor device including an oxide semiconductor in which a change in electrical characteristics is inhibited and reliability is improved, can be provided. With one embodiment of the present invention, a manufacturing method of a semiconductor device with low power consumption can be provided. With one embodiment of the present invention, a novel semiconductor device can be provided. With one embodiment of the present invention, a method for manufacturing a novel semiconductor device can be provided. With one embodiment of the present invention, a novel display device can be provided.

Note that the description of these effects does not disturb the existence of other effects. One embodiment of the present invention does not necessarily have all of these effects. Other effects will be apparent from and can be derived from the description of the specification, the drawings, the claims, and the like.

BRIEF DESCRIPTION OF THE DRAWINGS

In the accompanying drawings:

FIGS. 3A to 3C are model diagrams used for calculation of movement of excess oxygen;

FIGS. 4A to 4C are model diagrams used for calculation of movement of excess oxygen;

FIGS. 7A to 7C are model diagrams used for calculation of movement of an oxygen vacancy;

FIGS. 25A to 25D are Cs-corrected high-resolution TEM images of a plane of a CAAC-OS;

DETAILED DESCRIPTION OF THE INVENTION

Figure 1A:
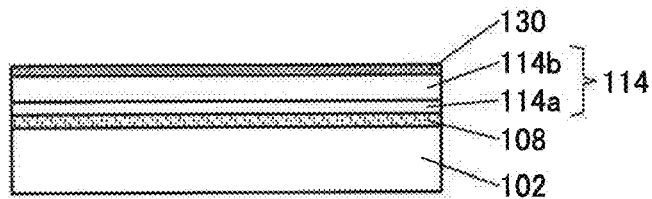
FIGS. 1A to 1E are cross-sectional views illustrating a semiconductor device and an example of a manufacturing process of the semiconductor device.

Hereinafter, embodiments will be described with reference to drawings. The embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

Note that in this specification, terms for describing arrangement, such as "over" "above", "under", and "below", are used for convenience in describing a positional relation between components with reference to drawings. Further, the positional relation between components is changed as appropriate in accordance with a direction in which the component are described. Thus, the positional relation is not limited to that described with a term used in this specification and can be explained with another term as appropriate depending on the situation.

The "semiconductor device" in this specification and the like means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may include a semiconductor device.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain region, the channel region, and the source region. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

Note that in this specification and the like, a "silicon oxynitride film" refers to a film that includes oxygen at a higher proportion than nitrogen, and a "silicon nitride oxide film" refers to a film that includes nitrogen at a higher proportion than oxygen.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. Furthermore, the term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

Embodiment 1

In this embodiment, a semiconductor device that is one embodiment of the present invention, a manufacturing method of the semiconductor device, and the like are described with reference to FIGS. 1A to 1E to FIGS. 10A and 10B and FIG. 23.

<1-1. Structural Example of Semiconductor Device>

FIG. 1A is a cross-sectional view illustrating a semiconductor device 100 of one embodiment of the present invention. FIGS. 1B to 1E are cross-sectional views illustrating a manufacturing method of the semiconductor device 100.

The semiconductor device 100 illustrated in FIG. 1A includes an oxide semiconductor film 108 over a substrate 102, an oxide insulating film 114 over the oxide semiconductor film 108, and a protective film 130 over the oxide insulating film 114. In this embodiment, the oxide insulating film 114 includes an oxide insulating film 114a and an oxide insulating film 114b over the oxide insulating film 114a.

In the step of forming the oxide semiconductor film 108 of the semiconductor device 100 of one embodiment of the present invention, oxygen vacancies (also referred to as Vo) are formed in the oxide semiconductor film 108. Then, oxygen is supplied from the oxide insulating film 114 positioned over the oxide semiconductor film 108, so that the oxygen vacancies are filled. Note that in the step of forming the oxide semiconductor film 108, minute defects or lattice defects may be formed at the same time as the oxygen vacancies in the oxide semiconductor film 108. Oxygen can be favorably supplied from the oxide insulating film 114 to the oxide semiconductor film 108 by using the oxygen vacancies, the minute defects, or the lattice defects as a diffusion path of excess oxygen.

Furthermore, in the semiconductor device 100 of one embodiment of the present invention, the protective film 130 is formed over the oxide insulating film 114, and oxygen is added to the oxide insulating film 114 through the protective film 130. By adding oxygen to the oxide insulating film 114 through the protective film 130, the oxide insulating film 114 can include oxygen more than that in the stoichiometric composition. The oxide insulating film 114 releases oxygen by being heated. By the release of oxygen, oxygen can be supplied to the oxide semiconductor film 108.

Thus, in the semiconductor device 100 of one embodiment of the present invention, the oxide semiconductor film 108 includes many oxygen vacancies right after it is formed, but can become an oxide semiconductor film including few oxygen vacancies by the supply of excess oxygen from the oxide insulating film 114 to the oxide semiconductor film 108.

First, each component of the semiconductor device 100 is described below.

(Substrate)

Although there is no particular limitation on a material which can be used as the substrate 102, it is necessary that the material have at least heat resistance high enough to withstand heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 102. Furthermore, any of these substrates further provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Still further alternatively, a flexible substrate may be used as the substrate 102, and the oxide semiconductor film 108 may be provided directly on the flexible substrate. Alternatively, a separation layer may be provided between the substrate 102 and the oxide semiconductor film 108. The separation layer can be used when part or the whole of the semiconductor device 100 formed over the separation layer is separated from the substrate 102 and transferred onto another substrate. In such a case, the semiconductor device 100 can be transferred to a substrate having low heat resistance or a flexible substrate.

(Oxide Semiconductor Film)

The oxide semiconductor film 108 contains In, Zn, and M (M is Ti, Ga, Y, Zr, La, Ce, Nd, Sn, or Hf). Typically, In—Ga oxide, In—Zn oxide, or In-M-Zn oxide can be used for the oxide semiconductor film 108. It is particularly preferable to use In-M-Zn oxide where M is Ga (i.e., In—Ga—Zn oxide; hereinafter referred to as IGZO) for the oxide semiconductor film 108.

In the case where the oxide semiconductor film 108 is formed of In-M-Zn oxide, it is preferable that the atomic ratio of metal elements of a sputtering target used for forming the In-M-Zn oxide satisfy In≥M and Zn≥M. As the atomic ratio of metal elements of the sputtering target, In:M:Zn=1:1:1, In:M:Zn=1:1:1.2, In:M:Zn=2:1:3, In:M:Zn=3:1:2, and In:M:Zn=4:2:4.1 are preferable. Note that the atomic ratio of metal elements in the formed oxide semiconductor film 108 varies from the above atomic ratios of metal elements of the sputtering targets in a range of ±40%. For example, when a sputtering target with an atomic ratio of In to Ga and Zn of 4:2:4.1 is used, the atomic ratio of In to Ga and Zn in the oxide semiconductor film 108 may be 4:2:3 or in the vicinity of 4:2:3.

Note that in the case where the oxide semiconductor film 108 is an In-M-Zn oxide film, the proportion of In and the proportion of M, not taking Zn and O into consideration, are preferably greater than 25 atomic % and less than 75 atomic %, respectively, and further preferably greater than 34 atomic % and less than 66 atomic %, respectively.

The energy gap of the oxide semiconductor film 108 is 2 eV or more, preferably 2.5 eV or more and further preferably 3 eV or more.

The thickness of the oxide semiconductor film 108 is greater than or equal to 3 nm and less than or equal to 200 nm, preferably greater than or equal to 3 nm and less than or equal to 100 nm and further preferably greater than or equal to 3 nm and less than or equal to 50 nm.

An oxide semiconductor film with low carrier density is used as the oxide semiconductor film 108. For example, an oxide semiconductor film whose carrier density is lower than or equal to $1 \times 10^{17}/cm^3$, preferably lower than or equal to $1 \times 10^{15}/cm^3$, further preferably lower than or equal to $1 \times 10^{13}/cm^3$, and still further preferably lower than or equal to $1 \times 10^{11}/cm^3$ is used as the oxide semiconductor film 108.

The oxide semiconductor film 108 may have a non-single-crystal structure, for example. The non-single-crystal structure includes a c-axis aligned crystalline oxide semiconductor (CAAC-OS) which is described later, a polycrystalline structure, a microcrystalline structure described later, or an amorphous structure, for example. Among the non-single-crystal structures, the amorphous structure has the highest density of defect states, whereas CAAC-OS has the lowest density of defect states.

The oxide semiconductor film 108 may have an amorphous structure, for example. The oxide semiconductor film having the amorphous structure has disordered atomic arrangement and no crystalline component, for example. Alternatively, the oxide film having an amorphous structure has, for example, an absolutely amorphous structure and no crystal part.

Note that the oxide semiconductor film 108 may be a mixed film including two or more of the following regions: a region having an amorphous structure, a region having a microcrystalline structure, a region having a polycrystalline structure, a CAAC-OS region, and a region having a single crystal structure. The mixed film may have a single-layer structure including, for example, two or more of the following regions: a region having an amorphous structure, a region having a microcrystalline structure, a region having a polycrystalline structure, a CAAC-OS region, and a region having a single crystal structure. The mixed film may have a stacked-layer structure including, for example, two or more of the following regions: a region having an amorphous structure, a region having a microcrystalline structure, a region having a polycrystalline structure, a CAAC-OS region, and a region having a single crystal structure.

(Oxide Insulating Film)

The oxide insulating film 114 has a function of supplying oxygen to the oxide semiconductor film 108.

The oxide insulating film 114 can have a structure including oxygen and silicon. For example, a silicon oxide film or a silicon oxynitride film can be used as the oxide insulating film 114.

The oxide insulating film 114 may have a single-layer structure or a stacked-layer structure of two or more layers. In this embodiment, the oxide insulating film 114 having a stacked-layer structure of two layers which are the oxide insulating film 114a and the oxide insulating film 114b is described.

As the oxide insulating film 114a, a silicon oxide film, a silicon oxynitride film, or the like with a thickness greater than or equal to 5 nm and less than or equal to 150 nm, preferably greater than or equal to 5 nm and less than or equal to 50 nm can be used.

Further, it is preferable that the number of defects in the oxide insulating film 114a be small and typically, the spin density corresponding to a signal that appears at g=2.001 due to a dangling bond of silicon be lower than or equal to $3 \times 10^{17}$ spins/cm$^3$ by electron spin resonance (ESR) measurement. This is because if the density of defects in the oxide insulating film 114a is high, oxygen is bonded to the defects and the amount of oxygen that passes through the oxide insulating film 114a is decreased.

Note that all oxygen entering the oxide insulating film 114a from the outside does not move to the outside of the oxide insulating film 114a and some oxygen remains in the oxide insulating film 114a. Furthermore, movement of oxygen occurs in the oxide insulating film 114a in some cases in such a manner that oxygen enters the oxide insulating film 114a and oxygen contained in the oxide insulating film 114a is moved to the outside of the oxide insulating film 114a. When the oxide insulating film through which oxygen can pass is formed as the oxide insulating film 114a, oxygen released from the oxide insulating film 114b provided over the oxide insulating film 114a can be moved to the oxide semiconductor film 108 through the oxide insulating film 114a.

Note that the oxide insulating film 114a can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases little nitrogen oxide, an aluminum oxynitride film that releases little nitrogen oxide, or the like can be used as the above oxide insulating film.

Note that a silicon oxynitride film that releases little nitrogen oxide is a film of which the amount of released ammonia is larger than the amount of released nitrogen oxide in thermal desorption spectroscopy (TDS) analysis; the amount of released ammonia is typically greater than or equal to $1 \times 10^{18}/cm^3$ and less than or equal to $5 \times 10^{19}/cm^3$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

The oxide insulating film 114b is formed using an oxide insulating film that includes oxygen more than that in the stoichiometric composition. Part of oxygen is released by heating from the oxide insulating film including oxygen more than that in the stoichiometric composition. The oxide insulating film including oxygen more than that in the stoichiometric composition is an oxide insulating film of which the amount of released oxygen converted into oxygen atoms is greater than or equal to $1.0 \times 10^{19}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the oxide insulating film 114b.

It is preferable that the number of defects in the oxide insulating film 114b be small, and typically the spin density corresponding to a signal which appears at g=2.001 due to a dangling bond of silicon be lower than $1.5 \times 10^{18}$ spins/cm$^3$, preferably lower than or equal to $1 \times 10^{18}$ spins/cm$^3$ by ESR measurement. Note that the oxide insulating film 114b is provided more apart from the oxide semiconductor film 108 than the oxide insulating film 114a is; thus, the oxide insulating film 114b may have higher density of defects than the oxide insulating film 114a.

Furthermore, the oxide insulating films 114a and 114b can be formed using insulating films formed of the same kinds of materials; thus, a boundary between the oxide insulating films 114a and 114b cannot be clearly observed in some cases. Although a two-layer structure of the oxide insulating films 114a and 114b is described in this embodiment, the present invention is not limited to this. For example, a single-layer structure of the oxide insulating film 114a or the oxide insulating film 114b may be employed.

(Protective Film)

The protective film 130 has a function of inhibiting release of oxygen from the oxide insulating film 114. The protective film 130 includes at least one element selected from In, Zn, Ga, Sn, Ti, Al, W, Ta, Mo, and Si. For example, the protective film 130 can be formed of an oxide or a nitride of the above-described element. It is preferable that the protective film 130 be formed of an oxide including In, Sn, and Si (an In—Sn—Si oxide: also referred to as ITSO) because the protective film 130 can transmit oxygen at the time of adding oxygen and inhibit release of oxygen after the oxygen addition.

<1-2. Manufacturing Method of Semiconductor Device>

Next, the manufacturing method of the semiconductor device 100 is described with reference to FIGS. 1B to 1E.

(1. Step of Forming an Oxide Semiconductor Film)

Figure 1B:

The oxide semiconductor film 108 is formed over the substrate 102 (see FIG. 1B).

In this embodiment, the oxide semiconductor film 108 is formed with a sputtering apparatus. An In—Ga—Zn metal oxide target (In:Ga:Zn=4:2:4.1 in an atomic ratio) is provided in the sputtering apparatus. The oxide semiconductor film 108 is formed under conditions where oxygen vacancies are formed.

In the case where the oxide semiconductor film 108 is formed with the sputtering apparatus, a rare gas (typically argon), oxygen, or a mixed gas of a rare gas and oxygen is used as a sputtering gas. In the case of using the mixed gas, the proportion of oxygen to a rare gas is preferably decreased to increase oxygen vacancies in the oxide semiconductor film 108. For example, when the partial pressure of oxygen in the sputtering apparatus is higher than 0% and lower than 50%, oxygen vacancies in the oxide semiconductor film 108 can be increased. Note that in the case where the partial pressure of oxygen in the sputtering apparatus is 0%, oxygen vacancies are excessively increased in the oxide semiconductor film 108 or the film quality of the oxide semiconductor film 108 is changed, and accordingly, in some cases, the oxygen vacancies cannot be filled or the resistance of the oxide semiconductor film 108 is not decreased by the later addition of excess oxygen to the oxide semiconductor film 108. Therefore, it is preferable to set the partial pressure of oxygen in formation of the oxide semiconductor film 108 to be at least higher than 0%. Furthermore, in the case of forming the oxide semiconductor film 108, the partial pressure of oxygen in the sputtering apparatus may be higher than or equal to 50% and lower than or equal to 100%. In this case, the number of oxygen vacancies is small in the oxide semiconductor film 108; therefore, a heating step may be performed in a period after the oxide semiconductor film 108 is formed and before the oxide insulating film 114 is formed to increase oxygen vacancies in the oxide semiconductor film 108.

In this embodiment, the oxide semiconductor film 108 is formed at an oxygen partial pressure of 30% in the sputtering apparatus.

In the formation of the oxide semiconductor film 108 with the sputtering apparatus, increasing the purity of the sputtering gas is necessary. For example, an oxygen gas or an argon gas used for a sputtering gas is highly purified to have a dew point of −40° C. or lower, preferably −80° C. or lower, further preferably −100° C. or lower, still further preferably −120° C. or lower, whereby entry of moisture or the like into the oxide semiconductor film 108 can be minimized. Furthermore, a chamber in the sputtering apparatus is preferably subjected to high vacuum evacuation (to a vacuum of about $5 \times 10^{-7}$ Pa to $1 \times 10^{-4}$ Pa) with use of a suction vacuum evacuation pump such as a cryopump so that water or the like, which is an impurity for the oxide semiconductor film 108, is removed as much as possible. Alternatively, a turbo molecular pump and a cold trap are preferably combined so as to prevent a backflow of a gas, especially a gas containing carbon or hydrogen from an exhaust system to the inside of the chamber.

In the case of performing the heating step after the oxide semiconductor film 108 is formed, the heating step may be performed at a temperature higher than or equal to 150° C. and lower than the strain point of the substrate, preferably higher than or equal to 200° C. and lower than or equal to 450° C., or further preferably higher than or equal to 300° C. and lower than or equal to 450° C. The heating step performed here serves as one kind of treatment for increasing the purity of the oxide semiconductor film and can reduce hydrogen, water, and the like contained in the oxide semiconductor film 108. In addition, the heating step is one kind of treatment for increasing oxygen vacancies in the oxide semiconductor film 108.

An electric furnace, an RTA apparatus, or the like can be used for the heating step performed on the oxide semiconductor film 108. With the use of an RTA apparatus, heat treatment can be performed at a temperature higher than or equal to the strain point of the substrate if the heating time is short. Therefore, the heat treatment time can be shortened.

In the case of performing the heating step after the oxide semiconductor film 108 is formed, the heating step may be performed under an atmosphere of nitrogen, ultra-dry air (air in which a water content is 20 ppm or less, preferably 1 ppm or less, further preferably 10 ppb or less), or a rare gas (argon, helium, or the like). In the case of performing the heating step after the oxide semiconductor film 108 is formed, the heating step may be performed in a reduced-pressure atmosphere (an atmosphere at a pressure lower than the atmospheric pressure). In the case of performing the heating step after the oxide semiconductor film 108 is formed, the heating step is preferably performed under an atmosphere with an oxygen partial pressure of 1% or lower. For example, in the case of performing the heating step after the oxide semiconductor film 108 is formed, if the heating step is performed under an atmosphere with an oxygen partial pressure of higher than 1%, oxygen might be supplied to the oxide semiconductor film 108 before formation of the oxide insulating film 114 to fill oxygen vacancies in the oxide semiconductor film 108.

It should be noted that oxygen vacancies in the oxide semiconductor film 108 are preferably filled with excess oxygen from the oxide insulating film 114. For example, in the case of performing the heating step under an atmosphere with an oxygen partial pressure of higher than 1% after the oxide semiconductor film 108 is formed, oxygen vacancies in the vicinity of the surface of the oxide semiconductor film 108 might be filled but oxygen vacancies in the oxide semiconductor film 108 or in the vicinity of a formation surface of the oxide semiconductor film 108 might not be filled.

Furthermore, in the case where the oxide semiconductor film 108 is a crystalline oxide semiconductor film such as a CAAC-OS film to be described later, a plurality of In—O layers overlapping in the c-axis direction might inhibit the passing of excess oxygen. In this case, plasma treatment or the like may be performed on the surface and its vicinity of the oxide semiconductor film 108 to lower the crystallinity of the surface and its vicinity of the oxide semiconductor film 108, that is, to increase minute defects or lattice defects in the surface or its vicinity of the oxide semiconductor film 108. The increase in minute defects or lattice defects in the surface or its vicinity of the oxide semiconductor film 108 enables favorable addition of excess oxygen to the oxide semiconductor film via the minute defects or the lattice defects or favorable diffusion of oxygen toward the bottom region of the oxide semiconductor film 108 at the time of supplying oxygen from the oxide insulating film 114 that is in contact with the upper surface side of the oxide semiconductor film 108.

(2. Step of Forming an Oxide Insulating Film)

Figure 1C:
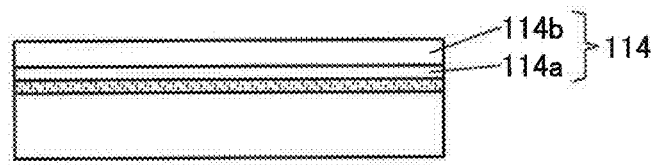

Next, the oxide insulating film 114 is formed over the oxide semiconductor film 108 (see FIG. 1C).

In this embodiment, as the oxide insulating film 114a and the oxide insulating film 114b, silicon oxynitride films are used.

After the oxide insulating film 114a is formed, the oxide insulating film 114b is preferably formed in succession without exposure to the air. When the oxide insulating film 114b is formed by adjusting at least one of the flow rate of a source gas, pressure, a high-frequency power, and a substrate temperature without exposure to the air after the oxide insulating film 114a is formed, the concentration of impurities attributed to the atmospheric component at the interface between the oxide insulating film 114a and the oxide insulating film 114b can be reduced.

For example, in the case where a silicon oxynitride film is formed as the oxide insulating film 114a by a PECVD method, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. The oxide insulating film 114a can include nitrogen and have a small number of defects by setting the ratio of the oxidizing gas to the deposition gas to be higher than 20 times and lower than 100 times, preferably higher than or equal to 40 times and lower than or equal to 80 times and the pressure in a treatment chamber to be lower than 100 Pa, preferably lower than or equal to 50 Pa in the PECVD method.

In this embodiment, a silicon oxynitride film is formed as the oxide insulating film 114a by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ W/cm$^2$ as the power density) is supplied to parallel-plate electrodes.

As the oxide insulating film 114b, a silicon oxynitride film is formed under the conditions where the substrate placed in a treatment chamber of the PECVD apparatus, which is vacuum-evacuated, is held at a temperature higher than or equal to 180° C. and lower than or equal to 280° C., preferably higher than or equal to 200° C. and lower than or equal to 240° C., the pressure in the treatment chamber is greater than or equal to 100 Pa and less than or equal to 250 Pa, preferably greater than or equal to 100 Pa and less than or equal to 200 Pa with introduction of a source gas into the treatment chamber, and a high-frequency power greater than or equal to 0.17 W/cm$^2$ and less than or equal to 0.5 W/cm$^2$, preferably greater than or equal to 0.25 W/cm$^2$ and less than or equal to 0.35 W/cm$^2$, is supplied to an electrode provided in the treatment chamber.

As the film formation conditions of the oxide insulating film 114b, the high-frequency power having the above power density is supplied to a reaction chamber having the above pressure, whereby the degradation efficiency of the source gas in plasma is increased, oxygen radicals are increased, and oxidation of the source gas is promoted; thus, the oxygen content in the oxide insulating film 114b becomes higher than that in the stoichiometric composition. In the film formed at a substrate temperature within the above temperature range, however, the bond between silicon and oxygen is weak, and part of oxygen in the film is released by heat treatment in a later step. Thus, it is possible to form an oxide insulating film which includes oxygen more than that in the stoichiometric composition and from which part of oxygen is released by heating.

Note that in the deposition conditions of the oxide insulating film 114b, when the flow rate of the deposition gas containing silicon with respect to the oxidizing gas is increased, the amount of defects in the oxide insulating film 114b can be reduced. Typically, it is possible to form an oxide insulating film in which the number of defects is small, that is, the spin density corresponding to a signal which appears at g=2.001 due to a dangling bond of silicon is lower than $6 \times 10^{17}$ spins/cm$^3$, preferably lower than or equal to $3 \times 10^{17}$ spins/cm$^3$, and further preferably lower than or equal to $1.5 \times 10^{17}$ spins/cm$^3$, by ESR measurement.

After the step of forming the oxide insulating film 114, a step of heating the oxide insulating film 114 may be performed. In this case, impurities such as hydrogen or water contained in the oxide insulating film 114 can be removed.

The temperature of the step of heating the oxide insulating film 114 is typically higher than or equal to 150° C. and lower than or equal to 400° C., preferably higher than or equal to 300° C. and lower than or equal to 400° C., further preferably higher than or equal to 320° C. and lower than or equal to 370° C. The heat treatment may be performed under an atmosphere of nitrogen, oxygen, ultra-dry air (air in which a water content is 20 ppm or less, preferably 1 ppm or less, further preferably 10 ppb or less), or a rare gas (argon, helium, or the like). Note that an electric furnace, an RTA apparatus, or the like can be used for the heat treatment during which it is preferable that hydrogen, water, and the like not be contained in the nitrogen, oxygen, ultra-dry air, or rare gas.

(3. Step of Forming a Protective Film)

Figure 1D:
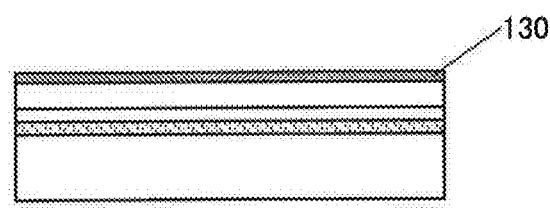

Next, the protective film 130 is formed over the oxide insulating film 114 (see FIG. 1D).

In this embodiment, an ITSO film is used as the protective film 130. The ITSO film used as the protective film 130 is formed to have a thickness of 5 nm with a sputtering apparatus. Note that the thickness of the protective film 130 is preferably greater than or equal to 1 nm and less than or equal to 20 nm or greater than or equal to 2 nm and less than or equal to 10 nm, in which case oxygen is favorably transmitted and release of oxygen can be inhibited.

(4. Step of Adding Oxygen to the Oxide Insulating Film)

Figure 1E:
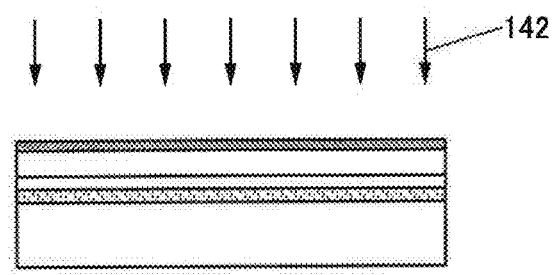

Next, oxygen 142 is added to the oxide insulating film 114 through the protective film 130 (see FIG. 1E).

As a method for adding the oxygen 142 to the oxide insulating film 114 through the protective film 130, there are an ion doping method, an ion implantation method, plasma treatment, and the like. A plasma apparatus is preferably used for the method for adding the oxygen 142 because a large amount of oxygen can be added to the oxide insulating film 114. By adding the oxygen 142 to the oxide insulating film 114 through the protective film 130, the oxygen 142 may be added to the oxide semiconductor film 108.

By application of bias voltage to the substrate 102 side when the oxygen 142 is added, the oxygen 142 can be effectively added to the oxide insulating film 114. The bias voltage is applied, for example, by an ashing apparatus with the power density applied to the substrate side of the ashing apparatus be set to be greater than or equal to 1 W/cm$^2$ and less than or equal to 5 W/cm$^2$. When the substrate temperature during addition of the oxygen 142 is higher than or equal to room temperature and lower than or equal to 300° C., preferably higher than or equal to 100° C. and lower than or equal to 250° C., the oxygen can be added efficiently to the oxide insulating film 114. In the case where oxygen is introduced by plasma treatment, oxygen may be made excited by a microwave to generate high density oxygen plasma, so that the amount of oxygen introduced into the oxide insulating film 114 can be increased.

When the protective film 130 is provided over the oxide insulating film 114 and then the oxygen 142 is added, the protective film 130 functions as a protective film for inhibiting release of oxygen from the oxide insulating film 114. In this way, a large amount of oxygen can be added to the oxide insulating film 114.

(5. Step of Filling Oxygen Vacancies in the Oxide Semiconductor Film)

Next, oxygen vacancies in the oxide semiconductor film 108 are filled with oxygen from the oxide insulating film 114.

For example, at the time of adding the oxygen 142 in (4. Step of adding oxygen to the oxide insulating film), oxygen from the oxide insulating film 114 and the oxygen 142 fill oxygen vacancies in the oxide semiconductor film 108. Furthermore, for example, heat treatment is performed after (4. Step of adding oxygen to the oxide insulating film) so that oxygen from the oxide insulating film 114 (oxygen constituting part of the oxide insulating film 114 or oxygen added in the step of adding oxygen) can fill oxygen vacancies in the oxide semiconductor film 108. The heat treatment may be performed at a temperature higher than or equal to 100° C. and lower than or equal to 600° C., preferably higher than or equal to 100° C. and lower than or equal to 350° C., further preferably higher than or equal to 150° C. and lower than or equal to 350° C.

As described above, when forming the oxide semiconductor film 108 of the semiconductor device 100 of one embodiment of the present invention, oxygen vacancies are formed and then filled with oxygen from the oxide insulating film 114. The oxygen vacancies can serve as a diffusion path of oxygen for diffusing oxygen from the oxide insulating film 114. Accordingly, oxygen can be efficiently diffused from the oxide insulating film 114 compared with the case in which oxygen is diffused in the state where the oxide semiconductor film 108 includes a small number of oxygen vacancies. As a result, the oxide semiconductor film 108 including a small number of oxygen vacancies can be formed.

<1-3. Oxygen-Transmitting Property of Oxide Semiconductor Film>

Here, the oxygen-transmitting property of the oxide semiconductor film 108 influenced by formation conditions of the oxide semiconductor film 108 is described with reference to FIG. 23.

Samples described below were formed in order to evaluate the oxygen-transmitting property of the oxide semiconductor film 108.

A silicon oxynitride film with a thickness of 400 nm functioning as the oxide insulating film 114 was formed over a substrate. The silicon oxynitride film was deposited under the conditions where the substrate temperature was 220° C., a silane gas at a flow rate of 50 sccm and a dinitrogen monoxide gas at a flow rate of 2000 sccm were introduced into a chamber, the pressure was 20 Pa, and an RF power of 100 W was supplied between parallel-plate electrodes provided in a PECVD apparatus.

Next, heat treatment was performed. The heat treatment was performed at 350° C. in a nitrogen gas atmosphere for 1 hour.

Then, an ITSO film with a thickness of 5 nm functioning as the protective film 130 was formed over the silicon oxynitride film. The ITSO film was formed with a sputtering apparatus. Note that the composition of a target used for forming the ITSO film was $In_2O_3:SnO_2:SiO_2=85:10:5$ [wt %].

Next, oxygen addition treatment was performed through the ITSO film. The oxygen addition treatment was performed with an ashing apparatus under the conditions where an oxygen gas at a flow rate of 250 sccm was introduced into a chamber, the pressure was 15 Pa, and an RF power of 4500 W was supplied between parallel-plate electrodes provided in the ashing apparatus so that a bias can be applied to the substrate side.

Then, the ITSO film was removed by etching with a wet etching apparatus with the use of a 5% oxalic acid solution for 300 sec.

Next, an IGZO film with a thickness of 10 nm functioning as the oxide semiconductor film 108 was formed over the silicon oxynitride film. The IGZO film was formed by a sputtering method using a polycrystalline target of a metal oxide with the following atomic ratio, In:Ga:Zn=4:2:4.1.

For the formation of the IGZO film, five different conditions of the oxygen partial pressure were set as follows: 10%, 20%, 30%, 40%, and 50%.

Then, TDS analysis was performed on the samples formed under the five conditions. FIG. 23 shows the results of the TDS analysis. In FIG. 23, the vertical axis shows the intensity of ions with a mass-to-charge ratio (m/z) of 32 emitted from each sample, that is, the intensity of oxygen, and the horizontal axis shows the temperature.

Figure 23:
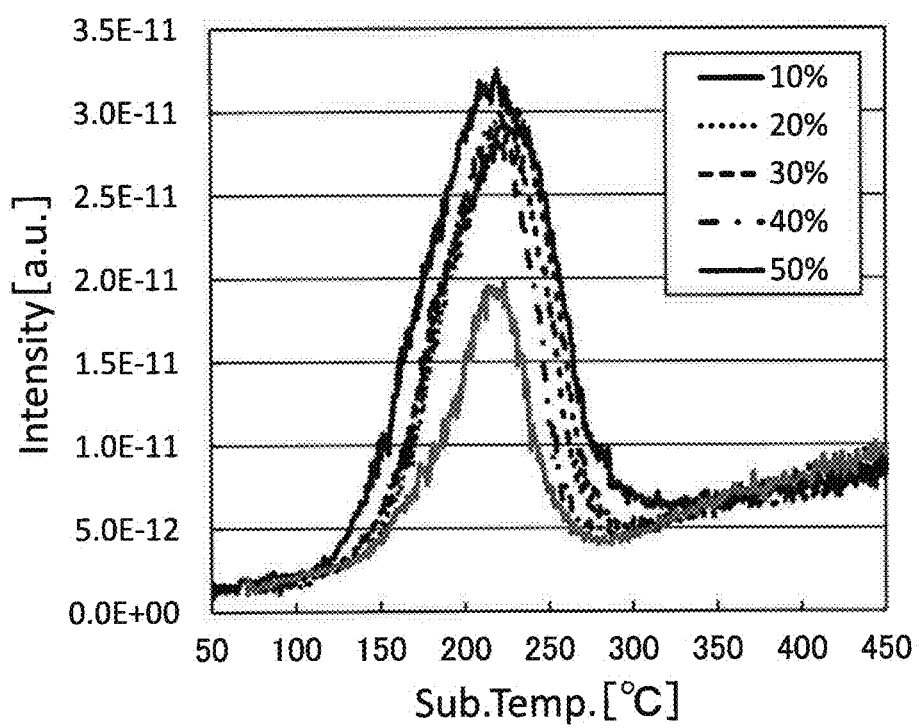
FIG. 23 shows results of TDS analysis.

As shown in FIG. 23, the amount of emitted oxygen in the case where the oxygen partial pressure for forming the IGZO film was 10%, 20%, 30%, and 40% was larger than that in the case where the oxygen partial pressure was 50% in the TDS analysis. In other words, by setting the oxygen partial pressure for forming the IGZO film to be higher than 0% and lower than 50%, the oxygen-transmitting property can become higher than that in the case where the oxygen partial pressure is higher than or equal to 50% and less than or equal to 100%. Furthermore, as shown in FIG. 23, the amount of emitted oxygen in the TDS analysis was higher in the order of the samples formed under the oxygen partial pressures of 10%, 20%, 30%, 40%, and 50%. Note that the amount of emitted oxygen shown in FIG. 23 includes both the amount of emitted oxygen from the oxide insulating film 114 and the amount of emitted oxygen from the oxide semiconductor film 108. In consideration of the oxygen content in the oxide insulating film 114 and the oxide semiconductor film 108, however, the emitted oxygen shown in FIG. 23 is mostly oxygen emitted from the oxide insulating film 114 and released through the oxide semiconductor film 108.

Thus, by varying the oxygen partial pressure for forming the oxide semiconductor film 108, the oxygen-transmitting property of the oxide semiconductor film 108 can be controlled. The above results suggest that a high oxygen-transmitting property can be obtained when the oxide semiconductor film 108 include many oxygen vacancies, many minute defects, or many lattice defects. In other words, the oxygen-transmitting property can be increased by forming many oxygen vacancies, minute defects, or lattice defects in the oxide semiconductor film 108 so that the oxygen vacancies or defects can serve as a diffusion path of oxygen.

<1-4. Concept of the Oxygen Supply to Oxide Semiconductor Film>

Next, the concept of the oxygen supply to the oxide semiconductor film 108 is described below based on the model diagrams illustrated in FIGS. 2A to 2C, FIGS. 3A to 3C, FIGS. 4A to 4C, FIGS. 5A to 5C, FIGS. 7A to 7C, FIGS. 8A to 8C and calculation results shown in FIG. 6 and FIG. 9.

Here, taking an IGZO film as an example of the oxide semiconductor film 108, the movement easiness of excess oxygen (oxygen more than that in the stoichiometric composition) and oxygen vacancies are described.

In this embodiment, models in which either one excess oxygen atom or one oxygen vacancy existed on one In—O plane of an IGZO film with an atomic ratio of In:Ga:Zn=3:1:2 were made by geometry optimization, and energy corresponding to an intermediate structure along a minimum energy path in each model was calculated by a nudged elastic band (NEB) method.

The calculation was performed using calculation program software "OpenMX" based on the density functional theory (DFT). As a basis function used as a parameter in the calculation, a pseudo-atomic localized basis function was used. Note that the basis function is categorized into polarized basis sets of slater type orbital (STO). As a functional, generalized-gradient-approximation/Perdew-Burke-Ernzerhof (GGA/PBE) was used. The cut-off energy was set to 200 Ry. The number of sampling k points was 5×5×3.

In the calculation of the movement easiness of excess oxygen, the number of atoms which existed in the calculation model was set to 85. In the calculation of the movement easiness of an oxygen vacancy, the number of atoms which existed in the calculation model was set to 83.

The movement easiness of excess oxygen and the movement easiness of an oxygen vacancy were evaluated by calculation of a height of energy barrier Eb which is required for excess oxygen or an oxygen vacancy to go over in moving to respective sites. That is, when the height of energy barrier Eb which excess oxygen or an oxygen vacancy goes over is high, the movement of the excess oxygen or the oxygen vacancy is difficult, and when the height of the energy barrier Eb is low, the movement of the excess oxygen or the oxygen vacancy is easy.

(Movement of Excess Oxygen)

First, the movement of excess oxygen is described. The models in which one excess oxygen atom exists in one In—O plane of the IGZO film with an atomic ratio of In:Ga:Zn=3:1:2 are shown in FIGS. 2A to 2C, FIGS. 3A to 3C, FIGS. 4A to 4C, and FIGS. 5A to 5C.

((1) First Transition of Excess Oxygen)

Figure 2A:
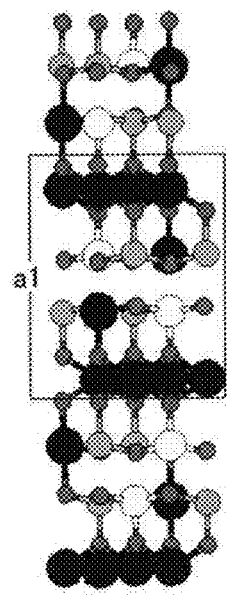
FIGS. 2A to 2C are model diagrams used for calculation of movement of excess oxygen.
Figure 2B:
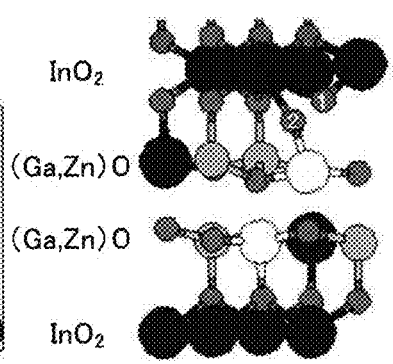
Figure 2C:
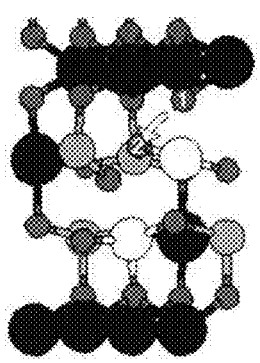

FIG. 2A is a model diagram of the IGZO film, FIG. 2B is an enlarged model diagram showing a region a1 in FIG. 2A, and FIG. 2C is a model diagram showing the transition of excess oxygen from the site shown in the model diagram of FIG. 2B. The transition from FIG. 2B to FIG. 2C is referred to as a first transition of excess oxygen. In the first transition of excess oxygen, excess oxygen diffuses from an $InO_2$ layer to a (Ga, Zn)O layer.

((2) Second Transition of Excess Oxygen)

FIG. 3A is a model diagram of the IGZO film, FIG. 3B is an enlarged model diagram showing a region a2 in FIG. 3A, and FIG. 3C is a model diagram showing the transition of excess oxygen from the site shown in the model diagram of FIG. 3B. The transition from FIG. 3B to FIG. 3C is referred to as a second transition of excess oxygen. In the second transition of excess oxygen, excess oxygen diffuses from a first (Ga, Zn)O layer to a second (Ga, Zn)O layer.

((3) Third Transition of Excess Oxygen)

FIG. 4A is a model diagram of the IGZO film, FIG. 4B is an enlarged model diagram showing a region a3 in FIG. 4A, and FIG. 4C is a model diagram showing the transition of excess oxygen from the site shown in the model diagram of FIG. 4B. The transition from FIG. 4B to FIG. 4C is referred to as a third transition of excess oxygen. In the third transition of excess oxygen, excess oxygen diffuses along an In layer.

((4) Fourth Transition of Excess Oxygen)

Figure 5A:
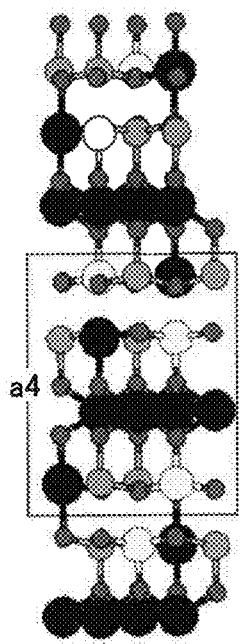
FIGS. 5A to 5C are model diagrams used for calculation of movement of excess oxygen.
Figure 5B:
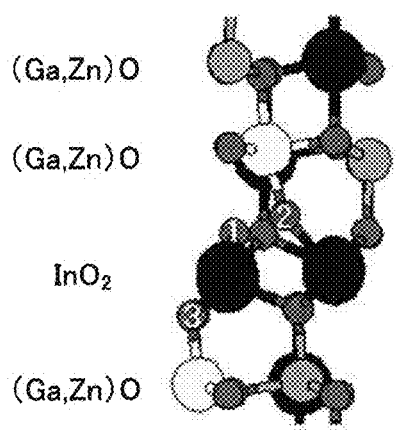
Figure 5C:
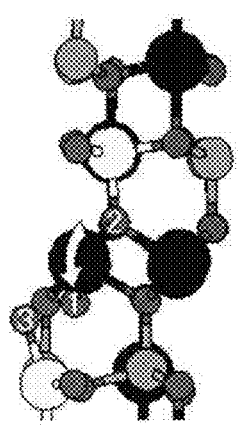

FIG. 5A is a model diagram of the IGZO film, FIG. 5B is an enlarged model diagram showing a region a4 in FIG. 5A, and FIG. 5C is a model diagram showing the transition of excess oxygen from the site shown in the model diagram of FIG. 5B. The transition from FIG. 5B to FIG. 5C is referred to as a fourth transition of excess oxygen. In the fourth transition of excess oxygen, excess oxygen diffuses by moving across an In layer.

In FIGS. 2B and 2C, FIGS. 4B and 4C, and FIGS. 5B and 5C, an oxygen atom numbered "1" is referred to as a first oxygen atom. In FIGS. 2B and 2C, FIGS. 4B and 4C, and FIGS. 5B and 5C, an oxygen atom numbered "2" is referred to as a second oxygen atom. In FIGS. 3B and 3C, FIGS. 4B and 4C, and FIGS. 5B and 5C, an oxygen atom numbered "3" is referred to as a third oxygen atom. In FIGS. 3B and 3C, an oxygen atom numbered "4" is referred to as a fourth oxygen atom.

Figure 6:
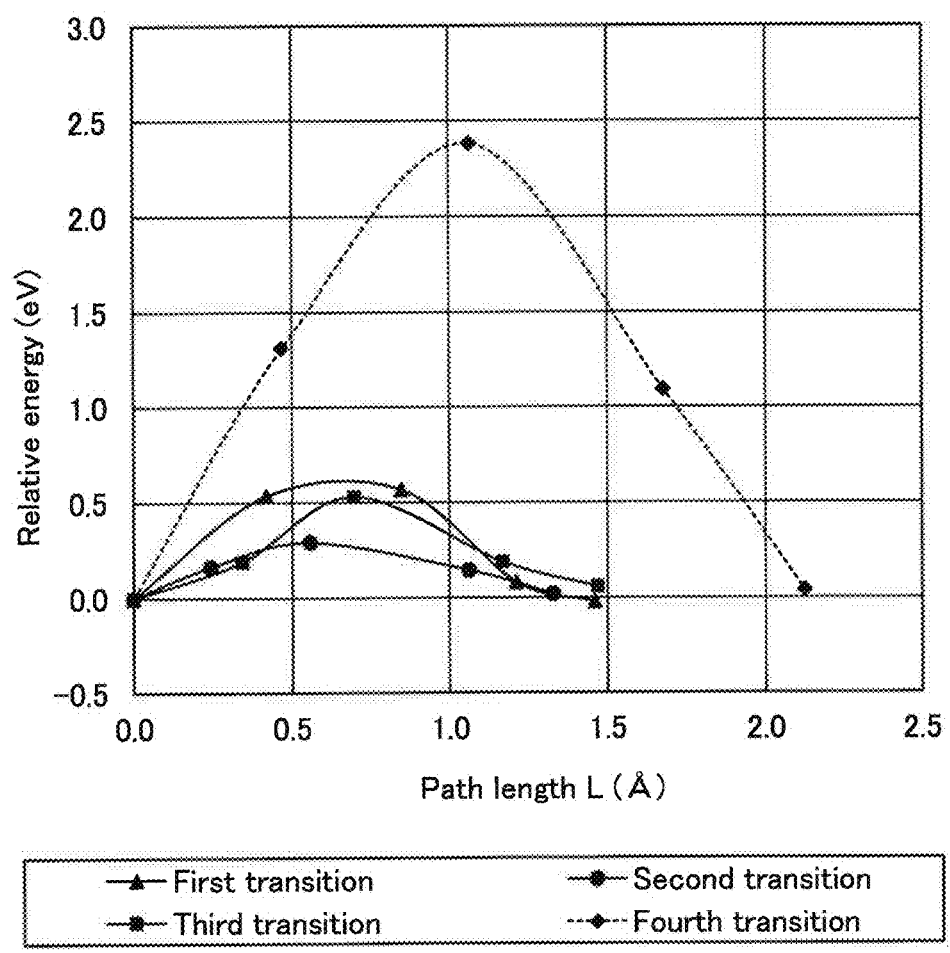
FIG. 6 shows calculation results for demonstrating the movement easiness of excess oxygen.

FIG. 6 shows calculation results showing the movement easiness of excess oxygen in the cases of the above-described four transition patterns. In FIG. 6, the horizontal axis represents the path length of the excess oxygen's movement, and the vertical axis represents energy required for the movement relative to the energy in the state shown in FIGS. 2B, 3B, 4B, and 5B.

As shown in FIG. 6, the maximum height of the energy barrier Eb ($Eb_{max}$) in the first transition of excess oxygen is 0.62 eV, and the maximum height of the energy barrier Eb ($Eb_{max}$) in the second transition of excess oxygen is 0.29 eV. The maximum height of the energy barrier Eb ($Eb_{max}$) in the third transition of excess oxygen is 0.53 eV, and the maximum height of the energy barrier Eb ($Eb_{max}$) in the fourth transition of excess oxygen is 2.38 eV. Thus, the maximum heights of the energy barrier Eb ($Eb_{max}$) in the first to third transitions of excess oxygen are lower than that in the fourth transition of excess oxygen. This means that the energies required for the first to third transitions of excess oxygen are lower than that required for the fourth transition of excess oxygen and the first to third transitions of excess oxygen are more likely to occur than the fourth transition of excess oxygen does.

In other words, the first oxygen atom in the model shown in FIG. 2B, FIG. 4B, and FIG. 5B is more likely to move in the direction of pushing out the second oxygen atom shown in FIGS. 2B and 2C and FIGS. 4B and 4C than in the direction of pushing out the third oxygen atom shown in FIGS. 5B and 5C.

The third oxygen atom in the model shown in FIG. 3B is likely to move in the direction of pushing out the fourth oxygen atom shown in FIG. 3C. This shows that an oxygen atom moves along the layer of indium atoms more easily than across the layer of indium atoms. Further, an oxygen atom moves from the $InO_2$ layer to the (Ga, Zn)O layer and from the first (Ga, Zn)O layer to the second (Ga, Zn)O layer more easily than across the layer of indium atoms.

(Movement of Oxygen Vacancy)

Next, the movement of an oxygen vacancy is described. The models in which one oxygen vacancy exists in one In—O plane of an IGZO film with an atomic ratio of In:Ga:Zn=3:1:2 are shown in FIGS. 7A to 7C and FIGS. 8A to 8C.

((5) First Transition of Oxygen Vacancy)

FIG. 7A is a model diagram of the IGZO film, FIG. 7B is an enlarged model diagram showing a region a5 in FIG. 7A, and FIG. 7C is a model diagram showing the transition of an oxygen vacancy from the site shown in the model diagram of FIG. 7B. The transition from FIG. 7B to FIG. 7C is referred to as a first transition of an oxygen vacancy. In the first transition of an oxygen vacancy, an oxygen vacancy diffuses along an In layer.

((6) Second Transition of Oxygen Vacancy)

Figure 8A:
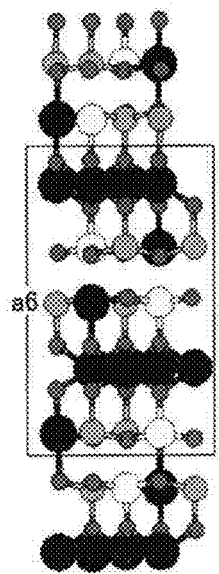
FIGS. 8A to 8C are model diagrams used for calculation of movement of an oxygen vacancy.
Figure 8B:
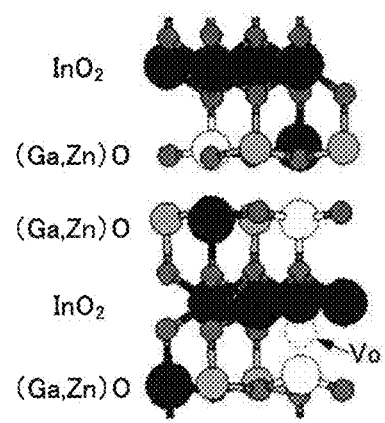
Figure 8C:
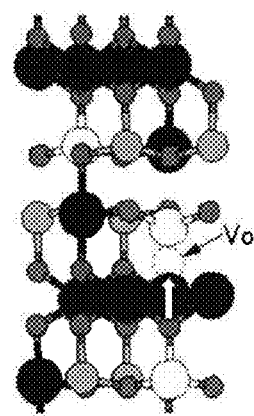

FIG. 8A is a model diagram of the IGZO film, FIG. 8B is an enlarged model diagram showing a region a6 in FIG. 8A, and FIG. 8C is a model diagram showing the transition of an oxygen vacancy from the site shown in the model diagram of FIG. 8B. The transition from FIG. 8B to FIG. 8C is referred to as a second transition of an oxygen vacancy. In the second transition of an oxygen vacancy, an oxygen vacancy diffuses by moving across an In layer.

In FIGS. 7B and 7C and FIGS. 8B and 8C, a dotted circle represents an oxygen vacancy.

Figure 9:
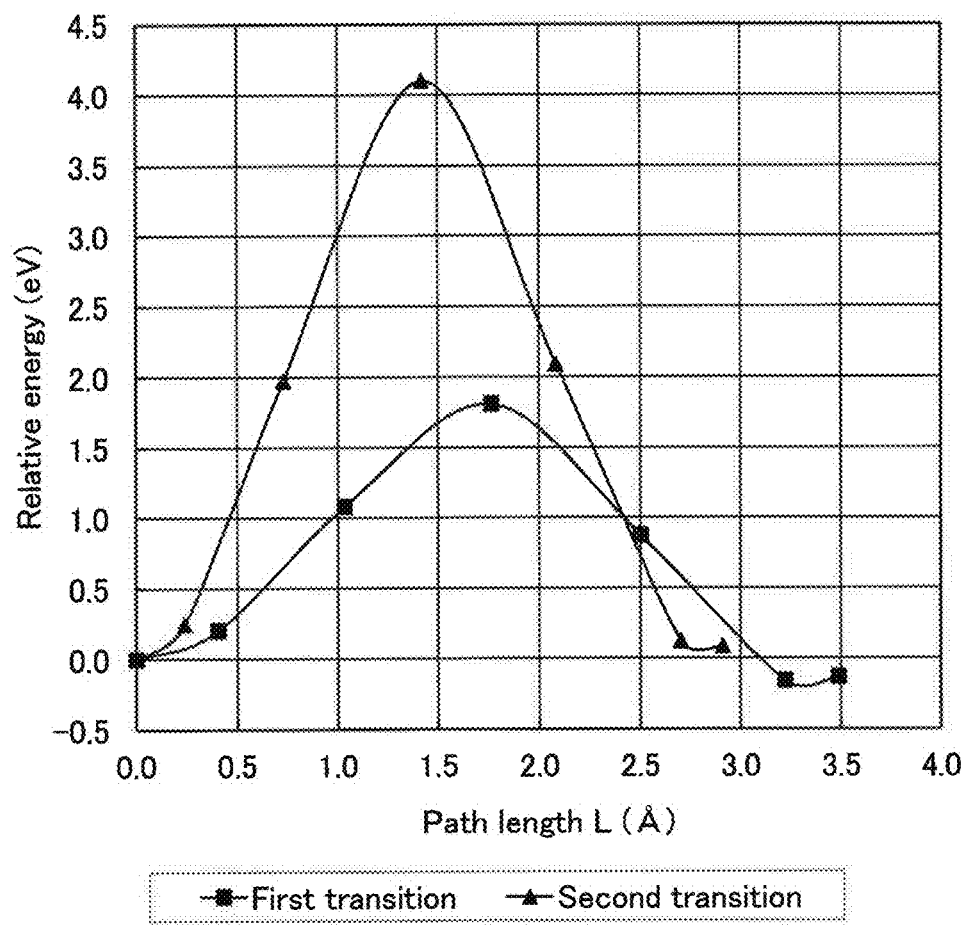
FIG. 9 shows calculation results for demonstrating the movement easiness of an oxygen vacancy.

FIG. 9 shows calculation results showing the movement easiness of an oxygen vacancy in the cases of the above-described two transition patterns. In FIG. 9, the horizontal axis represents the path length of the oxygen vacancy's movement, and the vertical axis represents energy required for the movement relative to the energy in the state shown in FIGS. 7B and 8B.

As shown in FIG. 9, the maximum height of the energy barrier Eb ($Eb_{max}$) in the first transition of an oxygen vacancy is 1.81 eV, and the maximum height of the energy barrier Eb ($Eb_{max}$) in the second transition of an oxygen vacancy is 4.10 eV. The maximum height of the energy barrier Eb ($Eb_{max}$) in the first transition of an oxygen vacancy is lower than that in the second transition of an oxygen vacancy. This means that the energy required for the first transition of an oxygen vacancy is lower than that required for the second transition of an oxygen vacancy. In other words, the first transition of an oxygen vacancy is more likely to occur than the second transition of an oxygen vacancy does.

This shows that like the movement of excess oxygen described above, an oxygen vacancy moves along the layer of indium atoms more easily than across the layer of indium atoms.

(Temperature Dependence of Transition)

Next, in order to compare probabilities of occurrence of the above-described six transition patterns from another perspective, temperature dependence of these transitions is described below.

Temperature dependence of these transitions is compared based on the movement frequency per unit time. Here, the movement frequency Z (times per second) at certain temperature is represented by Formula (1) using the number of vibrations Zo (times per second) of an oxygen atom in a position where the oxygen atom is chemically stable.

$$Z = Zo \cdot \exp\left(-\frac{Eb_{max}}{kT}\right) \quad (1)$$

Note that in Formula 1, $Eb_{max}$ represents the maximum height of the energy barrier Eb in each transition, k represents Boltzmann constant, T represents the absolute temperature, and Zo represents the number of vibrations of an atom in a stable position. In this embodiment, calculation is performed on the assumption that Zo is $1.0 \times 10^{13}$ (times per second), which is a typical Debye frequency.

Z has the following values when T is 300 K (27° C.).

(1) First transition of excess oxygen $Z=3.9 \times 10^2$ (times per second) at T=300 K.
(2) Second transition of excess oxygen $Z=1.2 \times 10^8$ (times per second) at T=300 K.
(3) Third transition of excess oxygen $Z=1.2 \times 10^4$ (times per second) at T=300 K.
(4) Fourth transition of excess oxygen $Z=1.0 \times 10^{-27}$ (times per second) at T=300 K.
(5) First transition of oxygen vacancy $Z=4.3 \times 10^{-18}$ (times per second) at T=300 K.
(6) Second transition of oxygen vacancy $Z=1.4 \times 10^{-56}$ (times per second) at T=300 K.

Furthermore, Z has the following values when T is 723 K (450° C.).
(1) First transition of excess oxygen $Z=4.8\times10^8$ (times per second) at T=723 K.
(2) Second transition of excess oxygen $Z=9.2\times10^{10}$ (times per second) at T=723 K.
(3) Third transition of excess oxygen $Z=2.0\times10^9$ (times per second) at T=723 K.
(4) Fourth transition of excess oxygen $Z=2.5\times10^{-4}$ (times per second) at T=723 K.
(5) First transition of oxygen vacancy $Z=2.5$ (times per second) at T=723 K.
(6) Second transition of oxygen vacancy $Z=2.5\times10^{-16}$ (times per second) at T=723 K.

In view of the above-described calculation results, excess oxygen, in the case of either T=300 K or T=723 K, moves along the layer of indium atoms more easily than across the layer of indium atoms. Moreover, an oxygen vacancy also, in the case where either T=300 K or T=723 K, moves along the layer of indium atoms more easily than across the layer of indium atoms.

At T=300 K, the movement of excess oxygen along the layer of indium atoms, the movement of excess oxygen from the $InO_2$ layer to the (Ga, Zn)O layer, and the movement of excess oxygen from the first (Ga, Zn)O layer to the second (Ga, Zn)O layer are likely to occur; in contrast, the other transitions are unlikely to occur. At T=723 K, the movement of an oxygen vacancy along the layer of indium atoms as well as the above-mentioned movements of excess oxygen is likely to occur; in contrast, the movements of both excess oxygen and an oxygen vacancy across the layer of indium atoms are difficult.

Note that although the movement of excess oxygen or an oxygen vacancy across the layer of indium atoms is described above, the same can apply to the movement of excess oxygen or an oxygen vacancy across metals other than indium which are contained in an oxide semiconductor film.

As described above, it is difficult for both excess oxygen and an oxygen vacancy to move across the layer of indium atoms, in other words, to move in the c-axis direction. However, in a semiconductor device of one embodiment of the present invention, forming oxygen vacancies in a step of forming an oxide semiconductor film and using the oxygen vacancies as a diffusion path of excess oxygen enable a favorable supply of excess oxygen to the oxide semiconductor.

<1-5. Manufacturing Method of Semiconductor Device>

Figure 10A:
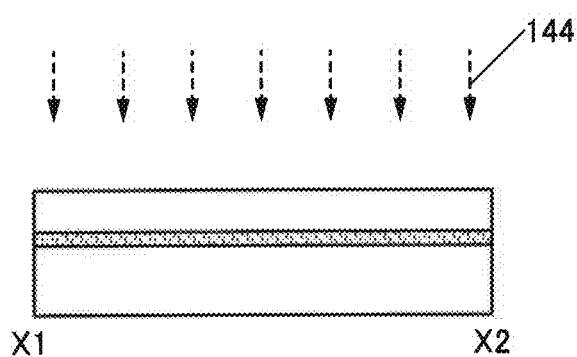
FIGS. 10A and 10B are cross-sectional views illustrating an example of a manufacturing process of a semiconductor device.
Figure 10B:
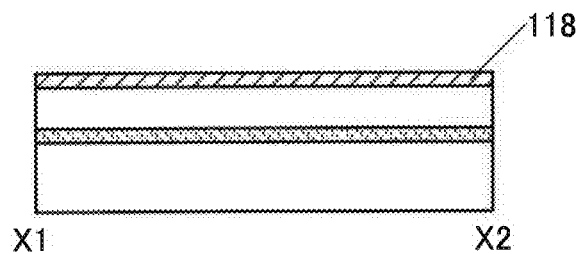

Next, a manufacturing method that is different from the manufacturing method described in <1-2. Manufacturing method of semiconductor device> will be described below with reference to FIGS. 10A and 10B. Note that FIGS. 10A and 10B are cross-sectional views illustrating a manufacturing method of a semiconductor device.

(6. Step of Removing the Protective Film)

First, steps illustrated in FIGS. 1B to 1E are performed. Then, the protective film 130 is removed using an etchant 144, so that a surface of the oxide insulating film 114 is exposed (see FIG. 10A).

As the etchant 144, a chemical solution or an etching gas that can remove the protective film 130 is used. In this embodiment, a chemical solution, a 0.5% hydrofluoric acid, is used to remove the protective film 130. Alternatively, a 5% oxalic acid solution may be used. Further alternatively, the protective film 130 may be etched by performing etching with a 5% oxalic acid solution and then a 0.5% hydrofluoric acid.

(7. Step of Forming a Nitride Insulating Film)

Next, a nitride insulating film 118 is formed over the oxide insulating film 114 (see FIG. 10B).

The nitride insulating film 118 includes nitrogen. Alternatively, the nitride insulating film 118 includes nitrogen and silicon. The nitride insulating film 118 has a function of blocking oxygen, hydrogen, water, an alkali metal, an alkaline earth metal, or the like. With the nitride insulating film 118, it is possible to prevent outward diffusion of oxygen from the oxide semiconductor film 108, outward diffusion of oxygen included in the oxide insulating film 114, and entry of hydrogen, water, or the like into the oxide semiconductor film 108 and the oxide insulating film 114 from the outside. The nitride insulating film 118 may be silicon nitride, silicon nitride oxide, aluminum nitride, aluminum nitride oxide, or the like.

In the case of being formed by a PECVD method, the nitride insulating film 118 is preferably formed at a temperature at which oxygen is released from the oxide insulating film 114, typically under conditions where the substrate temperature is higher than or equal to 150° C. and lower than or equal to 400° C.

For example, in the case where a silicon nitride film is formed by a PECVD method as the nitride insulating film 118, a deposition gas containing silicon, nitrogen, and ammonia are preferably used as a source gas. When a small amount of ammonia compared to the amount of nitrogen is used as the source gas, ammonia is dissociated in the plasma and activated species are generated. The activated species cleave a bond between silicon and hydrogen which are contained in the deposition gas containing silicon and a triple bond between nitrogen molecules. As a result, a dense silicon nitride film having few defects, in which bonds between silicon and nitrogen are promoted and bonds between silicon and hydrogen are few, can be formed. On the other hand, when the amount of ammonia with respect to the amount of nitrogen is large, decomposition of the deposition gas containing silicon and decomposition of nitrogen are not promoted, so that a sparse silicon nitride film in which bonds between silicon and hydrogen remain and defects are increased is formed. Therefore, in the source gas, a flow rate ratio of the nitrogen to the ammonia is set to be greater than or equal to 5 and less than or equal to 50, preferably greater than or equal to 10 and less than or equal to 50.

In this embodiment, as the nitride insulating film 118, a 50-nm-thick silicon nitride film is formed with a PECVD apparatus using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and a high-frequency power of 1000 W is supplied to parallel-plate electrodes with a 27.12 MHz high-frequency power source. Note that the PECVD apparatus is a parallel-plate PECVD apparatus in which the electrode area is 6000 $cm^2$, and the supplied power corresponds to a power per unit area (power density) of $1.7\times10^{-1}$ $W/cm^2$.

The insulating film 118 may be deposited by heating, so that excess oxygen contained in the oxide insulating film 114 can be diffused into the oxide semiconductor film 108 to fill oxygen vacancies in the oxide semiconductor film 108.

In this embodiment, one embodiment of the present invention has been described. However, one embodiment of the present invention is not limited to the above-described examples. Although the example in which an oxide semiconductor is used is described above for example as one embodiment of the present invention, one embodiment of the present invention is not limited thereto. Depending on circumstances or conditions, one embodiment of the present invention is not necessarily applied to the case in which a different kind of semiconductor is used. Depending on circumstances or conditions, one embodiment of the present invention is not necessarily applied to the case in which an oxide semiconductor is used. For example, although an example in which oxygen vacancies are filled to decrease the number of oxygen vacancies has been described as one embodiment of the present invention, one embodiment of the present invention is not limited to this example. Depending on circumstances or conditions, oxygen vacancies are not necessarily decreased in one embodiment of the present invention. For example, an example in which excess oxygen is diffused from a film provided over the oxide semiconductor film into the oxide semiconductor film has been described as one embodiment of the present invention, one embodiment of the present invention is not limited to this example.

The structure and methods described in this embodiment can be combined as appropriate with any of the other structures and methods described in the other embodiments.

Embodiment 2

In this embodiment, semiconductor devices having structures different from the semiconductor device described in Embodiment 1, and a manufacturing method thereof will be described with reference to FIGS. 11A to 11C, FIGS. 12A to 12C, FIGS. 13A to 13C, FIGS. 14A to 14C, FIGS. 15A to 15D, FIGS. 16A and 16B, FIGS. 17A to 17D, FIGS. 18A to 18D, FIGS. 19A to 19D, FIGS. 20A and 20B, FIGS. 21A to 21D, and FIGS. 22A to 22D.

<2-1. Structural Example of Semiconductor Device>

Figure 11A:
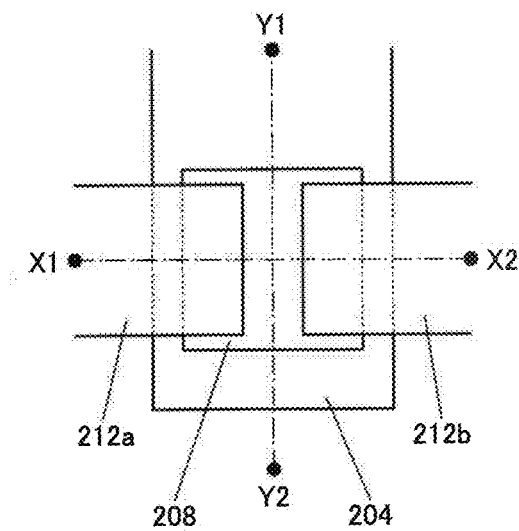
FIGS. 11A to 11C are a plan view and cross-sectional views illustrating an example of a semiconductor device.
Figure 11B:
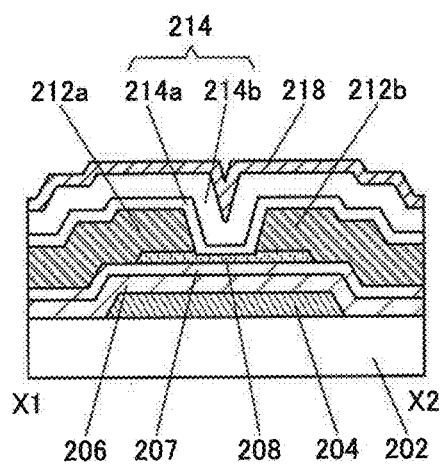
Figure 11C:
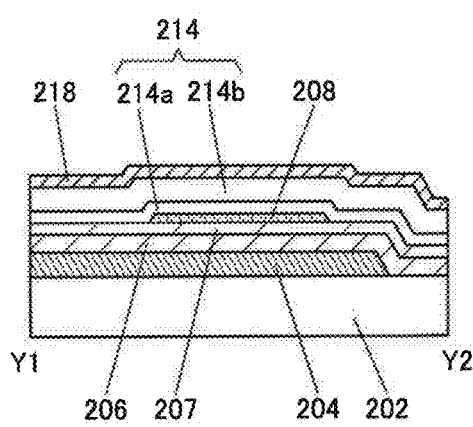

FIG. 11A is a plan view of a transistor 200 that is a semiconductor device of one embodiment of the present invention. FIG. 11B is a cross-sectional view taken along a dashed dotted line X1-X2 in FIG. 11A, and FIG. 11C is a cross-sectional view taken along a dashed dotted line Y1-Y2 in FIG. 11A. Note that in FIG. 11A, some components of the transistor 200 (e.g., an insulating film serving as a gate insulating film) are not illustrated to avoid complexity. Furthermore, the direction of the dashed dotted line X1-X1 may be referred to as a channel length direction, and the direction of the dashed dotted line Y1-Y2 may be referred to as a channel width direction. As in FIG. 11A, some components are not illustrated in some cases in plan views of transistors described below.

The transistor 200 includes a conductive film 204 functioning as a gate electrode over a substrate 202, an insulating film 206 over the substrate 202 and the conductive film 204, an insulating film 207 over the insulating film 206, an oxide semiconductor film 208 over the insulating film 207, a conductive film 212a functioning as a source electrode electrically connected to the oxide semiconductor film 208, and a conductive film 212b functioning as a drain electrode electrically connected to the oxide semiconductor film 208. Over the transistor 200, specifically, over the conductive films 212a and 212b and the oxide semiconductor film 208, an oxide insulating film 214 and a nitride insulating film 218 are provided. The oxide insulating film 214 and the nitride insulating film 218 function as protective insulating films for the transistor 200.

Furthermore, the insulating films 206 and 207 function as gate insulating films of the transistor 200. The oxide insulating film 214 includes an oxide insulating film 214a and an oxide insulating film 214b.

When oxygen vacancies are formed in the oxide semiconductor film 208 included in the transistor 200, electrons serving as carriers are generated; as a result, the transistor 200 tends to be normally-on. Therefore, for stable transistor characteristics, it is important to reduce oxygen vacancies in the oxide semiconductor film 208. In the step of forming the oxide semiconductor film 208 in the structure of the transistor of one embodiment of the present invention, oxygen vacancies are formed in the oxide semiconductor film 208. Then, oxygen is supplied from the oxide insulating film 214 positioned over the oxide semiconductor film 208, so that the oxygen vacancies are filled. Note that in the step of forming the oxide semiconductor film 208, minute defects or lattice defects may be formed at the same time as the oxygen vacancies in the oxide semiconductor film 208. Oxygen can be favorably supplied from the oxide insulating film 214 to the oxide semiconductor film 208 by using the oxygen vacancies, the minute defects, or the lattice defects as a diffusion path of excess oxygen.

The substrate 202 may have a structure similar to that of the substrate 102 described in Embodiment 1. The nitride insulating film 218 may have a structure similar to that of the nitride insulating film 118 described in Embodiment 1. Other components of the transistor 200 will be described below.

(Conductive Film)

The conductive film 204 functioning as a gate electrode and the conductive films 212a and 212b functioning as a source electrode and a drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these metal elements; or the like.

The conductive films 204, 212a, and 212b may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film in which aluminum and one or more elements selected from titanium, tantalum, tungsten, molybdenum, chromium, neodymium, and scandium are combined may be used.

The conductive films 204, 212a, and 212b can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

A Cu—X alloy film (X is Mn, Ni, Cr, Fe, Co, Mo, Ta, or Ti) may be used for the conductive films 204, 212a, and 212b. Use of a Cu—X alloy film enables the manufacturing cost to be reduced because wet etching process can be used in the processing.

(Gate Insulating Film)

As each of the insulating films 206 and 207 functioning as gate insulating films of the transistor 200, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of the stacked-layer structure of the insulating films 206 and 207, an insulating film of a single layer formed using a material selected from the above or an insulating film of three or more layers may be used.

Note that the insulating film 207 that is in contact with the oxide semiconductor film 208 functioning as a channel region of the transistor 200 is preferably an oxide insulating film and preferably includes a region including oxygen in excess of the stoichiometric composition (oxygen-excess region). In other words, the insulating film 207 is an insulating film capable of releasing oxygen. In order to provide the oxygen-excess region in the insulating film 207, the insulating film 207 is formed in an oxygen atmosphere, for example. Alternatively, the oxygen-excess region may be formed by introduction of oxygen into the insulating film 207 after the deposition. As a method for introducing oxygen, an ion implantation method, an ion doping method, a plasma immersion ion implantation method, plasma treatment, or the like may be employed.

In the case where hafnium oxide is used as the insulating film 207, the following effect is attained. Hafnium oxide has a higher dielectric constant than silicon oxide and silicon oxynitride. Therefore, by using hafnium oxide, the thickness of the insulating film 207 can be made large as compared with the case where silicon oxide is used; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited thereto.

In this embodiment, a silicon nitride film is formed as the insulating film 206, and a silicon oxide film is formed as the insulating film 207. The silicon nitride film has a higher dielectric constant than a silicon oxide film and needs a larger thickness for capacitance equivalent to that of the silicon oxide film. Thus, when the silicon nitride film is included as the gate insulating film of the transistor 200, the thickness of the insulating film can be physically increased. This makes it possible to reduce a decrease in withstand voltage of the transistor 200 and furthermore to increase the withstand voltage, thereby reducing electrostatic discharge damage to the transistor 200.

(Oxide Semiconductor Film)

The oxide semiconductor film 208 may have a structure similar to that of the oxide semiconductor film 108 described in Embodiment 1. In addition, the oxide semiconductor film 208 preferably has the following structure.

The energy gap of the oxide semiconductor film 208 is 2 eV or more, preferably 2.5 eV or more, further preferably 3 eV or more. The use of an oxide semiconductor having a wide energy gap can reduce off-state current of the transistor 200.

For the oxide semiconductor film 208, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 208 be set to be appropriate.

Note that it is preferable to use, as the oxide semiconductor film 208, an oxide semiconductor film in which the impurity concentration is low and the density of defect states is low, in which case the transistor can have more excellent electrical characteristics. Here, the state in which the impurity concentration is low and the density of defect states is low (the number of oxygen vacancies is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Further, the highly purified intrinsic or substantially highly purified intrinsic oxide semiconductor film has an extremely low off-state current; even when an element has a channel width W of $1\times10^6$ μm and a channel length L of 10 μm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small change in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, alkaline earth metal, and the like are given.

Hydrogen included in the oxide semiconductor film 208 reacts with oxygen bonded to a metal atom to be water, and also causes oxygen vacancies in a lattice from which oxygen is released (or a portion from which oxygen is released). Due to entry of hydrogen into the oxygen vacancies, electrons serving as carriers are generated in some cases. Furthermore, in some cases, bonding of part of hydrogen to oxygen bonded to a metal atom causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 208. Specifically, the hydrogen concentration of the oxide semiconductor film 208, which is measured by secondary ion mass spectrometry (SIMS), is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$, yet further preferably lower than or equal to $1\times10^{18}$ atoms/cm$^3$, even further preferably lower than or equal to $5\times10^{17}$ atoms/cm$^3$, or further preferably lower than or equal to $1\times10^{16}$ atoms/cm$^3$.

In addition, the concentration of alkali metal or alkaline earth metal of the oxide semiconductor film 208, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 208.

Furthermore, when including nitrogen, the oxide semiconductor film 208 easily becomes n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to be, for example, lower than or equal to $5\times10^{18}$ atoms/cm$^3$.

(Oxide Insulating Film)

The oxide insulating film 214 may have a structure similar to that of the oxide insulating film 114 described in Embodiment 1. In addition, the oxide insulating film 214 preferably has the following structure.

The oxide insulating film 214 functions as a protective insulating film for the oxide semiconductor film 208.

The oxide insulating film 214a is preferably formed of a material that releases little nitrogen oxide. Nitrogen oxide (NO$_x$; x is greater than or equal to 0 and less than or equal to 2, preferably greater than or equal to 1 and less than or equal to 2), typically NO$_2$ or NO, forms levels in the oxide insulating film 214a, for example. The level is positioned in the energy gap of the oxide semiconductor film 208. Therefore, when nitrogen oxide is diffused to the vicinity of the interface between the oxide insulating film 214a and the oxide semiconductor film 208, an electron is in some cases trapped by the level on the oxide insulating film 214a side. As a result, the trapped electron remains in the vicinity of the interface between the oxide insulating film 214a and the oxide semiconductor film 208; thus, the threshold voltage of the transistor 200 is shifted in the positive direction.

Nitrogen oxide reacts with ammonia and oxygen in heat treatment. Since nitrogen oxide included in the oxide insulating film 214a reacts with ammonia included in the oxide insulating film 214b in heat treatment, nitrogen oxide included in the oxide insulating film 214a is reduced. Therefore, an electron is hardly trapped at the vicinity of the interface between the oxide insulating film 214a and the oxide semiconductor film 208.

By using such an oxide insulating film, the oxide insulating film 214a can reduce the shift in the threshold voltage of the transistor 200, which leads to a smaller change in the electrical characteristics of the transistor 200.

Note that in an ESR spectrum at 100 K or lower of the oxide insulating film 214a, by heat treatment of a manufacturing process of the transistor 200, typically heat treatment at a temperature higher than or equal to 300° C. and lower than the strain point of the substrate, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1\times10^{18}$ spins/cm$^3$, typically higher than or equal to $1\times10^{17}$ spins/cm$^3$ and lower than $1\times10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than or equal to 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film 214a is.

The concentration of nitrogen of the oxide insulating film 214a measured by SIMS is lower than or equal to $6\times10^{20}$ atoms/cm$^3$.

The oxide insulating film 214a formed by a PECVD method at a substrate temperature higher than or equal to 220° C., higher than or equal to 280° C., or higher than or equal to 350° C. using silane and dinitrogen monoxide can be a dense and hard film.

(Nitride Insulating Film)

The nitride insulating film 218 may have a structure similar to that of the nitride insulating film 118 described in Embodiment 1.

<2-2. Structural Example of Semiconductor Device>

A structure example different from that of the transistor 200 in FIGS. 11A to 11C is described with reference to FIGS. 12A to 12C. Note that in the case where a portion has a function similar to that described above, the same hatch pattern is applied to the portion, and the portion is not especially denoted by a reference numeral in some cases.

Figure 12A:
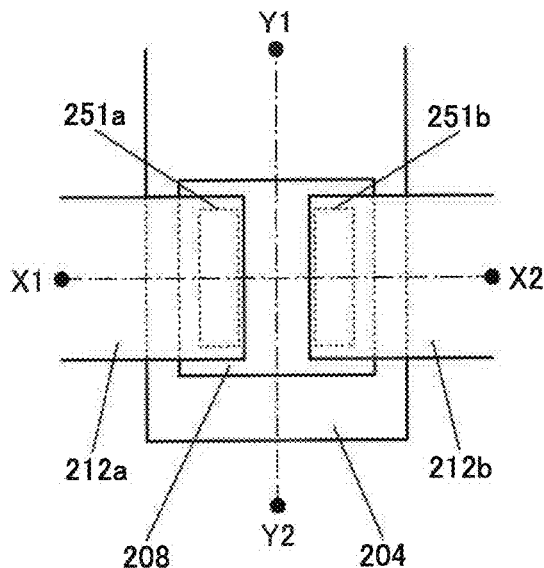
FIGS. 12A to 12C are a plan view and cross-sectional views illustrating an example of a semiconductor device.

FIG. 12A is a plan view of a transistor 250 that is a semiconductor device of one embodiment of the present invention. FIG. 12B is a cross-sectional view taken along dashed-dotted line X1-X2 illustrated in FIG. 12A, and FIG. 12C is a cross-sectional view taken along dashed-dotted line Y1-Y2 illustrated in FIG. 12A.

The transistor 250 includes the conductive film 204 functioning as a gate electrode over the substrate 202, the insulating film 206 over the substrate 202 and the conductive film 204, the insulating film 207 over the insulating film 206, the oxide semiconductor film 208 over the insulating film 207, the oxide insulating film 214 over the oxide semiconductor film 208, the conductive film 212a functioning as a source electrode electrically connected to the oxide semiconductor film 208 through an opening 251a provided in the oxide insulating film 214, and the conductive film 212b functioning as a drain electrode electrically connected to the oxide semiconductor film 208 through an openings 251b provided in the oxide insulating film 214. Over the transistor 250, specifically over the conductive films 212a and 212b and the oxide insulating film 214, the nitride insulating film 218 is provided. The oxide insulating film 214 functions as a protective insulating film for the oxide semiconductor film 208. The nitride insulating film 218 functions as a protective insulating film for the transistor 250. Note that the oxide insulating film 214 includes the oxide insulating film 214a and the oxide insulating film 214b.

Figure 12B:
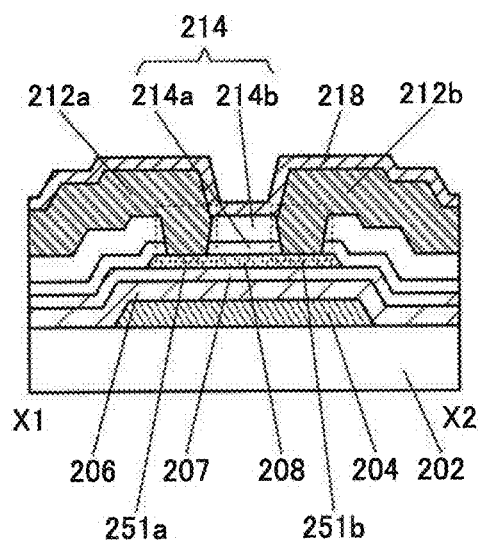
Figure 12C:
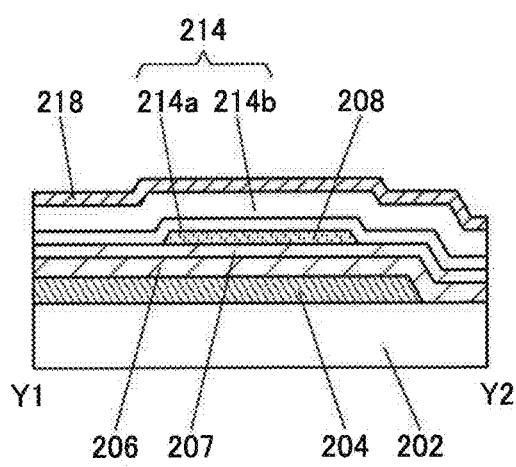

Although the transistor 200 has a channel-etched structure, the transistor 250 in FIGS. 12A to 12C has a channel-protective structure. Thus, either the channel-etched structure or the channel-protective structure can be applied to the semiconductor device of one embodiment of the present invention. The other structures are the same as those of the transistor 200 and a similar effect can be obtained.

<2-3. Structural Example of Semiconductor Device>

A structure example different from that of the transistor 250 in FIGS. 12A to 12C is described with reference to FIGS. 13A to 13C. Note that in the case where a portion has a function similar to that described above, the same hatch pattern is applied to the portion, and the portion is not especially denoted by a reference numeral in some cases.

Figure 13A:
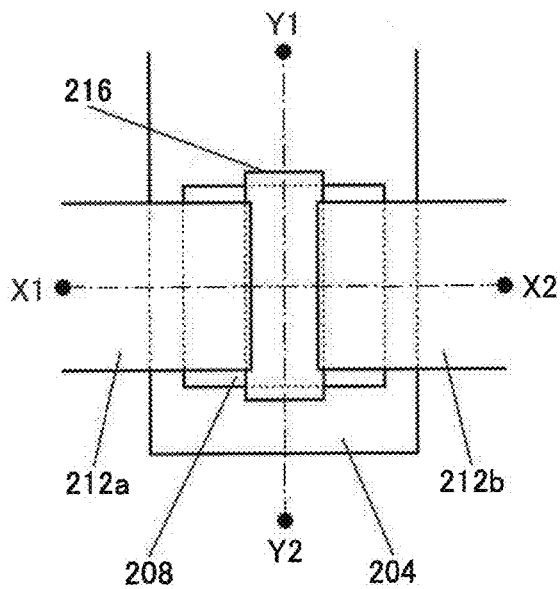
FIGS. 13A to 13C are a plan view and cross-sectional views illustrating an example of a semiconductor device.

FIG. 13A is a plan view of a transistor 260 that is a semiconductor device of one embodiment of the present invention. FIG. 13B is a cross-sectional view taken along dashed-dotted line X1-X2 illustrated in FIG. 13A, and FIG. 13C is a cross-sectional view taken along dashed-dotted line Y1-Y2 illustrated in FIG. 13A.

The transistor 260 includes the conductive film 204 functioning as a gate electrode over the substrate 202, the insulating film 206 over the substrate 202 and the conductive film 204, the insulating film 207 over the insulating film 206, the oxide semiconductor film 208 over the insulating film 207, the oxide insulating film 214 over the oxide semiconductor film 208, the conductive film 212a functioning as a source electrode electrically connected to the oxide semiconductor film 208, and the conductive film 212b functioning as a drain electrode electrically connected to the oxide semiconductor film 208. Over the transistor 260, specifically over the conductive films 212a and 212b and the oxide insulating film 214, the nitride insulating film 218 is provided. The oxide insulating film 214 functions as a protective insulating film for the oxide semiconductor film 208. The nitride insulating film 218 functions as a protective insulating film for the transistor 260. Note that the oxide insulating film 214 includes the oxide insulating film 214a and the oxide insulating film 214b.

The transistor 260 is different from the transistor 250 illustrated in FIGS. 12A to 12C in the shape of the oxide insulating film 214. Specifically, the oxide insulating film 214 of the transistor 260 has an island shape over a channel region of the oxide semiconductor film 208. The other components are the same as those of the transistor 250, and a similar effect is obtained.

<2-4. Structural Example of Semiconductor Device>

A structure example different from that of the transistor 200 in FIGS. 11A to 11C is described with reference to FIGS. 14A to 14C. Note that in the case where a portion has a function similar to that described above, the same hatch pattern is applied to the portion, and the portion is not especially denoted by a reference numeral in some cases.

Figure 14A:
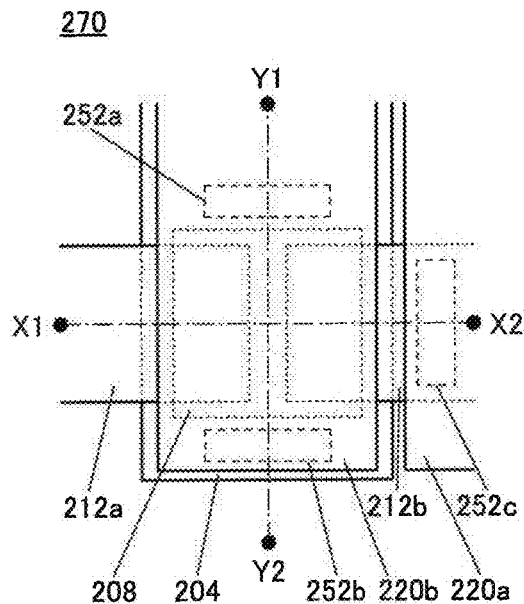
FIGS. 14A to 14C are a plan view and cross-sectional views illustrating an example of a semiconductor device.

FIG. 14A is a plan view of a transistor 270 that is a semiconductor device of one embodiment of the present invention. FIG. 14B is a cross-sectional view taken along dashed-dotted line X1-X2 illustrated in FIG. 14A, and FIG. 14C is a cross-sectional view taken along dashed-dotted line Y1-Y2 illustrated in FIG. 14A.

The transistor 270 includes the conductive film 204 functioning as a first gate electrode over the substrate 202, the insulating film 206 over the substrate 202 and the conductive film 204, the insulating film 207 over the insulating film 206, the oxide semiconductor film 208 over the insulating film 207, the oxide insulating film 214 over the oxide semiconductor film 208, the conductive film 212a functioning as a source electrode electrically connected to the oxide semiconductor film 208, the conductive film 212b functioning as a drain electrode electrically connected to the oxide semiconductor film 208, the nitride insulating film 218 over the conductive films 212a and 212b and the oxide insulating film 214, and conductive films 220a and 220b over the nitride insulating film 218. Note that the oxide insulating film 214 includes the oxide insulating film 214a and the oxide insulating film 214b.

In the transistor 270, the oxide insulating film 214 and the nitride insulating film 218 functions as a second gate insulating film of the transistor 270. Furthermore, the conductive film 220a in the transistor 270 functions as, for example, a pixel electrode used for a display device. The conductive film 220a is connected to the conductive film 212b through an opening 252c provided in the oxide insulating film 214 and the nitride insulating film 218. The conductive film 220b in the transistor 270 functions as a second gate electrode (also referred to as a back gate electrode).

Figure 14B:
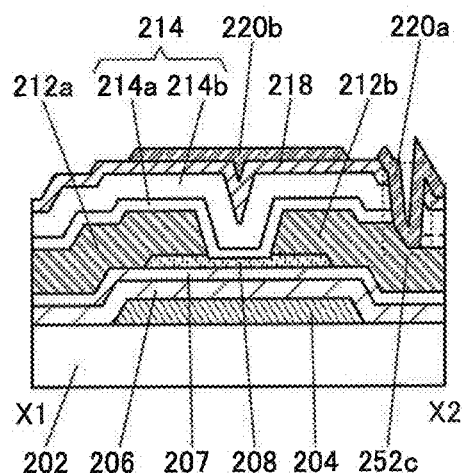
Figure 14C:
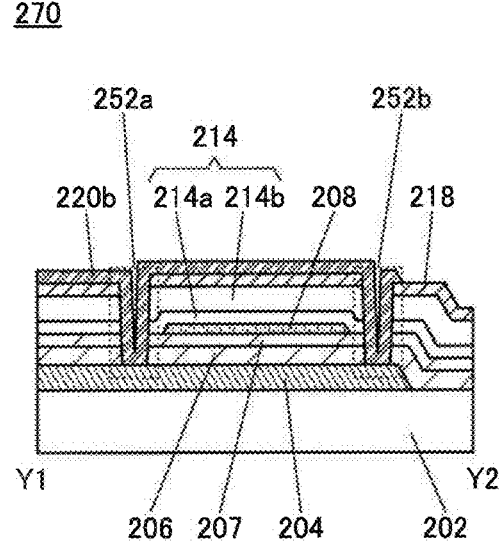

As illustrated in FIG. 14C, the conductive film 220b is connected to the conductive film 204 functioning as a first gate electrode through openings 252a and 252b provided in the insulating films 206 and 207, the oxide insulating film 214, and the nitride insulating film 218. Accordingly, the conductive film 220b and the conductive film 204 are supplied with the same potential.

Note that although the structure in which the openings 252a and 252b are provided so that the conductive film 220b and the conductive film 204 are connected to each other is described in this embodiment, one embodiment of the present invention is not limited thereto. For example, a structure in which only one of the openings 252a and 252b is provided so that the conductive film 220b and the conductive film 204 are connected to each other, or a structure in which the openings 252a and 252b are not provided and the conductive film 220b and the conductive film 204 are not connected to each other may be employed. Note that in the case where the conductive film 220b and the conductive film 204 are not connected to each other, it is possible to apply different potentials to the conductive film 220b and the conductive film 204.

As illustrated in FIG. 14B, the oxide semiconductor film 208 is positioned to face each of the conductive film 204 functioning as a first gate electrode and the conductive film 220b functioning as a second gate electrode, and is sandwiched between the two conductive films functioning as gate electrodes. The lengths in the channel length direction and the channel width direction of the conductive film 220b functioning as a second gate electrode are longer than those in the channel length direction and the channel width direction of the oxide semiconductor film 208. The whole oxide semiconductor film 208 is covered with the conductive film 220b with the oxide insulating film 214 and the nitride insulating film 218 positioned therebetween. Since the conductive film 220b functioning as a second gate electrode is connected to the conductive film 204 functioning as a first gate electrode through the openings 252a and 252b provided in the insulating films 206 and 207, the oxide insulating film 214, and the nitride insulating film 218, a side surface of the oxide semiconductor film 208 in the channel width direction faces the conductive film 220b functioning as a second gate electrode with the oxide insulating film 214 and the nitride insulating film 218 positioned therebetween.

In other words, in the channel width direction of the transistor 270, the conductive film 204 functioning as a first gate electrode and the conductive film 220b functioning as a second gate electrode are connected to each other through the openings provided in the insulating films 206 and 207 functioning as gate insulating films and the oxide insulating film 214 and the nitride insulating film 218 functioning as second gate insulating films; and the conductive film 204 and the conductive film 220b surround the oxide semiconductor film 208 with the insulating films 206 and 207 functioning as gate insulating films and the oxide insulating film 214 and the nitride insulating film 218 functioning as second gate insulating films positioned therebetween.

Such a structure enables the oxide semiconductor film 208 included in the transistor 270 to be electrically surrounded by electric fields of the conductive film 204 functioning as a first gate electrode and the conductive film 220b functioning as a second gate electrode. A device structure of a transistor, like that of the transistor 270, in which electric fields of a first gate electrode and a second gate electrode electrically surround an oxide semiconductor film where a channel region is formed can be referred to as a surrounded channel (s-channel) structure.

Since the transistor 270 has the s-channel structure, an electric field for inducing a channel can be effectively applied to the oxide semiconductor film 208 by the conductive film 204 functioning as a first gate electrode; therefore, the current drive capability of the transistor 270 can be improved and high on-state current characteristics can be obtained. Since the on-state current can be increased, it is possible to reduce the size of the transistor 270. In addition, since the transistor 270 is surrounded by the conductive film 204 functioning as a first gate electrode and the conductive film 220b functioning as a second gate electrode, the mechanical strength of the transistor 270 can be increased.

<2-5. Structural Example of Semiconductor Device>

Structure examples different from that of the transistor 200 in FIGS. 11A to 11C are described with reference to FIGS. 15A to 15D. Note that in the case where a portion has a function similar to that described above, the same hatch pattern is applied to the portion, and the portion is not especially denoted by a reference numeral in some cases.

Figure 15A:
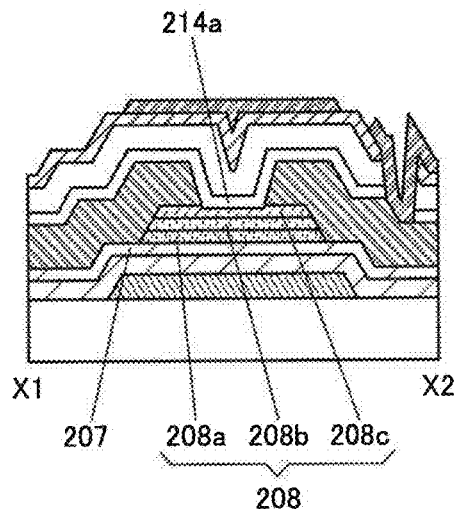
FIGS. 15A to 15D are cross-sectional views illustrating examples of a semiconductor device.
Figure 15B:
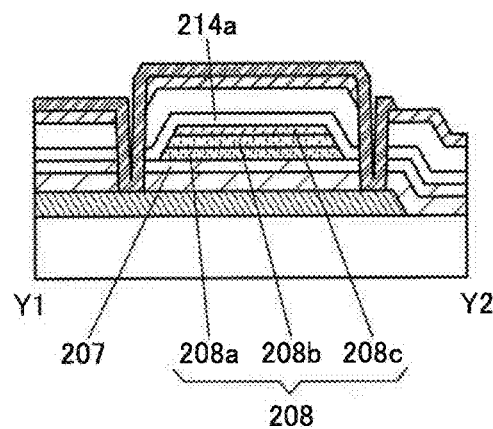
Figure 15C:
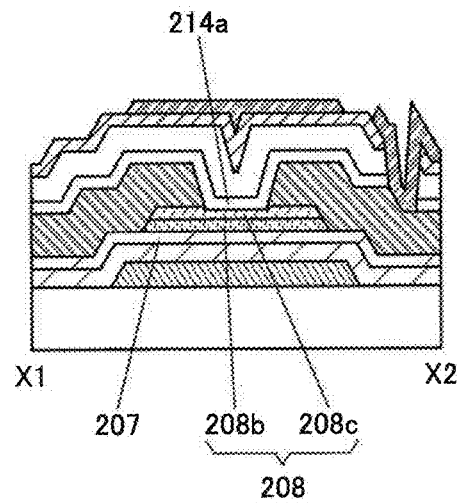
Figure 15D:
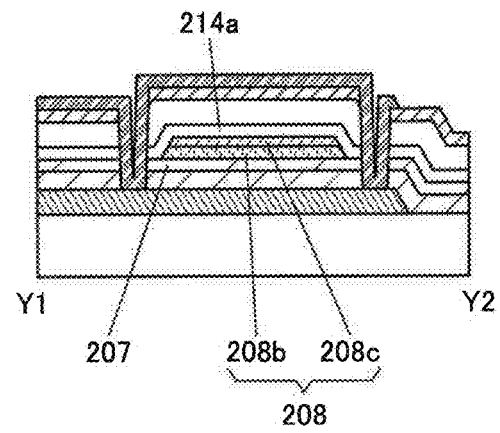

FIGS. 15A and 15B illustrate a cross-sectional view illustrating a variation of the transistor 270 in FIGS. 14B and 14C. FIGS. 15C and 15D illustrate a cross-sectional view illustrating another variation of the transistor 270 in FIGS. 14B and 14C.

A transistor 270A in FIGS. 15A and 15B has the same structure as the transistor 270 in FIGS. 14B and 14C except that the oxide semiconductor film 208 has a three-layer structure. Specifically, the oxide semiconductor film 208 of the transistor 270A includes an oxide semiconductor film 208a, an oxide semiconductor film 208b, and an oxide semiconductor film 208c.

A transistor 270B in FIGS. 15C and 15D has the same structure as the transistor 270 in FIGS. 14B and 14C except that the oxide semiconductor film 208 has a two-layer structure. Specifically, the oxide semiconductor film 208 of the transistor 270B includes the oxide semiconductor film 208b and the oxide semiconductor film 208c.

Here, a band structure including the oxide semiconductor films 208a, 208b, and 208c and insulating films in contact with the oxide semiconductor films is described with reference to FIGS. 16A and 16B.

Figure 16A:
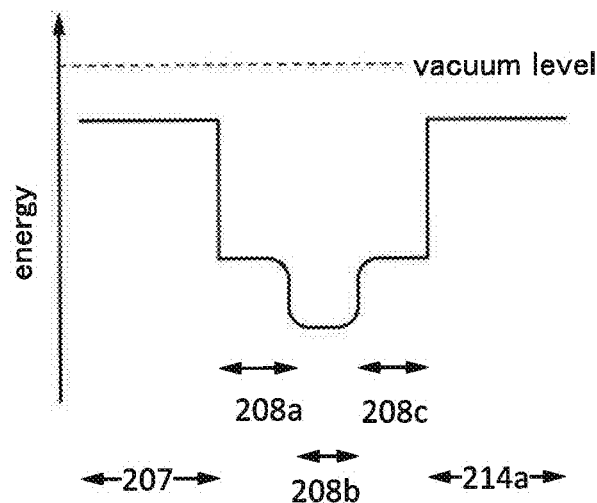
FIGS. 16A and 16B each show a band structure.

FIG. 16A shows an example of a band structure in the thickness direction of a stacked-layer structure including the insulating film 207, the oxide semiconductor films 208a, 208b, and 208c, and the oxide insulating film 214a. FIG. 16B shows an example of a band structure in the thickness direction of a stacked-layer structure including the insulating film 207, the oxide semiconductor films 208b and 208c, and the oxide insulating film 214a. For easy understanding, energy level of the conduction band minimum (Ec) of each of the insulating film 207, the oxide semiconductor films 208a, 208b, and 208c, and the oxide insulating film 214a is shown in the band structures.

In the band structure of FIG. 16A, a silicon oxide film is used as each of the insulating film 207 and the oxide insulating film 214a, an oxide semiconductor film formed using a metal oxide target having an atomic ratio of metal elements, In:Ga:Zn=1:3:2, is used as the oxide semiconductor film 208a, an oxide semiconductor film formed using a metal oxide target having an atomic ratio of metal elements, In:Ga:Zn=1:1:1, is used as the oxide semiconductor film 208b, and an oxide semiconductor film formed using a metal oxide target having an atomic ratio of metal elements, In:Ga:Zn=1:3:2, is used as the oxide semiconductor film 208c.

Figure 16B:
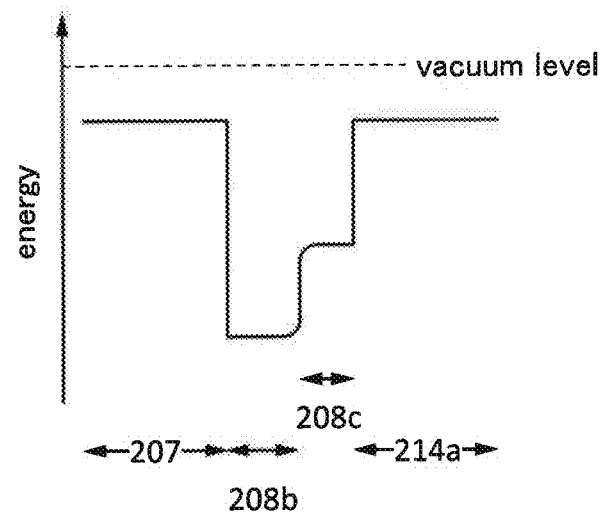

In the band structure of FIG. 16B, a silicon oxide film is used as each of the insulating film 207 and the oxide insulating film 214a, an oxide semiconductor film formed using a metal oxide target having an atomic ratio of metal elements, In:Ga:Zn=1:1:1, is used as the oxide semiconductor film 208b, and an oxide semiconductor film formed using a metal oxide target having an atomic ratio of metal elements, In:Ga:Zn=1:3:2, is used as the oxide semiconductor film 208c.

As illustrated in FIGS. 16A and 16B, the energy level of the conduction band minimum gradually changes between the oxide semiconductor film 208a and the oxide semiconductor film 208b and between the oxide semiconductor film 208b and the oxide semiconductor film 208c. In other words, the energy level of the conduction band minimum is continuously changed or continuously connected. To obtain such a band structure, there exists no impurity, which forms a defect state such as a trap center or a recombination center, at the interface between the oxide semiconductor film 208a and the oxide semiconductor film 208b or at the interface between the oxide semiconductor film 208b and the oxide semiconductor film 208c.

To form a continuous junction between the oxide semiconductor film 208a and the oxide semiconductor film 208b and between the oxide semiconductor film 208b and the oxide semiconductor film 208c, it is necessary to form the films successively without exposure to the air by using a multi-chamber deposition apparatus (sputtering apparatus) provided with a load lock chamber.

With the band structure of FIG. 16A or FIG. 16B, the oxide semiconductor film 208b serves as a well, and a channel region is formed in the oxide semiconductor film 208b in the transistor with the stacked-layer structure.

By providing the oxide semiconductor film 208a and the oxide semiconductor film 208c, the oxide semiconductor film 208b can be distanced away from trap states.

In addition, the trap states might be more distant from the vacuum level than the energy level of the conduction band minimum (Ec) of the oxide semiconductor film 208b functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the trap states be closer to the vacuum level than the energy level of the conduction band minimum (Ec) of the oxide semiconductor film 208b. Such a structure inhibits accumulation of electrons in the trap states. As a result, the on-state current and the field-effect mobility of the transistor can be increased.

The energy level of the conduction band minimum of each of the oxide semiconductor films 208a and 208c is closer to the vacuum level than that of the oxide semiconductor film 208b. Typically, a difference in energy level between the conduction band minimum of the oxide semiconductor film 208b and the conduction band minimum of each of the oxide semiconductor films 208a and 208c is 0.15 eV or more or 0.5 eV or more and 2 eV or less or 1 eV or less. That is, the difference between the electron affinity of each of the oxide semiconductor films 208a and 208c and the electron affinity of the oxide semiconductor film 208b is 0.15 eV or more or 0.5 eV or more and 2 eV or less or 1 eV or less.

In such a structure, the oxide semiconductor film 208b serves as a main path of current and functions as a channel region. In addition, since the oxide semiconductor films 208a and 208c each include one or more metal elements included in the oxide semiconductor film 208b in which a channel region is formed, interface scattering is less likely to occur at the interface between the oxide semiconductor film 208a and the oxide semiconductor film 208b or at the interface between the oxide semiconductor film 208b and the oxide semiconductor film 208c. Thus, the transistor can have high field-effect mobility because the movement of carriers is not hindered at the interface.

To prevent each of the oxide semiconductor films 208a and 208c from functioning as part of a channel region, a material having sufficiently low conductivity is used for the oxide semiconductor films 208a and 208c. Alternatively, a material which has a smaller electron affinity (a difference in energy level between the vacuum level and the conduction band minimum) than the oxide semiconductor film 208b and has a difference in energy level in the conduction band minimum from the oxide semiconductor film 208b (band offset) is used for the oxide semiconductor films 208a and 208c. Furthermore, to inhibit generation of a difference in threshold voltage due to the value of the drain voltage, it is preferable to form the oxide semiconductor films 208a and 208c using a material whose energy level of the conduction band minimum is closer to the vacuum level than that of the oxide semiconductor film 208b by 0.2 eV or more, preferably 0.5 eV or more.

It is preferable that the oxide semiconductor films 208a and 208c not have a spinel crystal structure. This is because if the oxide semiconductor films 208a and 208c have a spinel crystal structure, constituent elements of the conductive films 212a and 212b might be diffused to the oxide semiconductor film 208b at the interface between the spinel crystal structure and another region. Note that each of the oxide semiconductor film 208a and 208c is preferably a CAAC-OS, which is described later, in which case a higher blocking property against constituent elements of the conductive films 212a and 212b, for example, copper elements, is obtained.

The thickness of each of the oxide semiconductor films 208a and 208c is greater than or equal to a thickness that is capable of inhibiting diffusion of the constituent elements of the conductive films 212a and 212b to the oxide semiconductor film 208b, and less than a thickness that inhibits supply of oxygen from the oxide insulating film 214a to the oxide semiconductor film 208b. For example, when the thickness of each of the oxide semiconductor films 208a and 208c is greater than or equal to 10 nm, diffusion of the constituent elements of the conductive films 212a and 212b to the oxide semiconductor film 208b can be inhibited. When the thickness of each of the oxide semiconductor films 208a and 208c is less than or equal to 100 nm, oxygen can be effectively supplied from the oxide insulating film 214a to the oxide semiconductor film 208b.

When the oxide semiconductor films 208a and 208c are each an In-M-Zn oxide in which the atomic ratio of the element M (M is Ti, Ga, Y, Zr, La, Ce, Nd, Sn, or Hf) is higher than that of In, the energy gap of each of the oxide semiconductor films 208a and 208c can be large and the electron affinity thereof can be small. Therefore, a difference in electron affinity between the oxide semiconductor film 208b and each of the oxide semiconductor films 208a and 208c may be controlled by the proportion of the element M. Furthermore, oxygen vacancies are less likely to be generated in the oxide semiconductor film in which the atomic ratio of Ti, Ga, Y, Zr, La, Ce, Nd, Sn or Hf is higher than that of In because Ti, Ga, Y, Zr, La, Ce, Nd, Sn, and Hf are each a metal element that is strongly bonded to oxygen.

When an In-M-Zn oxide is used for the oxide semiconductor films 208a and 208c, the proportions of In and M, not taking Zn and O into consideration, is as follows: the atomic percentage of In is preferably less than 50 atomic % and the atomic percentage of M is greater than 50 atomic % and further preferably the atomic percentage of In is less than 25 atomic % and the atomic percentage of M is greater than 75 atomic %. Alternatively, a gallium oxide film may be used as each of the oxide semiconductor films 208a and 208c.

Furthermore, in the case where each of the oxide semiconductor films 208a, 208b, and 208c is an In-M-Zn oxide, the proportion of M atoms in each of the oxide semiconductor films 208a and 208c is higher than that in the oxide semiconductor film 208b. Typically, the proportion of M atoms in each of the oxide semiconductor films 208a and 208c is 1.5 or more times, preferably two or more times and further preferably three or more times as high as that in the oxide semiconductor film 208b.

Furthermore, in the case where the oxide semiconductor films 208a, 208b, and 208c are each an In-M-Zn oxide, when the oxide semiconductor film 208b has an atomic ratio of In:M:Zn=$x_1$:$y_1$:$z_1$ and the oxide semiconductor films 208a and 208c each have an atomic ratio of In:M:Zn=$x_2$:$y_2$:$z_2$, $y_2/x_2$ is larger than $y_1/x_1$, preferably $y_2/x_2$ is 1.5 or more times as large as $y_1/x_1$, further preferably, $y_2/x_2$ is two or more times as large as $y_1/x_1$, and still further preferably $y_2/x_2$ is three or more times or four or more times as large as $y_1/x_1$. At this time, $y_1$ is preferably greater than or equal to $x_1$ in the oxide semiconductor film 208b, because stable electrical characteristics of a transistor including the oxide semiconductor film 208b can be achieved. However, when $y_1$ is three or more times as large as $x_1$, the field-effect mobility of the transistor including the oxide semiconductor film 208b is reduced. Accordingly, $y_1$ is preferably smaller than three times $x_1$.

In the case where the oxide semiconductor film 208b is an In-M-Zn oxide and a target having the atomic ratio of metal elements of In:M:Zn=$x_1$:$y_1$:$z_1$ is used for depositing the oxide semiconductor film 208b, $x_1/y_1$ is preferably greater than or equal to ⅓ and less than or equal to 6 and further preferably greater than or equal to 1 and less than or equal to 6, and $z_1/y_1$ is preferably greater than or equal to ⅓ and less than or equal to 6 and further preferably greater than or equal to 1 and less than or equal to 6. Note that when $z_1/y_1$ is greater than or equal to 1 and less than or equal to 6, a CAAC-OS to be described later is easily formed as the oxide semiconductor film 208b. Typical examples of the atomic ratio of the metal elements of the target are In:M:Zn=1:1:1, In:M:Zn=1:1:1.2, and In:M:Zn=3:1:2.

In the case where the oxide semiconductor films 208a and 208c are each an In-M-Zn oxide and a target having an atomic ratio of metal elements of In:M:Zn=$x_2$:$y_2$:$z_2$ is used for depositing the oxide semiconductor films 208a and 208c, $x_2/y_2$ is preferably less than $x_1/y_1$, and $z_2/y_2$ is preferably greater than or equal to ⅓ and less than or equal to 6 and further preferably greater than or equal to 1 and less than or equal to 6. When the atomic ratio of M with respect to In is high, the energy gap of the oxide semiconductor films 208a and 208c can be large and the electron affinity thereof can be small; therefore, $y_2/x_2$ is preferably higher than or equal to 3 or higher than or equal to 4. Typical examples of the atomic ratio of the metal elements of the target include In:M:Zn=1:3:2, In:M:Zn=1:3:4, In:M:Zn=1:3:5, In:M:Zn=1:3:6, In:M:Zn=1:4:2, In:M:Zn=1:4:4, In:M:Zn=1:4:5, and In:M:Zn=1:5:5.

Furthermore, in the case where the oxide semiconductor films 208a and 208c are each an In-M oxide, when a divalent metal element (e.g., zinc) is not included as M, the oxide semiconductor films 208a and 208c which do not include a spinel crystal structure can be formed. As the oxide semiconductor films 208a and 208c, for example, an In—Ga oxide film can be used. The In—Ga oxide can be deposited by a sputtering method using an In—Ga metal oxide target (In:Ga=7:93), for example. To deposit the oxide semiconductor films 208a and 208c by a sputtering method using DC discharge, on the assumption that an atomic ratio of In:M is x:y, y/(x+y) is preferably less than or equal to 0.96 and further preferably less than or equal to 0.95, for example, 0.93.

In each of the oxide semiconductor films 208a, 208b, and 208c, the proportions of the atoms in the above atomic ratio vary within an error of approximately ±40%.

The structures of the transistors of this embodiment can be freely combined with each other.

<2-6. Manufacturing Method of Semiconductor Device>

Next, a method for manufacturing the transistor 200 that is a semiconductor device of one embodiment of the present invention will be described in detail below with reference to FIGS. 17A to 17D and FIGS. 18A to 18D.

First, a conductive film is formed over the substrate 202 and processed through a lithography process and an etching process, whereby the conductive film 204 functioning as a gate electrode is formed. Then, the insulating films 206 and 207 functioning as gate insulating films are formed over the conductive film 204 (see FIG. 17A).

The conductive film 204 functioning as a gate electrode can be formed by a sputtering method, a chemical vapor deposition (CVD) method, a vacuum evaporation method, or a pulsed laser deposition (PLD) method. Alternatively, a coating method or a printing method can be used. Although typical deposition methods are a sputtering method and a plasma enhanced CVD (PECVD) method, a thermal CVD method, such as a metal organic CVD (MOCVD) method, or an atomic layer deposition (ALD) method described above may be used.

In this embodiment, a glass substrate is used as the substrate 202, and as the conductive film 204 functioning as a gate electrode, a 100-nm-thick tungsten film is formed by a sputtering method.

The insulating films 206 and 207 functioning as gate insulating films can be formed by a sputtering method, a PECVD method, a thermal CVD method, a vacuum evaporation method, a PLD method, or the like. In this embodiment, a 400-nm-thick silicon nitride film as the insulating film 206 and a 50-nm-thick silicon oxynitride film as the insulating film 207 are formed by a PECVD method.

Note that the insulating film 206 can have a stacked-layer structure of silicon nitride films. Specifically, the insulating film 206 can have a three-layer structure of a first silicon nitride film, a second silicon nitride film, and a third silicon nitride film. An example of the three-layer structure is as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and the power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and the power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and the power of 2000 W is supplied using a 27.12 MHz high-frequency power source.

Note that the first silicon nitride film, the second silicon nitride film, and the third silicon nitride film can each be formed at a substrate temperature of 350° C.

When the insulating film 206 has the three-layer structure of silicon nitride films, for example, in the case where a conductive film including Cu is used as the conductive film 204, the following effect can be obtained.

The first silicon nitride film can inhibit diffusion of a copper (Cu) element from the conductive film 204. The second silicon nitride film has a function of releasing hydrogen and can improve withstand voltage of the insulating film functioning as a gate insulating film. The third silicon nitride film releases a small amount of hydrogen and can inhibit diffusion of hydrogen released from the second silicon nitride film.

The insulating film 207 is preferably an insulating film including oxygen to improve characteristics of an interface with the oxide semiconductor film 208 formed later.

Figure 17A:
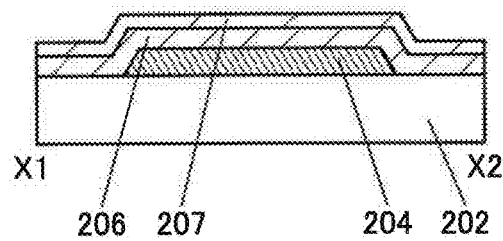
FIGS. 17A to 17D are cross-sectional views illustrating an example of a manufacturing process of a semiconductor device.
Figure 17B:
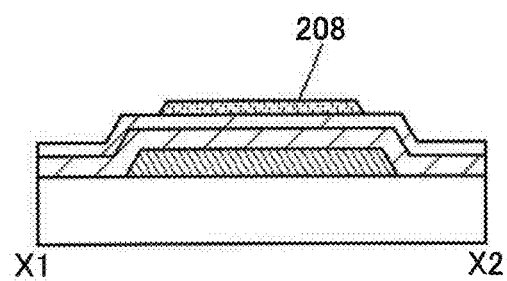

Next, the oxide semiconductor film 208 is formed over the insulating film 207 (see FIG. 17B).

In this embodiment, an oxide semiconductor film is deposited with a sputtering apparatus using an In—Ga—Zn metal oxide target (with an atomic ratio of In:Ga:Zn=4:2:4.1). The oxide semiconductor film is formed under conditions where oxygen vacancies are formed. When the oxide semiconductor film is formed under the conditions where the partial pressure of oxygen in the sputtering apparatus is higher than 0% and lower than 50%, oxygen vacancies in the oxide semiconductor film can be increased. In this embodiment, the oxide semiconductor film is formed under at an oxygen partial pressure in the sputtering apparatus of 30%.

Next, a mask is formed over the oxide semiconductor film through a lithography process, and the oxide semiconductor film is processed into a desired shape to form the island-shaped oxide semiconductor film 208.

After the island-shaped oxide semiconductor film 208 is formed, a heating step may be performed to increase oxygen vacancies in the oxide semiconductor film 208. The heating step can be performed in a manner similar to that of the heating step after formation of the oxide semiconductor film 108 in Embodiment 1.

Figure 17C:
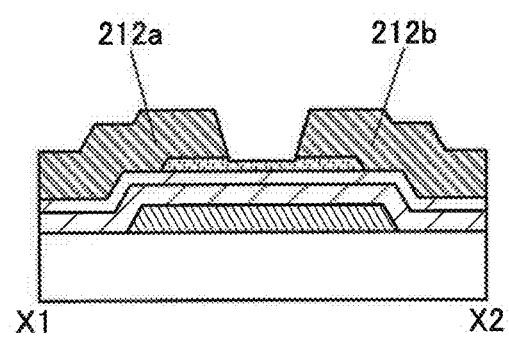

Next, the conductive films 212a and 212b which function as source and drain electrodes are formed over the insulating film 207 and the oxide semiconductor film 208 (see FIG. 17C).

In this embodiment, the conductive films 212a and 212b are formed in the following manner: a stack formed of a 50-nm-thick tungsten film and a 400-nm-thick aluminum film is formed by a sputtering method, a mask is formed over the stack through a lithography process, and the stack is processed into desired regions. Although the conductive films 212a and 212b each have a two-layer structure in this embodiment, one embodiment of the present invention is not limited thereto. For example, the conductive films 212a and 212b each may have a three-layer structure of a 50-nm-thick tungsten film, a 400-nm-thick aluminum film, and a 100-nm-thick titanium film.

After the conductive films 212a and 212b are formed, a surface of the oxide semiconductor film 208 (on the back channel side) may be cleaned. The cleaning may be performed, for example, using a chemical solution such as phosphoric acid. The cleaning using a chemical solution such as a phosphoric acid can remove impurities (e.g., an element included in the conductive films 212a and 212b) attached to the surface of the oxide semiconductor film 208.

As illustrated in FIGS. 11B and 11C and FIG. 17C, in the step of forming the conductive films 212a and 212b and/or the cleaning step, a recessed portion might be formed in part of the oxide semiconductor film 208.

Figure 45A:
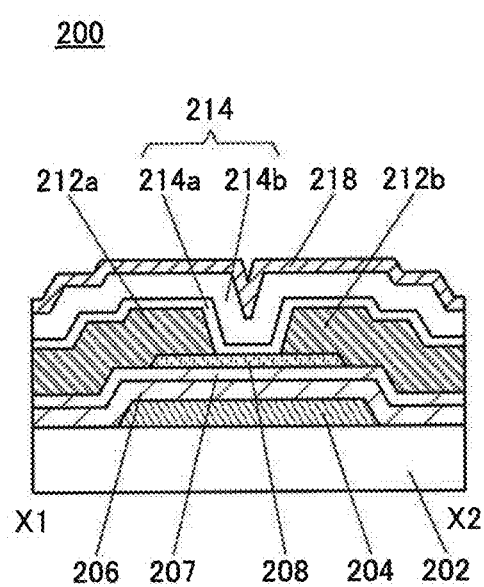
FIGS. 45A and 45B are cross-sectional views illustrating an example of a semiconductor device.
Figure 45B:
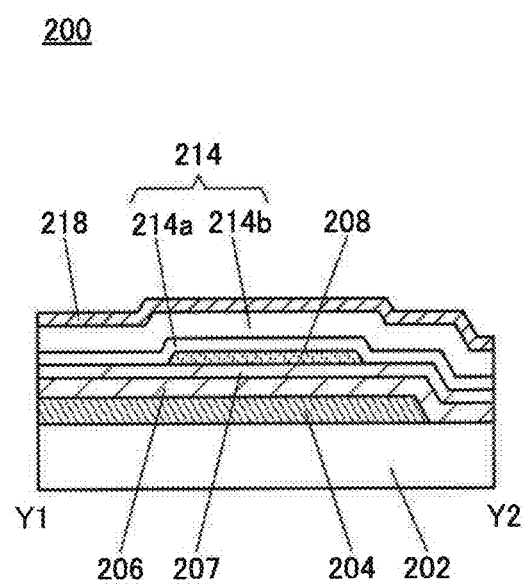

Note that the cross-sectional structure when a recessed portion is not formed in part of the oxide semiconductor film 208 at the step of forming the conductive films 212a and 212b and/or the cleaning step is illustrated in FIGS. 45A and 45B.

Through the above-described steps, the transistor 200 is formed.

Figure 17D:
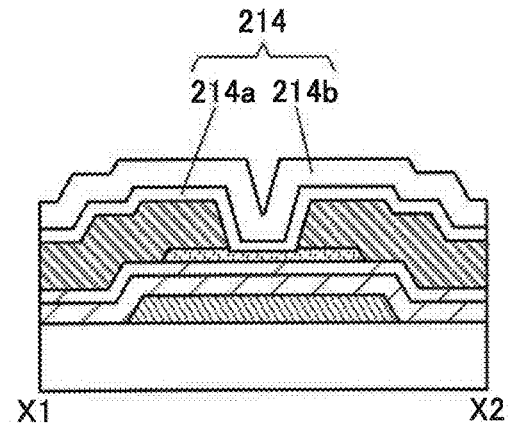

Next, over the transistor 200, specifically, over the oxide semiconductor film 208 and the conductive films 212a and 212b of the transistor 200, the oxide insulating film 214 (the oxide insulating film 214a and the oxide insulating film 214b) functioning as a protective insulating film of the transistor 200 is formed (see FIG. 17D).

The oxide insulating films 214a and 214b can be formed using a material and a method similar to those of the oxide insulating films 114a and 114b described in Embodiment 1.

After the oxide insulating film 214 is formed, heat treatment may be performed. The heat treatment can reduce nitrogen oxide included in the oxide insulating film 214. By the heat treatment, part of oxygen included in the oxide insulating film 214 can be moved to the oxide semiconductor film 208, so that the amount of oxygen vacancies included in the oxide semiconductor film 208 can be reduced. In this embodiment, the heat treatment is performed at 350° C. for 1 hour in an atmosphere of nitrogen and oxygen.

Figure 18A:
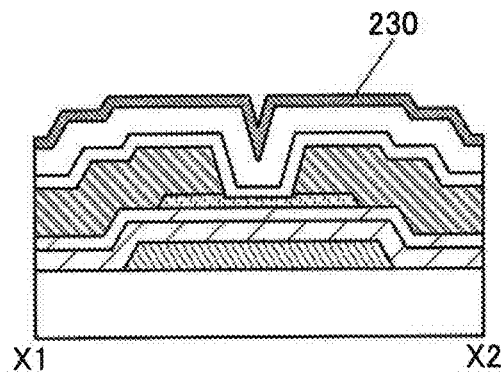
FIGS. 18A to 18D are cross-sectional views illustrating an example of a manufacturing process of a semiconductor device.

Next, a protective film 230 is formed over the oxide insulating film 214 (see FIG. 18A).

The protective film 230 can be formed using a material and a method similar to those of the protective film 130 described in Embodiment 1.

Figure 18B:
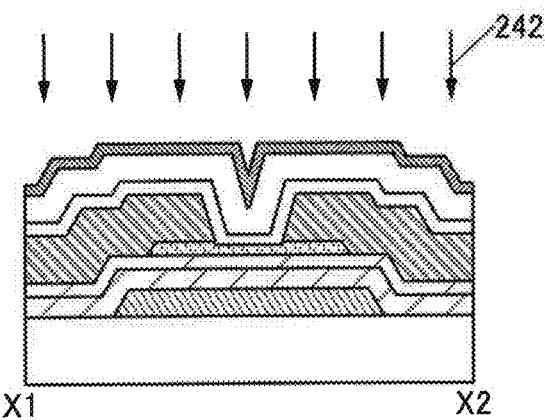

Next, oxygen 242 is added to the oxide insulating film 214 through the protective film 230 (see FIG. 18B).

As the method for adding the oxygen 242, a method similar to the method for adding the oxygen 142 described in Embodiment 1 may be used.

Figure 18C:
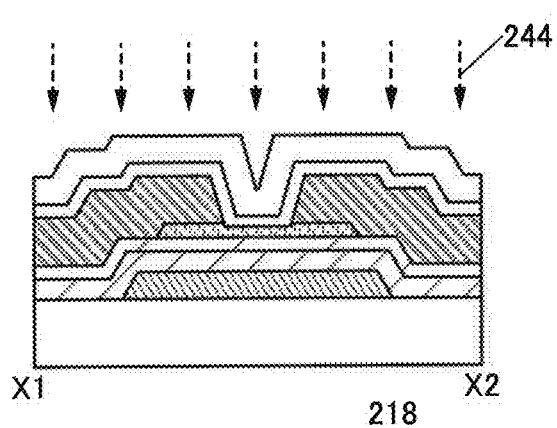

Then, the protective film 230 is removed using an etchant 244 (see FIG. 18C).

As the method for removing the protective film 230, a method similar to the method for removing the protective film 130 in Embodiment 1 may be used.

Next, the nitride insulating film 218 is formed over the oxide insulating film 214. In this way, the transistor 200 illustrated in FIGS. 11A to 11C can be formed (see FIG. 18D).

The nitride insulating film 218 can be formed using a material and a method similar to those of the nitride insulating film 118 described in Embodiment 1.

Through the above-described steps, the transistor 200 illustrated in FIGS. 11A to 11C can be formed.

<2-7. Manufacturing Method of Semiconductor Device>

Next, a method for manufacturing the transistor 250 illustrated in FIGS. 12A to 12C will be described in detail below with reference to FIGS. 19A to 19D and FIGS. 20A and 20B.

Figure 19A:
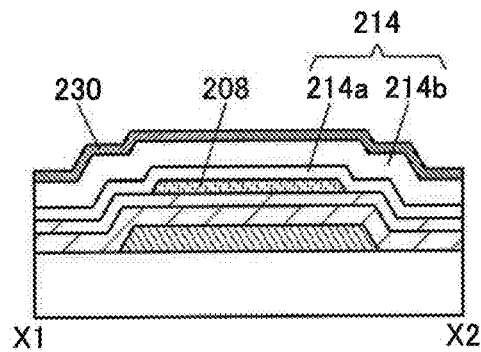
FIGS. 19A to 19D are cross-sectional views illustrating an example of a manufacturing process of a semiconductor device.

First, the steps up to the step illustrated in FIG. 17B are performed, and then the oxide insulating film 214 and the protective film 230 are formed over the insulating film 207 and the oxide semiconductor film 208 (see FIG. 19A).

Figure 19B:
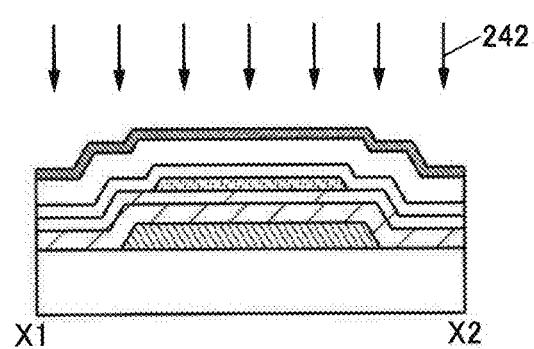

Then, the oxygen 242 is added to the oxide insulating film 214 through the protective film 230 (see FIG. 19B).

Figure 19C:
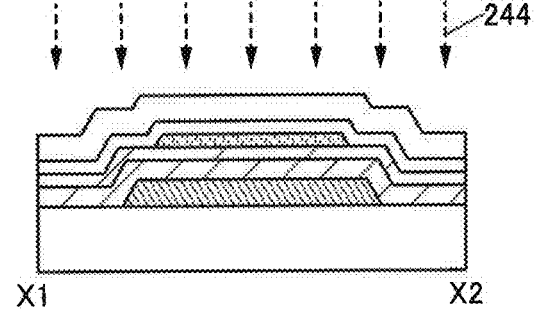
Figure 19D:
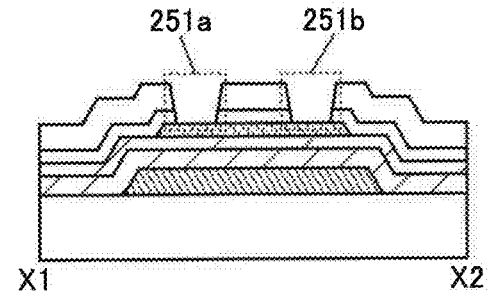

Then, the protective film 230 is removed using the etchant 244 (see FIG. 19C)

Next, a mask is formed over the oxide insulating film 214 through a lithography process, and the openings 251a and 251b are formed in desired regions in the oxide insulating film 214. Note that the openings 251a and 251b reach the oxide semiconductor film 208 (see FIG. 19D).

Figure 20A:
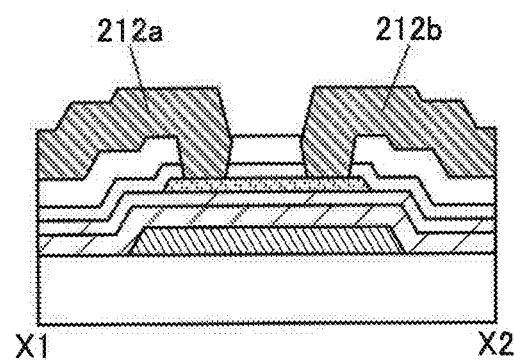
FIGS. 20A and 20B are cross-sectional views illustrating an example of a manufacturing process of a semiconductor device.

Next, a conductive film is deposited over the oxide semiconductor film 208 and the oxide insulating film 214 to cover the openings 251a and 251b, a mask is formed over the conductive film through a lithography process, and the conductive film is processed into desired regions, whereby the conductive films 212a and 212b are formed (see FIG. 20A).

Figure 20B:
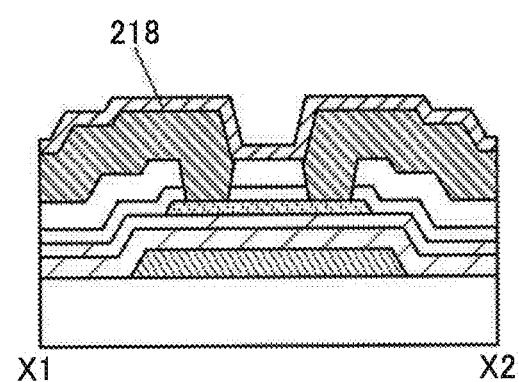

Next, the nitride insulating film 218 is formed over the oxide insulating film 214 and the conductive films 212a and 212b (see FIG. 20B).

Through the above-described steps, the transistor 250 illustrated in FIGS. 12A to 12C can be manufactured.

Figure 13B:
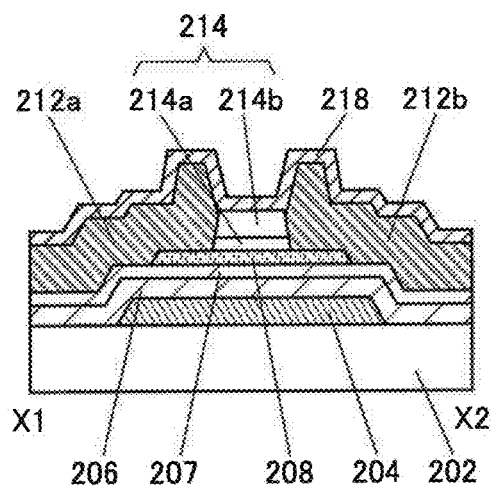
Figure 13C:
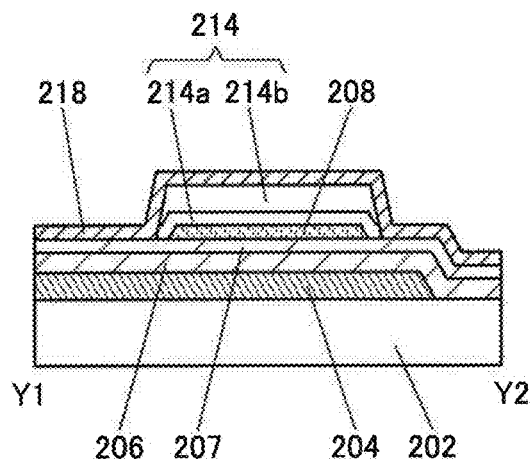

Note that the transistor 260 in FIGS. 13A to 13C can be manufactured in such a manner that the oxide insulating film 214 is left over a channel region of the oxide semiconductor film 208 at the step of forming the openings 251a and 251b.

<2-8. Manufacturing Method of Semiconductor Device>

Next, a method for manufacturing the transistor 270 illustrated in FIGS. 14A to 14C will be described in detail below with reference to FIGS. 21A to 21D and FIGS. 22A to 22D.

FIGS. 21A and 21C and FIGS. 22A and 22C are each a cross-sectional view in the channel length direction of the transistor 270 in the manufacturing process, and FIGS. 21B and 21D and FIGS. 22B and 22D are each a cross-sectional view in the channel width direction of the transistor 270 in the manufacturing process.

Figure 18D:
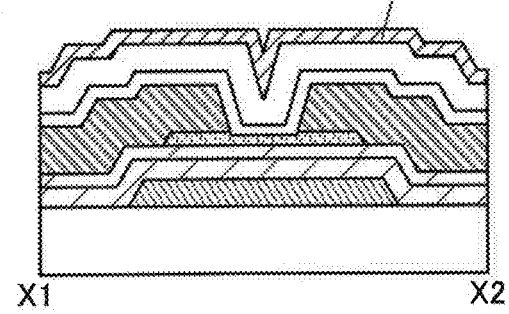
Figure 21A:
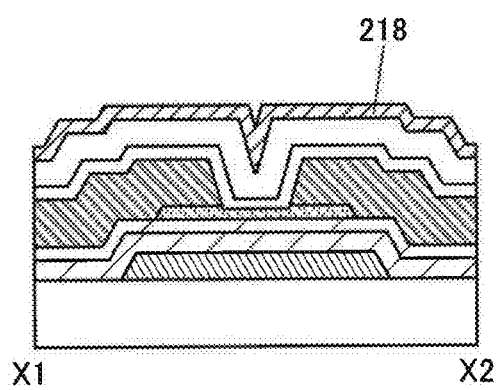
FIGS. 21A to 21D are cross-sectional views illustrating an example of a manufacturing process of a semiconductor device.
Figure 21B:
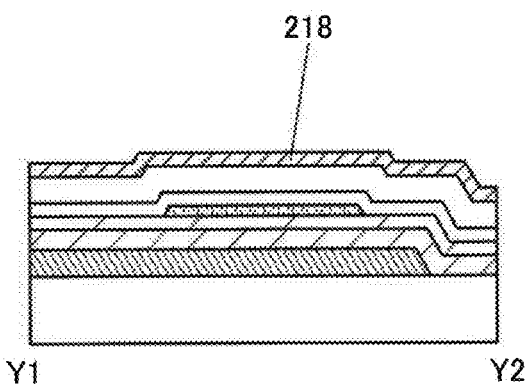
Figure 21C:
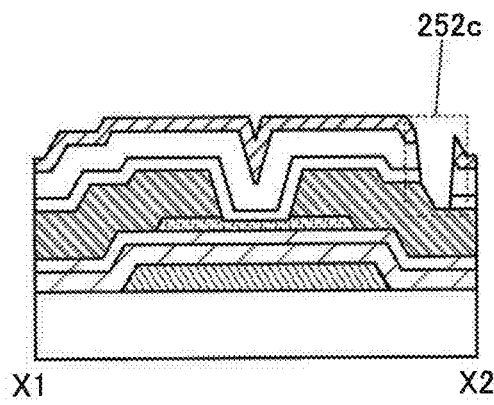
Figure 21D:
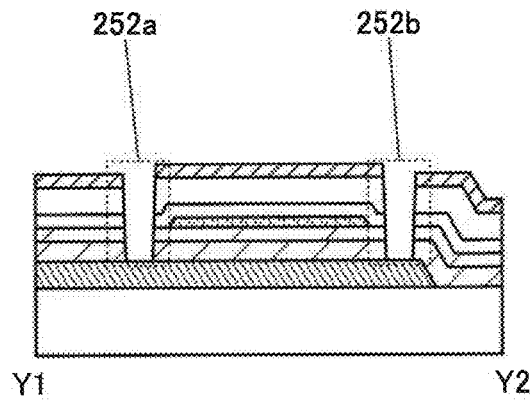

First, the steps up to the step illustrated in FIG. 18D are performed (see FIGS. 21A and 21B).

Next, a mask is formed over the nitride insulating film 218 through a lithography process, and the opening 252c is formed in a desired region in the oxide insulating film 214 and the nitride insulating film 218. A mask is formed over the nitride insulating film 218 through a lithography process, and the openings 252a and 252b are formed in desired regions in the insulating films 206 and 207, the oxide insulating film 214, and the nitride insulating film 218. Note that the opening 252c reaches the conductive film 212b. The openings 252a and 252b reach the conductive film 204 (see FIGS. 21C and 21D).

Note that the openings 252a and 252b and the opening 252c may be formed in the same step or may be formed by different steps. In the case where the openings 252a and 252b and the opening 252c are formed in the same step, for example, a gray-tone mask or a half-tone mask can be used.

Figure 22A:
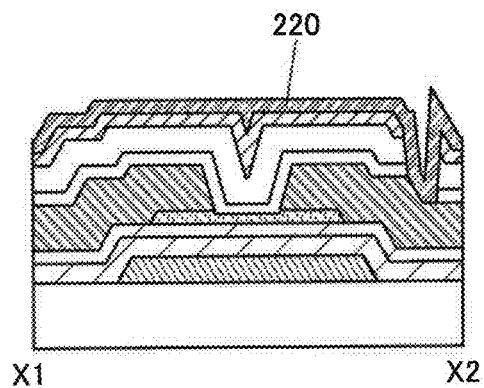
FIGS. 22A to 22D are cross-sectional views illustrating an example of a manufacturing process of a semiconductor device.
Figure 22B:
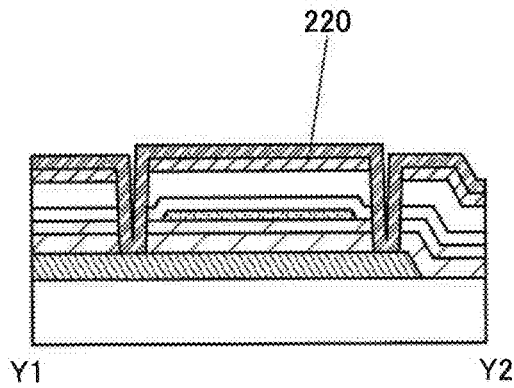

Then, a conductive film 220 is formed over the nitride insulating film 218 so as to cover the openings 252a, 252b, and 252c (see FIGS. 22A and 22B).

For the conductive film 220, for example, a material including one of indium (In), zinc (Zn), and tin (Sn) can be used. In particular, for the conductive film 220, a light-transmitting conductive material such as indium oxide including tungsten oxide, indium zinc oxide including tungsten oxide, indium oxide including titanium oxide, indium tin oxide including titanium oxide, indium tin oxide, indium zinc oxide, or indium tin oxide including silicon oxide can be used. It is preferable to form the conductive film 220 and the protective film 230 using the same material because manufacturing cost can be suppressed.

The conductive film 220 can be formed with a sputtering apparatus, for example. In this embodiment, a 110-nm-thick ITSO film is formed with a sputtering apparatus.

Figure 22C:
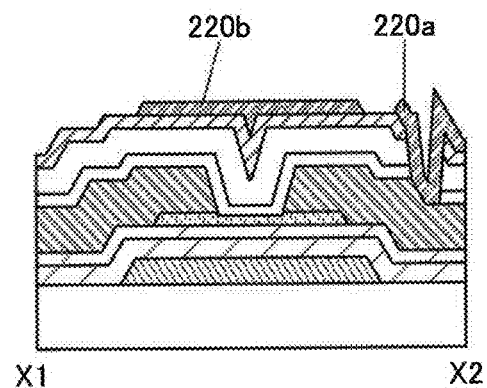
Figure 22D:
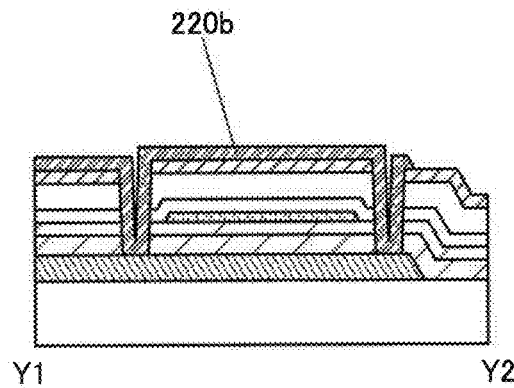

Next, a mask is formed over the conductive film 220 through a lithography process, and the conductive film 220 is processed into desired shapes to form the conductive films 220a and 220b (see FIGS. 22C and 22D).

Through the above-described steps, the transistor 270 illustrated in FIGS. 14A to 14C can be manufactured.

Although films included in a transistor (a variety of films such as a conductive film, an insulating film, and an oxide semiconductor film) can be formed by a sputtering method or a PECVD method, such films may be formed by another method, e.g., a thermal chemical vapor deposition (CVD) method. Examples of the thermal CVD method include a metal organic chemical vapor deposition (MOCVD) method and an atomic layer deposition (ALD) method. Alternatively, a variety of films such as a conductive film, an insulating film, and an oxide semiconductor film may be formed by a coating method or a printing method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET. By a thermal CVD method such as an MOCVD method or an ALD method, a variety of films such as the conductive film, the insulating film, the oxide semiconductor film, and the metal oxide film in the above embodiment can be formed.

The structures and methods described in this embodiment can be combined as appropriate with any of the other structures and methods described in the other embodiments.

Embodiment 3

In this embodiment, the structure of an oxide semiconductor film included in a semiconductor device of one embodiment of the present invention is described in detail. First, structures that can be included in an oxide semiconductor film are described below.

An oxide semiconductor is classified into a single crystal oxide semiconductor and a non-single-crystal oxide semiconductor.

Examples of a non-single-crystal oxide semiconductor include a CAAC-OS (c-axis aligned crystalline oxide semiconductor), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

<3-1. CAAC-OS>

First, a CAAC-OS is described. Note that a CAAC-OS can be referred to as an oxide semiconductor including CANC (c-axis aligned nanocrystals).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 24A:
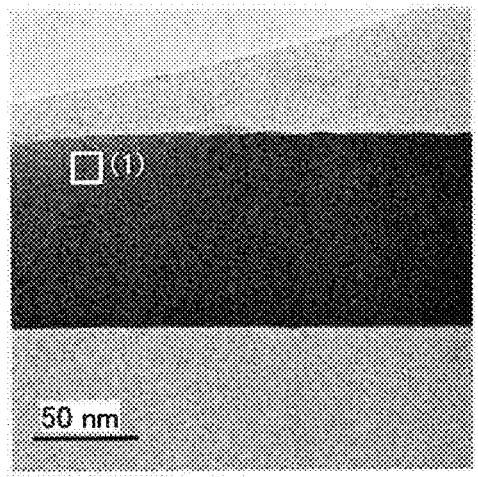
FIGS. 24A to 24D are Cs-corrected high-resolution TEM images of a cross section of a CAAC-OS and a cross-sectional schematic view of a CAAC-OS.

FIG. 24A shows an example of a high-resolution TEM image of a cross section of the CAAC-OS which is obtained from a direction substantially parallel to the sample surface. Here, the TEM image is obtained with a spherical aberration corrector function. The high-resolution TEM image obtained with a spherical aberration corrector function is particularly referred to as a Cs-corrected high-resolution TEM image in the following description. Note that the Cs-corrected high-resolution TEM image can be obtained with, for example, an atomic resolution analytical electron microscope JEM-ARM200F manufactured by JEOL Ltd.

A CAAC-OS observed with TEM is described below. FIG. 24A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 24B:
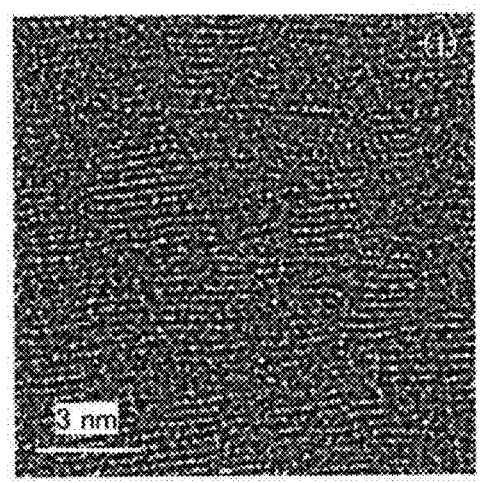

FIG. 24B is an enlarged Cs-corrected high-resolution TEM image of a region (1) in FIG. 24A. FIG. 24B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 24C:
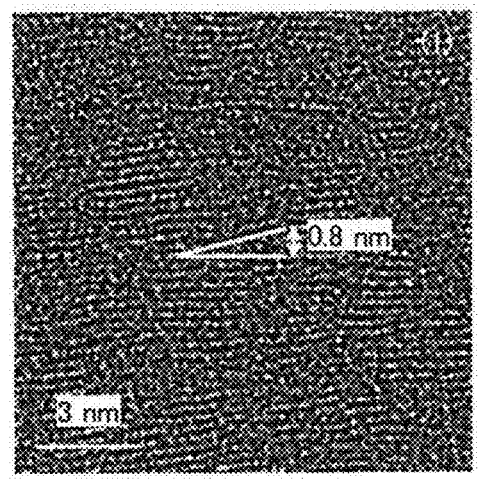

As shown in FIG. 24B, the CAAC-OS has a characteristic atomic arrangement. The characteristic atomic arrangement is denoted by an auxiliary line in FIG. 24C. FIGS. 24B and 24C prove that the size of a pellet is approximately 1 nm to 3 nm, and the size of a space caused by tilt of the pellets is approximately 0.8 nm. Therefore, the pellet can also be referred to as a nanocrystal (nc).

Figure 24D:
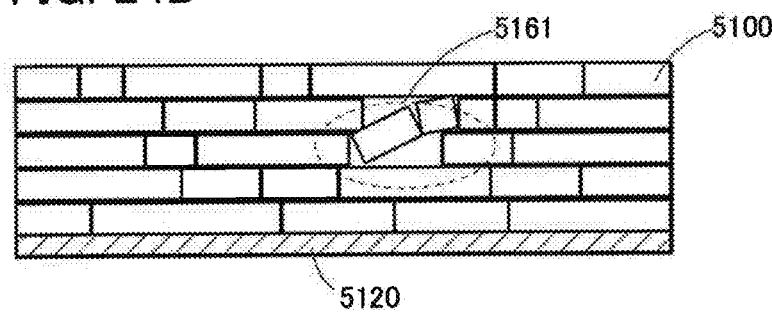

Here, according to the Cs-corrected high-resolution TEM images, the schematic arrangement of pellets 5100 of a CAAC-OS over a substrate 5120 is illustrated by such a structure in which bricks or blocks are stacked (see FIG. 24D). The part in which the pellets are tilted as observed in FIG. 24C corresponds to a region 5161 shown in FIG. 24D.

FIG. 25A shows a Cs-corrected high-resolution TEM image of a plane of the CAAC-OS observed from a direction substantially perpendicular to the sample surface. FIGS. 25B, 25C, and 25D are enlarged Cs-corrected high-resolution TEM images of regions (1), (2), and (3) in FIG. 25A, respectively. FIGS. 25B, 25C, and 25D indicate that metal atoms are arranged in a triangular, quadrangular, or hexagonal configuration in a pellet. However, there is no regularity of arrangement of metal atoms between different pellets.

Figure 26A:
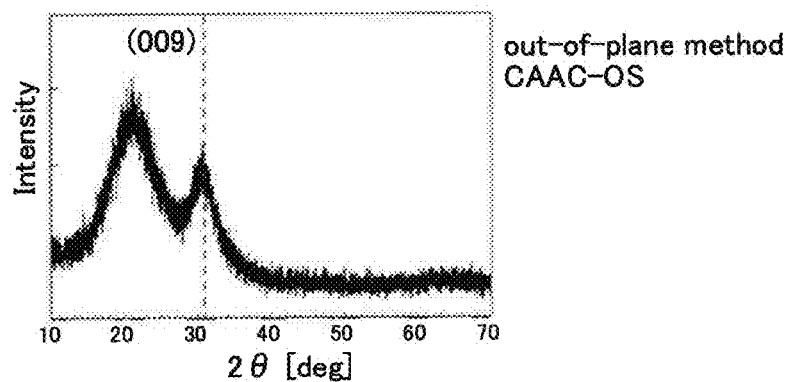
FIGS. 26A to 26C show structural analysis of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 26A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 26B:
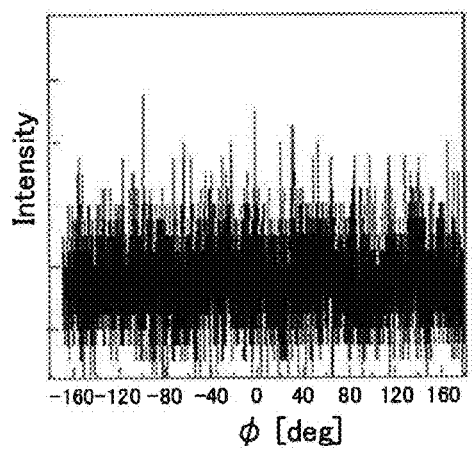
Figure 26C:
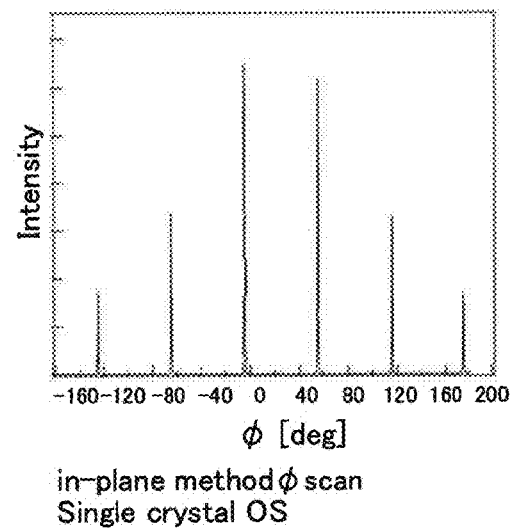

On the other hand, in structural analysis of the CAAC-OS by an in-plane method in which an X-ray is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 26B, a peak is not clearly observed. In contrast, in the case of a single crystal oxide semiconductor of InGaZnO$_4$, when φ scan is performed with 2θ fixed at around 56°, as shown in FIG. 26C, six peaks which are derived from crystal planes equivalent to the (110) plane are observed. Accordingly, the structural analysis using XRD shows that the directions of a-axes and b-axes are irregularly oriented in the CAAC-OS.

Figure 27A:
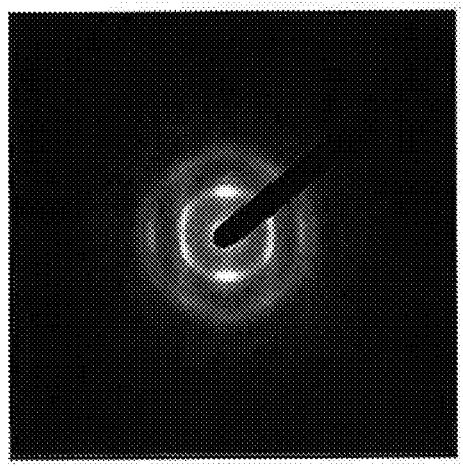
FIGS. 27A and 27B show electron diffraction patterns of a CAAC-OS.
Figure 27B:
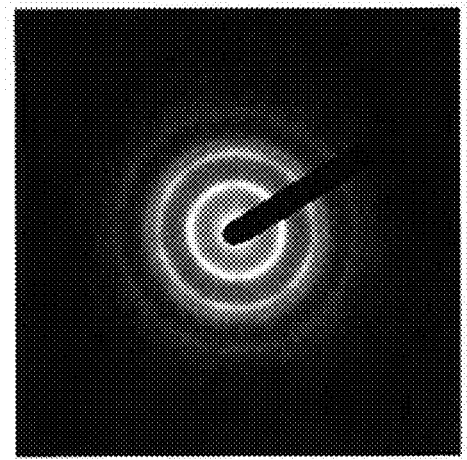

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 27A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 27B shows a diffraction pattern obtained in such a manner that an electron beam with a probe diameter of 300 nm is incident on the same sample in a direction perpendicular to the sample surface. As shown in FIG. 27B, a ring-like diffraction pattern is observed. Thus, the electron diffraction also indicates that the a-axes and b-axes of the pellets included in the CAAC-OS do not have regular alignment. The first ring in FIG. 27B is considered to be derived from the (010) plane, the (100) plane, and the like of the InGaZnO$_4$ crystal. The second ring in FIG. 27B is considered to be derived from the (110) plane and the like.

Moreover, the CAAC-OS is an oxide semiconductor having a low density of defect states. Defects in the oxide semiconductor are, for example, a defect due to impurity and oxygen vacancies. Therefore, the CAAC-OS can be regarded as an oxide semiconductor with a low impurity concentration, or an oxide semiconductor having a small number of oxygen vacancies.

The impurity contained in the oxide semiconductor might serve as a carrier trap or serve as a carrier generation source. Furthermore, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be a highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers are less likely to be trapped in defect states with light irradiation. Therefore, in a transistor using the CAAC-OS, change in electrical characteristics due to irradiation with visible light or ultraviolet light is small.

<3-2. Microcrystalline Oxide Semiconductor>

Next, a microcrystalline oxide semiconductor is described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

<3-3. Amorphous Oxide Semiconductor>

Next, an amorphous oxide semiconductor is described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering within the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

<3-4. Amorphous-Like Oxide Semiconductor>

Note that an oxide semiconductor may have a structure having physical properties intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 28:
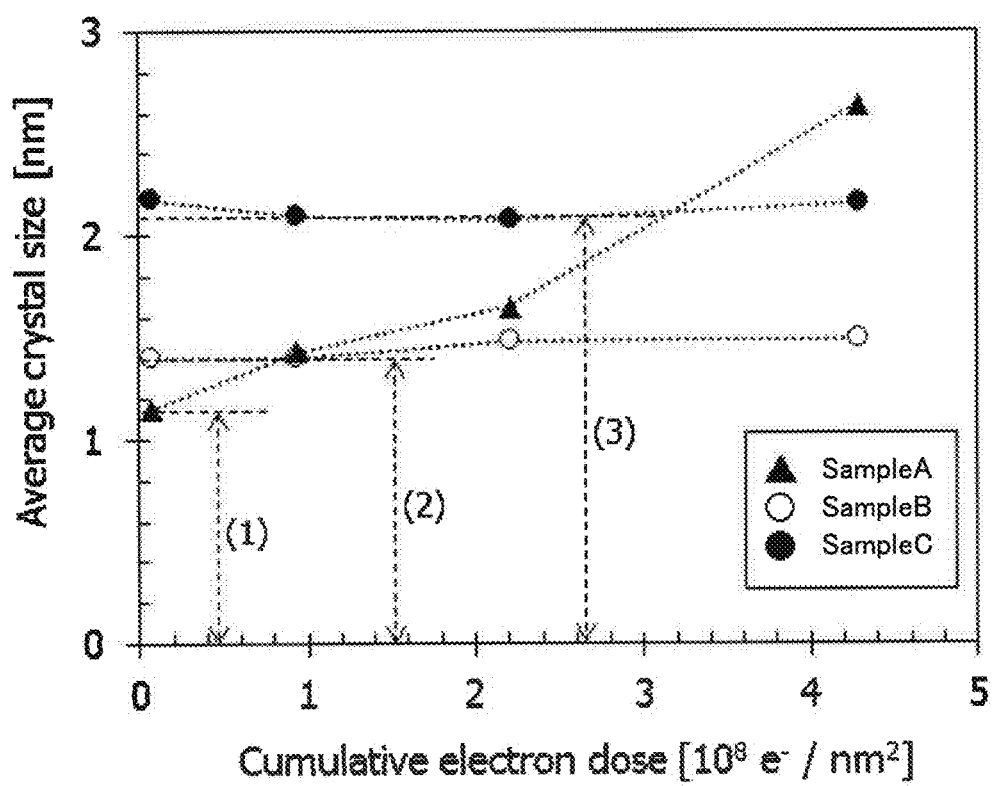
FIG. 28 shows a change in crystal part of an In—Ga—Zn oxide induced by electron irradiation.

FIG. 28 shows change in the average size of crystal parts (at 22 points to 45 points) in each sample. Note that the crystal part size corresponds to the length of a lattice fringe. FIG. 28 indicates that the crystal part size in the a-like OS increases with an increase in the cumulative electron dose. Specifically, as shown by (1) in FIG. 28, a crystal part of approximately 1.2 nm at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 28, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a desired composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, a microcrystalline oxide semiconductor, and a CAAC-OS, for example.

The semiconductor device of one embodiment of the present invention can be formed using an oxide semiconductor film having any of the above structures.

The structure and method described in this embodiment can be implemented by being combined as appropriate with any of the other structures and methods described in the other embodiments.

Embodiment 4

In this embodiment, a display device that includes a semiconductor device of one embodiment of the present invention is described with reference to FIGS. 29A to 29C.

<4. Display Device>

The display device illustrated in FIG. 29A includes a region including pixels of display elements (hereinafter the region is referred to as a pixel portion 502), a circuit portion provided outside the pixel portion 502 and including a circuit for driving the pixels (hereinafter the portion is referred to as a driver circuit portion 504), circuits each having a function of protecting an element (hereinafter the circuits are referred to as protection circuits 506), and a terminal portion 507. Note that the protection circuits 506 are not necessarily provided.

A part or the whole of the driver circuit portion 504 is preferably formed over a substrate over which the pixel portion 502 is formed, in which case the number of components and the number of terminals can be reduced. When a part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, such wirings are referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, the gate driver 504a can supply another signal.

The source driver 504b includes a shift register or the like. The source driver 504b receives a signal (video signal) from which a data signal is derived, as well as a signal for driving the shift register, through the terminal portion 507. The source driver 504b has a function of generating a data signal to be written to the pixel circuit 501 which is based on the video signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter such wirings are referred to as data lines DL_1 to DL_Y). Alternatively, the source driver 504b has a function of supplying an initialization signal. Without being limited thereto, the source driver 504b can supply another signal.

The source driver 504b includes a plurality of analog switches or the like, for example. The source driver 504b can output, as the data signals, signals obtained by time-dividing the video signal by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504a. For example, to the pixel circuit 501 in the m-th row and the n-th column (m is a natural number of less than or equal to X, and n is a natural number of less than or equal to Y), a pulse signal is input from the gate driver 504a through the scan line GL_m, and a data signal is input from the source driver 504b through the data line DL_n in accordance with the potential of the scan line GL_m.

Figure 29A:
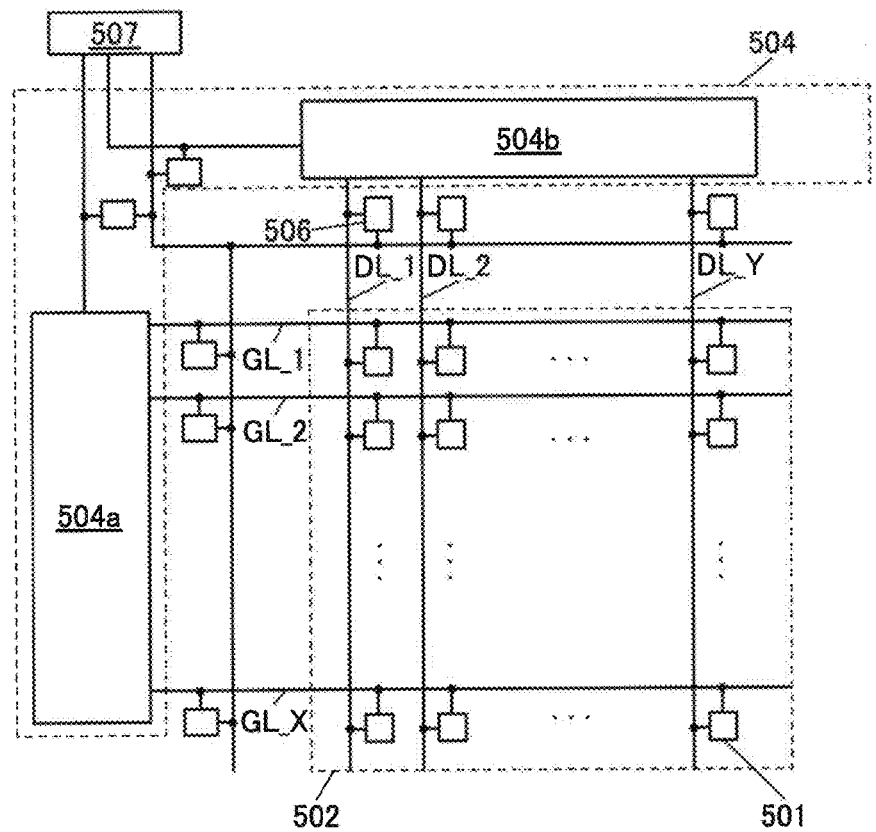
FIGS. 29A to 29C are a block diagram and circuit diagrams illustrating a display device.

The protection circuit 506 shown in FIG. 29A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 means a portion having terminals for inputting power, control signals, and video signals to the display device from external circuits.

The protection circuit 506 is a circuit that electrically connects a wiring connected to the protection circuit to another wiring when a potential out of a certain range is applied to the wiring connected to the protection circuit.

As illustrated in FIG. 29A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 504a or the protection circuit 506 may be configured to be connected to the source driver 504b. Alternatively, the protection circuit 506 may be configured to be connected to the terminal portion 507.

In FIG. 29A, an example in which the driver circuit portion 504 includes the gate driver 504a and the source driver 504b is shown; however, the structure is not limited thereto. For example, only the gate driver 504a may be formed and a separately prepared substrate where a source driver circuit is formed (e.g., a driver circuit substrate formed with a single crystal semiconductor film or a polycrystalline semiconductor film) may be mounted.

Figure 29B:
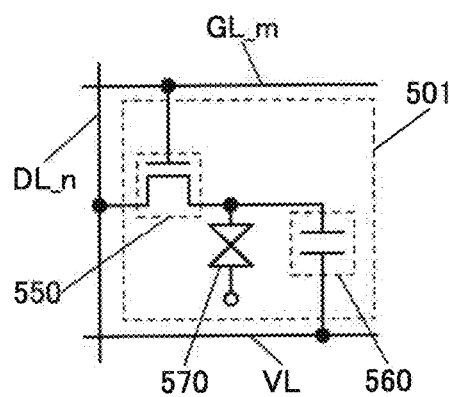

Each of the plurality of pixel circuits 501 in FIG. 29A can have the structure illustrated in FIG. 29B, for example.

The pixel circuit 501 illustrated in FIG. 29B includes a liquid crystal element 570, a transistor 550, and a capacitor 560. As the transistor 550, any of the transistors described in the above embodiments can be used.

Figure 46:
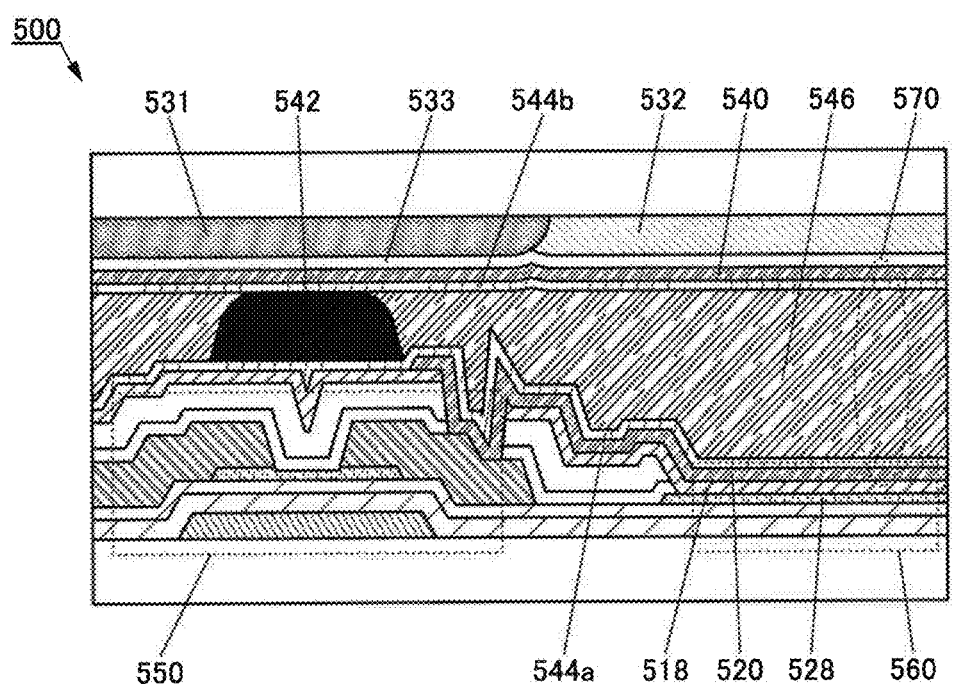
FIG. 46 is a cross-sectional view illustrating an example of a display device.

Here, a structure in which the transistor 200 illustrated in FIGS. 11A to 11C is used as the transistor 550 illustrated in FIG. 29B and an oxide conductive film is used as one electrode of the capacitor 560 illustrated in FIG. 29B will be described with reference to FIG. 46. FIG. 46 is a cross-sectional view illustrating an example of a display device.

A display device 500 illustrated in FIG. 46 includes the liquid crystal element 570, the transistor 550, and the capacitor 560. A conductive film 520 functioning as a pixel electrode is electrically connected to one of a source electrode and a drain electrode of the transistor 550. One electrode of the capacitor 560 is an oxide conductive film 528 formed by processing the same oxide semiconductor film as the oxide semiconductor film of the transistor 550, and the other electrode of the capacitor 560 is the conductive film 520 functioning as a pixel electrode. Furthermore, the capacitor 560 includes a nitride insulating film 518 between the oxide conductive film 528 and the conductive film 520. The nitride insulating film 518 has a function of a protective film for the transistor 550 and a dielectric layer of the capacitor 560.

The oxide conductive film 528 is formed by processing the same oxide semiconductor film as the oxide semiconductor film of the transistor 550. Hydrogen is supplied from the nitride insulating film 518 in contact with the oxide conductive film 528 to increase the conductivity of the oxide semiconductor film. As a result, the oxide conductive film 528 can function as one electrode of the capacitor 560.

Moreover, the liquid crystal element 570 includes the conductive film 520, a liquid crystal layer 546, and a conductive film 540. An alignment film 544a is provided between the conductive film 520 and the liquid crystal layer 546, and an alignment film 544b is provided between the conductive film 540 and the liquid crystal layer 546. An insulating film 533, a light-blocking layer 531, a coloring layer 532, and the like are provided over the conductive film 540. A spacer 542 that controls the thickness of the liquid crystal layer 546, i.e., the cell gap, is provided over the transistor 550. By an application of a voltage between the conductive film 520 that is one electrode of the liquid crystal element 570 and the conductive film 540 that is the other electrode of the liquid crystal element 570, the alignment state of the liquid crystal layer 546 can be changed.

The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. Furthermore, the potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

As a driving method of the display device including the liquid crystal element 570, any of the following modes can be used, for example: a twisted nematic (TN) mode, a super-twisted nematic (STN) mode, a vertical alignment (VA) mode, a multi-domain vertical alignment (MVA) mode, a patterned vertical alignment (PVA) mode, an in-plane-switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, an FFS mode, a transverse bend alignment (TBA) mode, and the like.

Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the scan line GL_m. The transistor 550 has a function of controlling whether to write a data signal by being turned on or off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 functions as a storage capacitor for storing written data.

For example, in the display device including the pixel circuit 501 in FIG. 29B, the pixel circuits 501 are sequentially selected row by row by the gate driver 504*a* illustrated in FIG. 29A, whereby the transistors 550 are turned on and a data signal is written.

When the transistors 550 are turned off, the pixel circuits 501 in which the data has been written are brought into a holding state. This operation is sequentially performed row by row; thus, an image can be displayed.

Figure 29C:
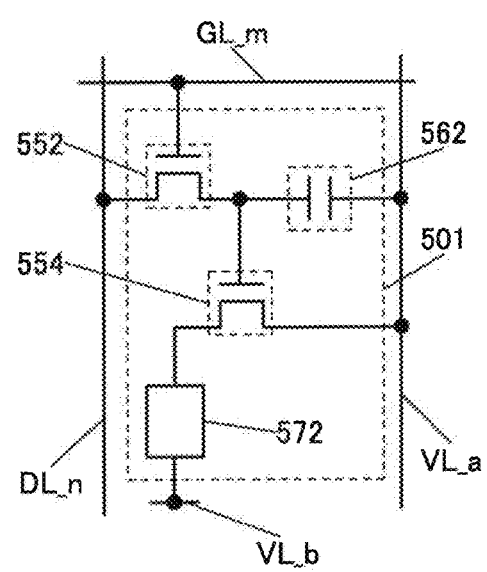

Alternatively, each of the plurality of pixel circuits 501 in FIG. 29A can have the structure illustrated in FIG. 29C, for example.

The pixel circuit 501 illustrated in FIG. 29C includes transistors 552 and 554, a capacitor 562, and a light-emitting element 572. Any of the transistors described in the above embodiments can be used as one or both of the transistors 552 and 554.

One of a source electrode and a drain electrode of the transistor 552 is electrically connected to a wiring to which a data signal is supplied (hereinafter referred to as a signal line DL_n). A gate electrode of the transistor 552 is electrically connected to a wiring to which a gate signal is supplied (hereinafter referred to as a scan line GL_m).

The transistor 552 has a function of controlling whether to write a data signal by being turned on or off.

One of a pair of electrodes of the capacitor 562 is electrically connected to a wiring to which a potential is supplied (hereinafter referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) or the like can be used, for example. Note that the light-emitting element 572 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other.

For example, in the display device including the pixel circuit 501 in FIG. 29C, the pixel circuits 501 are sequentially selected row by row by the gate driver 504*a* illustrated in FIG. 29A, whereby the transistors 552 are turned on and a data signal is written.

When the transistors 552 are turned off, the pixel circuits 501 in which the data has been written are brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

Although the structures including the liquid crystal element 570 or the light-emitting element 572 as a display element of the display device are described in this embodiment, one embodiment of the present invention is not limited to these structures and a variety of elements may be included in the display device.

For example, the display device may include a display medium whose contrast, luminance, reflectivity, transmittance, or the like is changed by electrical or magnetic effect, such as a liquid crystal element, an EL element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, and a display element using a carbon nanotube. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

A progressive type display, an interlace type display, or the like can be employed as the display type of the display device of this embodiment. Further, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Further, the size of a display region may be different depending on respective dots of the color elements. Embodiments of the disclosed invention are not limited to a display device for color display; the disclosed invention can also be applied to a display device for monochrome display.

White light (W) may be emitted from a backlight (e.g., an organic EL element, an inorganic EL element, an LED, or a fluorescent lamp) in the display device. Furthermore, a coloring layer (also referred to as a color filter) may be provided in the display device. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using self-luminous elements such as organic EL elements or inorganic EL elements, the elements may emit light of their respective colors R, G, B, Y, and W. By using self-luminous elements, power consumption can be further reduced as compared to the case of using the coloring layer in some cases.

The structures described in this embodiment can be used in appropriate combination with any of the structures described in the other embodiments.

Embodiment 5

In this embodiment, a display device including a semiconductor device of one embodiment of the present invention and an electronic device in which the display device is provided with an input device will be described with reference to FIGS. 30A and 30B, FIGS. 31A and 31B, FIG. 32, FIGS. 33A and 33B, FIGS. 34A and 34B, and FIG. 35.

<5-1. Touch Panel>

In this embodiment, a touch panel 2000 including a display device and an input device will be described as an example of an electronic device. In addition, an example in which a touch sensor is used as an input device will be described.

Figure 30A:
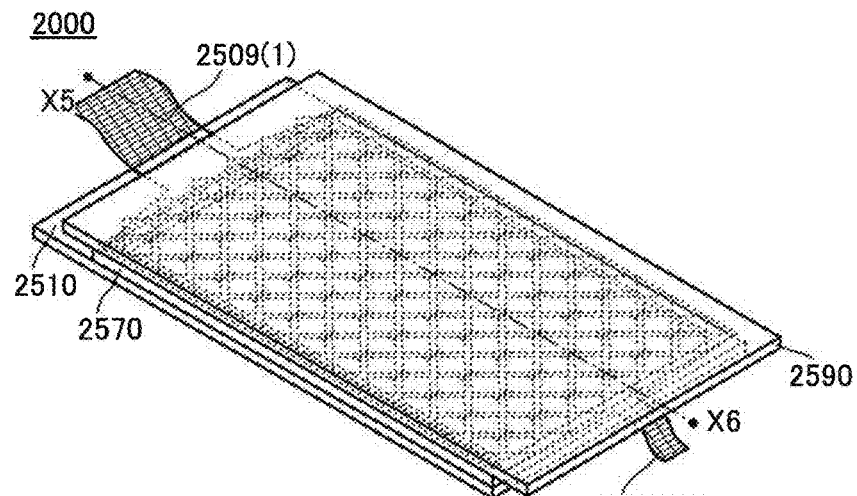
FIGS. 30A and 30B are perspective views illustrating an example of a touch panel.
Figure 30B:
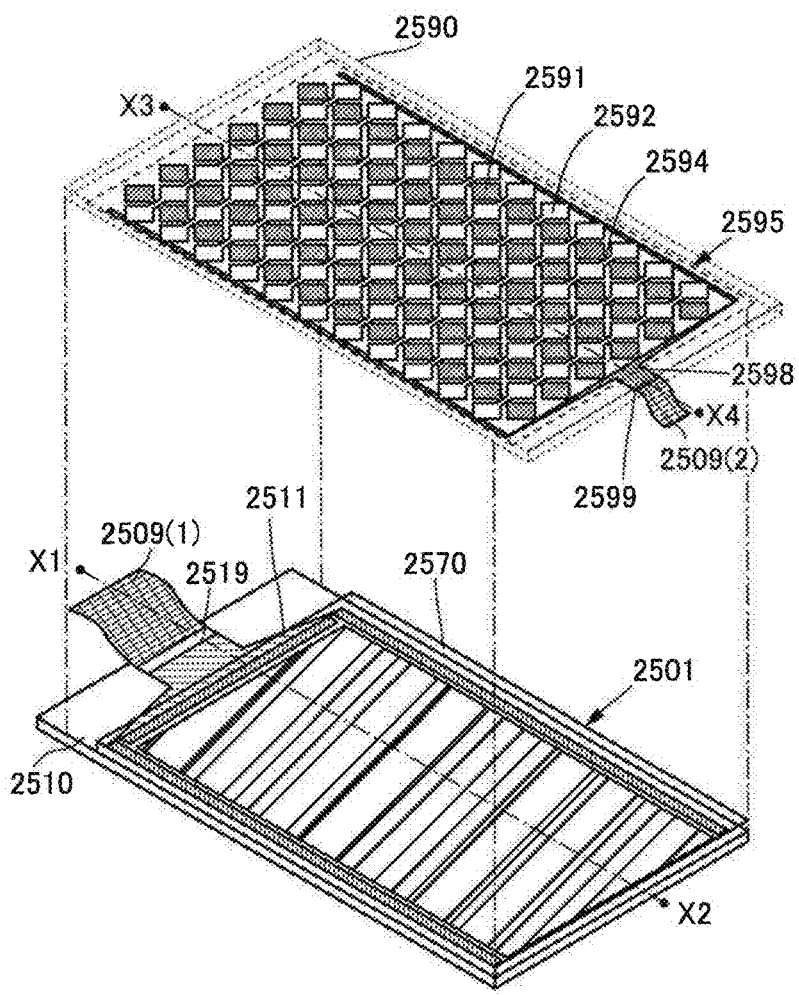

FIGS. 30A and 30B are perspective views of the touch panel 2000. Note that FIGS. 30A and 30B illustrate only main components of the touch panel 2000 for simplicity.

The touch panel 2000 includes a display device 2501 and a touch sensor 2595 (see FIG. 30B). The touch panel 2000 also includes a substrate 2510, a substrate 2570, and substrate 2590. The substrate 2510, the substrate 2570, and the substrate 2590 each have flexibility. Note that one or all of the substrates 2510, 2570, and 2590 may be inflexible.

The display device 2501 includes a plurality of pixels over the substrate 2510 and a plurality of wirings 2511 through which signals are supplied to the pixels. The plurality of wirings 2511 are led to a peripheral portion of the substrate 2510, and parts of the plurality of wirings 2511 form a terminal 2519. The terminal 2519 is electrically connected to an FPC 2509(1).

The substrate 2590 includes the touch sensor 2595 and a plurality of wirings 2598 electrically connected to the touch sensor 2595. The plurality of wirings 2598 are led to a peripheral portion of the substrate 2590, and parts of the plurality of wirings 2598 form a terminal. The terminal is electrically connected to an FPC 2509(2). Note that in FIG. 30B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

Note that the touch sensor 2595 illustrated in FIG. 30B is an example of using a projected capacitive touch sensor.

Note that a variety of sensors that can sense proximity or touch of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 30A and 30B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

Note that as a material of the conductive films such as the electrodes 2591, the electrodes 2592, and the wirings 2598, that is, wirings and electrodes forming the touch panel, a transparent conductive film including indium oxide, tin oxide, zinc oxide, or the like (e.g., ITO) can be given. For example, a low-resistance material is preferably used as a material that can be used as the wirings and electrodes forming the touch panel. For example, silver, copper, aluminum, a carbon nanotube, graphene, or a metal halide (such as a silver halide) may be used. Alternatively, a metal nanowire including a plurality of conductors with an extremely small width (for example, a diameter of several nanometers) may be used. Further alternatively, a net-like metal mesh with a conductor may be used. For example, an Ag nanowire, a Cu nanowire, an Al nanowire, an Ag mesh, a Cu mesh, or an Al mesh may be used. For example, in the case of using an Ag nanowire as the wirings and electrodes forming the touch panel, a visible light transmittance of 89% or more and a sheet resistance of 40 $\Omega/cm^2$ or more and 100 $\Omega/cm^2$ or less can be achieved. Since the above-described metal nanowire, metal mesh, carbon nanotube, graphene, and the like, which are examples of the material that can be used as the wirings and electrodes forming the touch panel, have high visible light transmittances, they may be used as electrodes of display elements (e.g., a pixel electrode or a common electrode).

<5-2. Display Device>

Figure 31A:
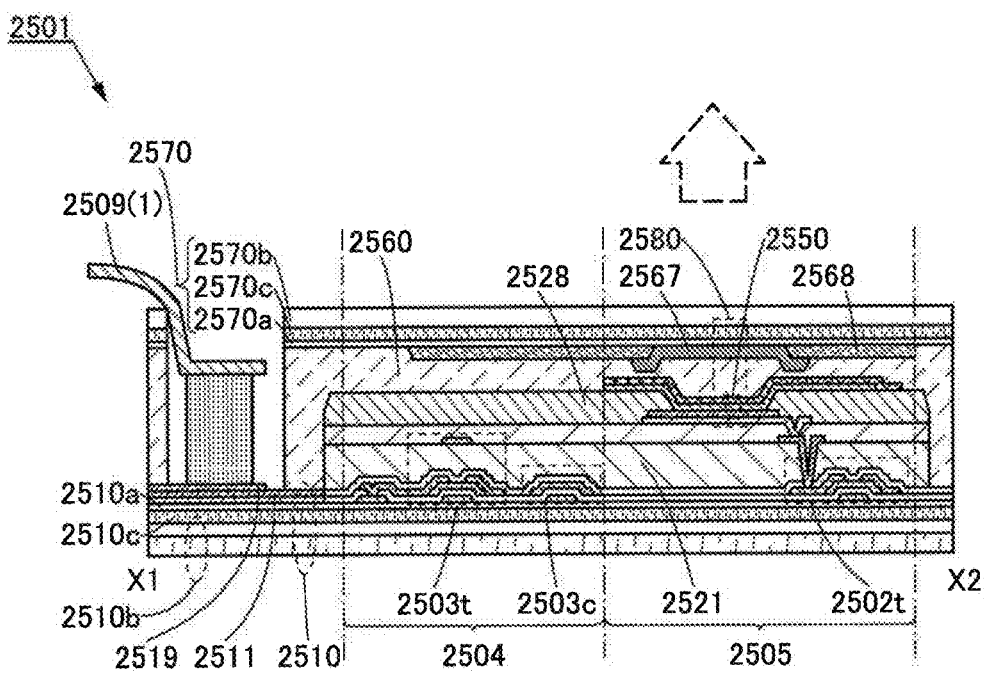
FIGS. 31A and 31B are cross-sectional views illustrating examples of a display device.
Figure 31B:
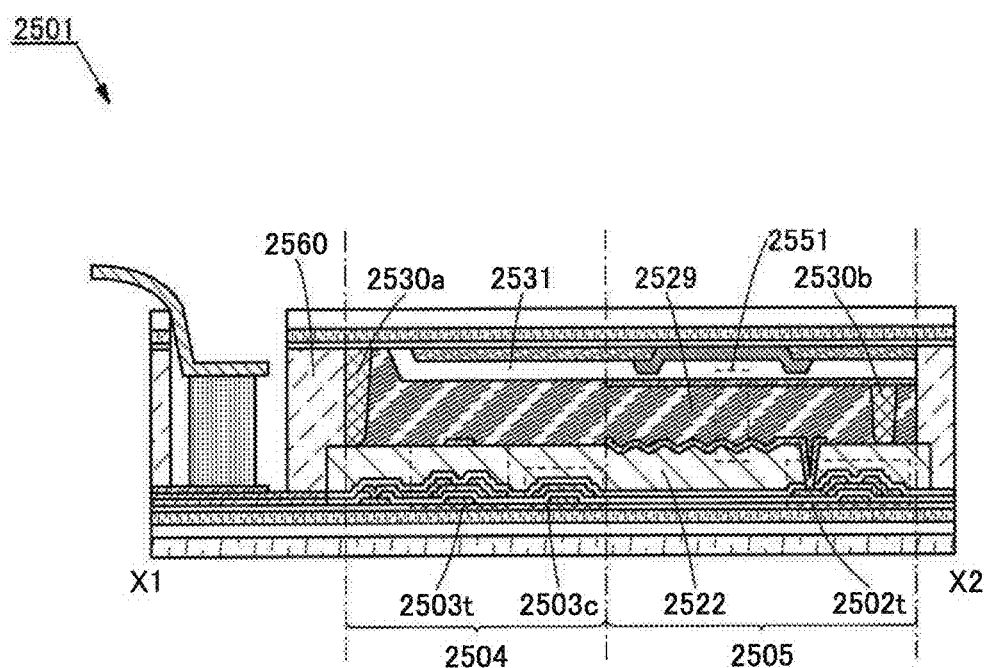

Next, the display device 2501 will be described in detail with reference to FIGS. 31A and 31B. FIGS. 31A and 31B correspond to cross-sectional views taken along dashed-dotted line X1-X2 in FIG. 30B.

The display device 2501 includes a plurality of pixels arranged in a matrix. Each of the pixels includes a display element and a pixel circuit for driving the display element. (Structure with an EL Element as a Display Element)

First, a structure that uses an EL element as a display element will be described below with reference to FIG. 31A. In the following description, an example of using an EL element that emits white light will be described; however, the EL element is not limited to this element. For example, EL elements that emit light of different colors may be included so that the light of different colors can be emitted from adjacent pixels.

For the substrate 2510 and the substrate 2570, for example, a flexible material with a vapor permeability of lower than or equal to $10^{-5}$ g/(m²·day), preferably lower than or equal to $10^{-6}$ g/(m²·day) can be favorably used. Alternatively, materials whose thermal expansion coefficients are substantially equal to each other are preferably used for the substrate 2510 and the substrate 2570. For example, the coefficients of linear expansion of the materials are preferably lower than or equal to $1 \times 10^{-3}$/K, further preferably lower than or equal to $5 \times 10^{-5}$/K, and still further preferably lower than or equal to $1 \times 10^{-5}$/K.

Note that the substrate 2510 is a stacked body including an insulating layer 2510a for preventing impurity diffusion into the EL element, a flexible substrate 2510b, and an adhesive layer 2510c for attaching the insulating layer 2510a and the flexible substrate 2510b to each other. The substrate 2570 is a stacked body including an insulating layer 2570a for preventing impurity diffusion into the EL element, a flexible substrate 2570b, and an adhesive layer 2570c for attaching the insulating layer 2570a and the flexible substrate 2570b to each other.

For the adhesive layer 2510c and the adhesive layer 2570c, for example, materials that include polyester, polyolefin, polyamide (e.g., nylon, aramid), polyimide, polycarbonate, polyurethane, an acrylic resin, an epoxy resin, or a resin having a siloxane bond can be used.

A sealing layer 2560 is provided between the substrate 2510 and the substrate 2570. The sealing layer 2560 preferably has a refractive index higher than that of air. In the case where light is extracted to the sealing layer 2560 side as illustrated in FIG. 31A, the sealing layer 2560 can also serve as an optical layer.

A sealant may be formed in the peripheral portion of the sealing layer 2560. With the use of the sealant, an EL element 2550 can be provided in a region surrounded by the substrate 2510, the substrate 2570, the sealing layer 2560, and the sealant. Note that an inert gas (such as nitrogen or argon) may be used instead of the sealing layer 2560. A drying agent may be provided in the inert gas so as to adsorb moisture or the like. For example, an epoxy-based resin or a glass frit is preferably used as the sealant. As a material used for the sealant, a material which is impermeable to moisture or oxygen is preferably used.

The display device 2501 illustrated in FIG. 31A includes a pixel 2505. The pixel 2505 includes a light-emitting module 2580, the EL element 2550 and a transistor 2502t that can supply electric power to the EL element 2550. Note that the transistor 2502t functions as part of the pixel circuit.

The light-emitting module 2580 includes the EL element 2550 and a coloring layer 2567. The EL element 2550 includes a lower electrode, an upper electrode, and an EL layer between the lower electrode and the upper electrode.

In the case where the sealing layer 2560 is provided on the light extraction side, the sealing layer 2560 is in contact with the EL element 2550 and the coloring layer 2567.

The coloring layer 2567 is positioned in a region overlapping with the EL element 2550. Accordingly, part of light emitted from the EL element 2550 passes through the coloring layer 2567 and is emitted to the outside of the light-emitting module 2580 as indicated by an arrow in FIG. 31A.

The display device 2501 includes a light-blocking layer 2568 on the light extraction side. The light-blocking layer 2568 is provided so as to surround the coloring layer 2567.

The coloring layer 2567 is a coloring layer having a function of transmitting light in a particular wavelength region. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an inkjet method, an etching method using a photolithography technique, or the like.

An insulating layer 2521 is provided in the display device 2501. The insulating layer 2521 covers the transistor 2502t and the like. Note that the insulating layer 2521 has a function of covering the roughness caused by the pixel circuit to provide a flat surface. The insulating layer 2521 may have a function of suppressing impurity diffusion. This can prevent the reliability of the transistor 2502t or the like from being lowered by impurity diffusion.

The EL element 2550 is formed over the insulating layer 2521. A partition 2528 is provided so as to overlap with an end portion of the lower electrode of the EL element 2550. Note that a spacer for controlling the distance between the substrate 2510 and the substrate 2570 may be formed over the partition 2528.

A scan line driver circuit 2504 includes a transistor 2503t and a capacitor 2503c. Note that the driver circuit can be formed in the same process and over the same substrate as those of the pixel circuits.

The wirings 2511 through which signals can be supplied are provided over the substrate 2510. The terminal 2519 is provided over the wirings 2511. The FPC 2509(1) is electrically connected to the terminal 2519. The FPC 2509(1) has a function of supplying a video signal, a clock signal, a start signal, a reset signal, or the like. Note that the FPC 2509(1) may be provided with a printed wiring board (PWB).

Any of the transistors described in the above embodiments may be used as one or both of the transistors 2502t and 2503t. The transistors used in this embodiment each include an oxide semiconductor film which is highly purified and in which formation of oxygen vacancies is suppressed. In the transistors, the current in an off state (off-state current) can be made small. Accordingly, an electrical signal such as an image signal can be held for a longer period, and a writing interval can be set longer in an on state. Accordingly, the frequency of refresh operation can be reduced, which leads to an effect of suppressing power consumption. In addition, the transistors used in this embodiment can have relatively high field-effect mobility and thus are capable of high speed operation. For example, with such transistors which can operate at high speed used for the display device 2501, a switching transistor of a pixel circuit and a driver transistor in a driver circuit portion can be formed over one substrate. That is, a semiconductor device formed using a silicon wafer or the like is not additionally needed as a driver circuit, by which the number of components of the semiconductor device can be reduced. In addition, by using a transistor which can operate at high speed in a pixel circuit, a high-quality image can be provided.

(Structure with a Liquid Crystal Element as a Display Element)

Next, a structure including a liquid crystal element as a display element is described below with reference to FIG. 31B. In the description below, a reflective liquid crystal display device that performs display by reflecting external light is described; however, one embodiment of the present invention is not limited to this type of liquid crystal display device. For example, a light source (e.g., a back light or a side light) may be provided to form a transmissive liquid crystal display device or a transflective liquid crystal display device.

The display device 2501 illustrated in FIG. 31B has the same structure as the display device 2501 illustrated in FIG. 31A except the following points.

The pixel 2505 in the display device 2501 illustrated in FIG. 31B includes a liquid crystal element 2551 and the transistor 2502t that can supply electric power to the liquid crystal element 2551.

The liquid crystal element 2551 includes a lower electrode (also referred to as a pixel electrode), an upper electrode, and a liquid crystal layer 2529 between the lower electrode and the upper electrode. By the application of a voltage between the lower electrode and the upper electrode, the alignment state of the liquid crystal layer 2529 in the liquid crystal element 2551 can be changed. Furthermore, in the liquid crystal layer 2529, a spacer 2530a and a spacer 2530b are provided. Although not illustrated in FIG. 31B, an alignment film may be provided on each of the upper electrode and the lower electrode on the side in contact with the liquid crystal layer 2529.

As the liquid crystal layer 2529, thermotropic liquid crystal, low-molecular liquid crystal, high-molecular liquid crystal, polymer dispersed liquid crystal, ferroelectric liquid crystal, or anti-ferroelectric liquid crystal can be used. Such a liquid crystal material exhibits a cholesteric phase, a smectic phase, a cubic phase, a chiral nematic phase, an isotropic phase, or the like depending on conditions. In the case of employing a horizontal electric field mode liquid crystal display device, liquid crystal exhibiting a blue phase for which an alignment film is unnecessary may be used. In the case where a liquid crystal exhibiting a blue phase is used, an alignment film is not necessarily provided, so that rubbing treatment is also unnecessary. Accordingly, electrostatic discharge damage caused by the rubbing treatment can be prevented and defects and damage of the liquid crystal display device in the manufacturing process can be reduced.

The spacers 2530a and 2530b are formed by selectively etching an insulating film. The spacers 2530a and 2530b are provided in order to control the distance between the substrate 2510 and the substrate 2570 (the cell gap). Note that the spacers 2530a and 2530b may have different sizes from each other and are preferably have a columnar or spherical shape. Although the spacers 2530a and 2530b are provided on the substrate 2570 side in the non-limiting structure in FIG. 31B, they may be provided on the substrate 2510 side.

The upper electrode of the liquid crystal element 2551 is provided on the substrate 2570 side. An insulating layer 2531 is provided between the upper electrode and the coloring layer 2567 and the light-blocking layer 2568. The insulating layer 2531 has a function of covering the roughness caused by the coloring layer 2567 and the light-blocking layer 2568 to provide a flat surface. As the insulating layer 2531, an organic resin film may be used, for example. The lower electrode of the liquid crystal element 2551 has a function of a reflective electrode. The display device 2501 illustrated in FIG. 31B is of a reflective type which performs display by reflecting external light at the lower electrode and making the light pass through the coloring layer 2567. Note that in the case of forming a transmissive liquid crystal display device, a transparent electrode is provided as the lower electrode.

The display device 2501 illustrated in FIG. 31B includes an insulating layer 2522. The insulating layer 2522 covers the transistor 2502t and the like. The insulating layer 2522 has a function of covering the roughness caused by the pixel circuit to provide a flat surface and a function of forming roughness on the lower electrode of the liquid crystal element. In this way, roughness can be formed on the surface of the lower electrode. Therefore, when external light is incident on the lower electrode, the light is reflected diffusely at the surface of the lower electrode, whereby visibility can be improved. Note that in the case of forming a transmissive liquid crystal display device, a structure without such roughness may be employed.

<5-3. Touch Sensor>

Figure 32:
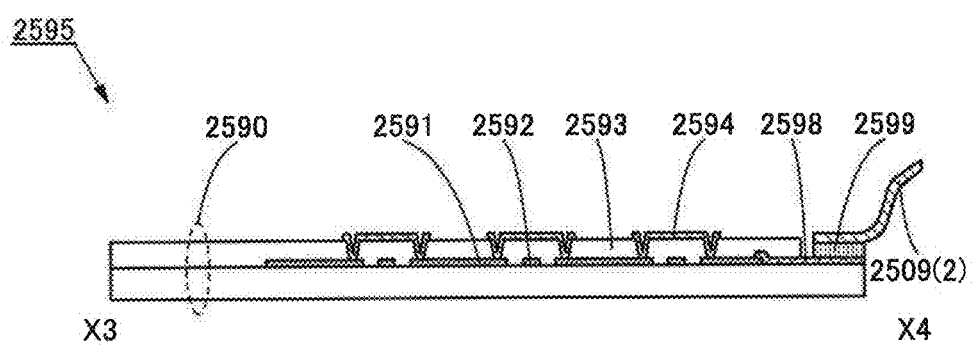
FIG. 32 is a cross-sectional view illustrating an example of a touch sensor.

Next, the touch sensor 2595 will be described in detail with reference to FIG. 32. FIG. 32 corresponds to a cross-sectional view taken along dashed-dotted line X3-X4 in FIG. 30B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various patterning techniques such as photolithography.

Examples of a material for the insulating layer 2593 are a resin such as an acrylic resin or an epoxy resin, a resin having a siloxane bond, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be favorably used as the wiring 2594 because the aperture ratio of the touch panel can be increased. Moreover, a material with higher conductivity than the conductivities of the electrodes 2591 and 2592 can be favorably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

<5-4. Touch Panel>

Figure 33A:
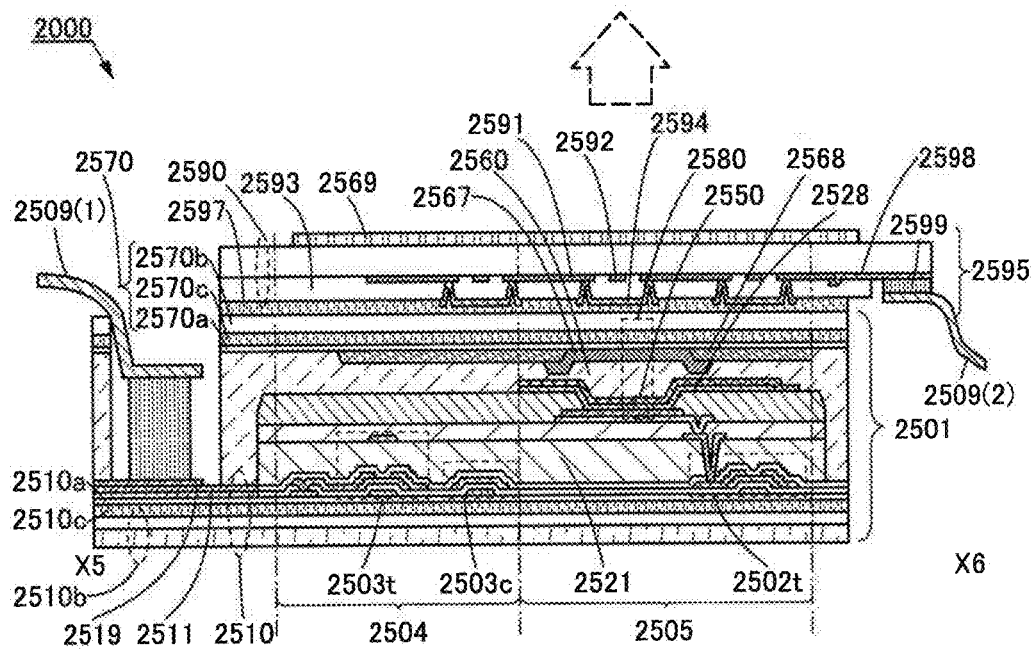
FIGS. 33A and 33B are cross-sectional views illustrating examples of a touch panel.

Next, the touch panel 2000 will be described in detail with reference to FIG. 33A. FIG. 33A corresponds to a cross-sectional view taken along dashed-dotted line X5-X6 in FIG. 30A.

In the touch panel 2000 illustrated in FIG. 33A, the display device 2501 described with reference to FIG. 31A and the touch sensor 2595 described with reference to FIG. 32 are attached to each other.

The touch panel 2000 illustrated in FIG. 33A includes an adhesive layer 2597 and an anti-reflective layer 2569 in addition to the components described with reference to FIG. 31A.

The adhesive layer 2597 is provided in contact with the wiring 2594. Note that the adhesive layer 2597 attaches the substrate 2590 to the substrate 2570 so that the touch sensor 2595 overlaps with the display device 2501. The adhesive layer 2597 preferably has a light-transmitting property. A heat curable resin or an ultraviolet curable resin can be used for the adhesive layer 2597. For example, an acrylic resin, a urethane-based resin, an epoxy-based resin, or a siloxane-based resin can be used.

The anti-reflective layer 2569 is positioned in a region overlapping with pixels. As the anti-reflective layer 2569, a circularly polarizing plate can be used, for example.

Next, a touch panel having a structure different from that illustrated in FIG. 33A will be described with reference to FIG. 33B.

Figure 33B:
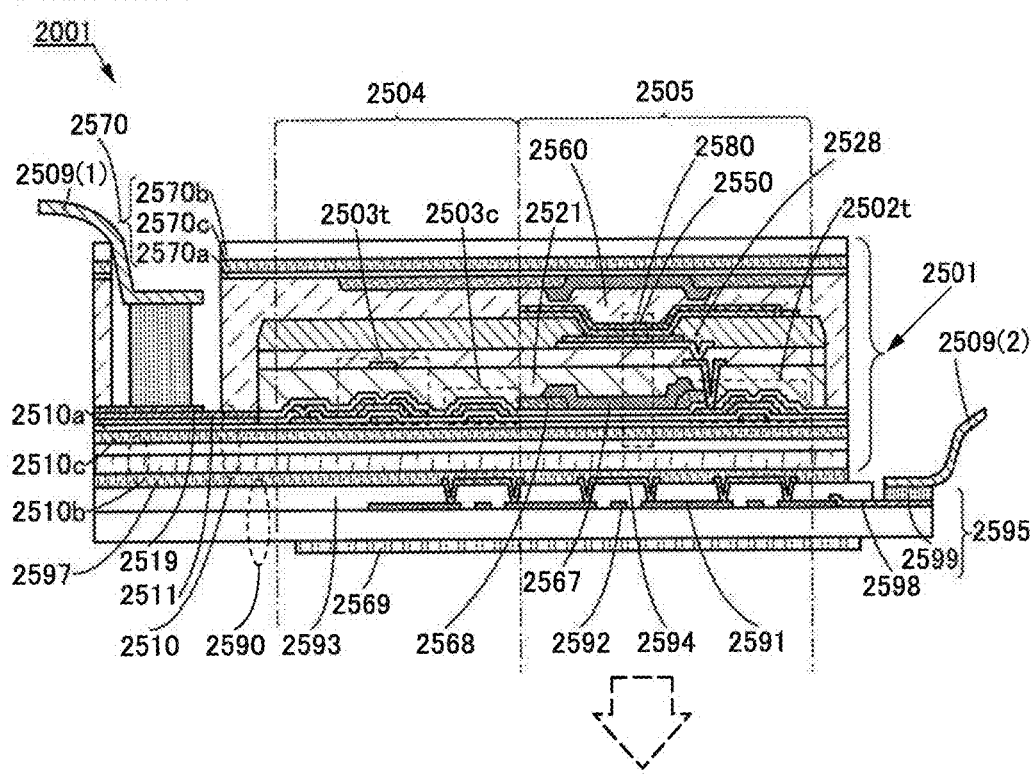

FIG. 33B is a cross-sectional view of a touch panel 2001. The touch panel 2001 illustrated in FIG. 33B differs from the touch panel 2000 illustrated in FIG. 33A in the position of the touch sensor 2595 relative to the display device 2501. Different parts are described in detail below, and the above description of the touch panel 2000 is referred to for the other similar parts.

The coloring layer 2567 is positioned under the EL element 2550. The EL element 2550 illustrated in FIG. 33B emits light to the side where the transistor 2502t is provided. Accordingly, part of light emitted from the EL element 2550 passes through the coloring layer 2567 and is emitted to the outside of the light-emitting module 2580 as indicated by an arrow in FIG. 33B.

The touch sensor 2595 is provided on the substrate 2510 side of the display device 2501.

The adhesive layer 2597 is provided between the substrate 2510 and the substrate 2590 and attaches the touch sensor 2595 to the display device 2501.

As illustrated in FIG. 33A or FIG. 33B, light may be emitted from the light-emitting element to one or both of upper and lower sides of the substrate.

<5-5. Driving Method of Touch Panel>

Next, an example of a method for driving a touch panel will be described with reference to FIGS. 34A and 34B.

Figure 34A:
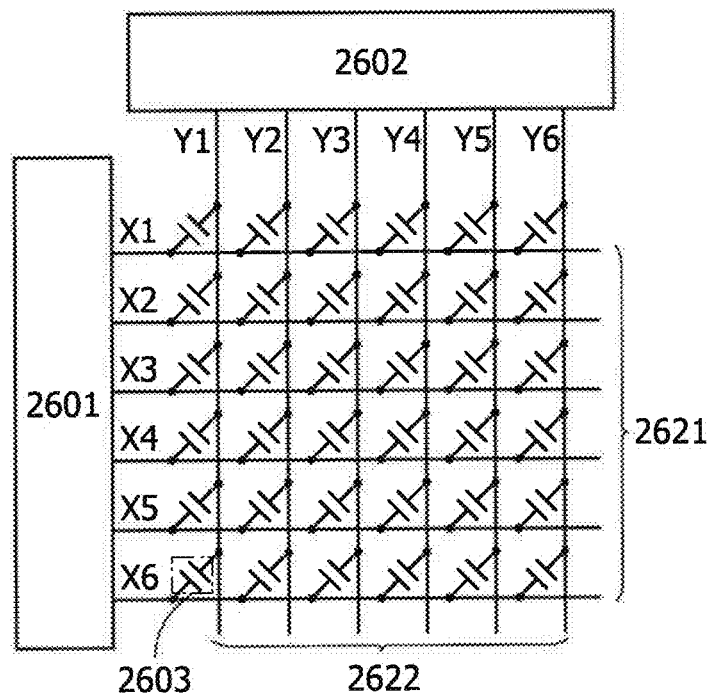
FIGS. 34A and 34B are a block diagram and a timing chart of a touch sensor.

FIG. 34A is a block diagram illustrating the structure of a mutual capacitive touch sensor. FIG. 34A illustrates a pulse voltage output circuit 2601 and a current sensing circuit 2602. Note that in FIG. 34A, six wirings X1 to X6 represent the electrodes 2621 to which a pulse voltage is applied, and six wirings Y1 to Y6 represent the electrodes 2622 that detect changes in current. FIG. 34A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 34B:
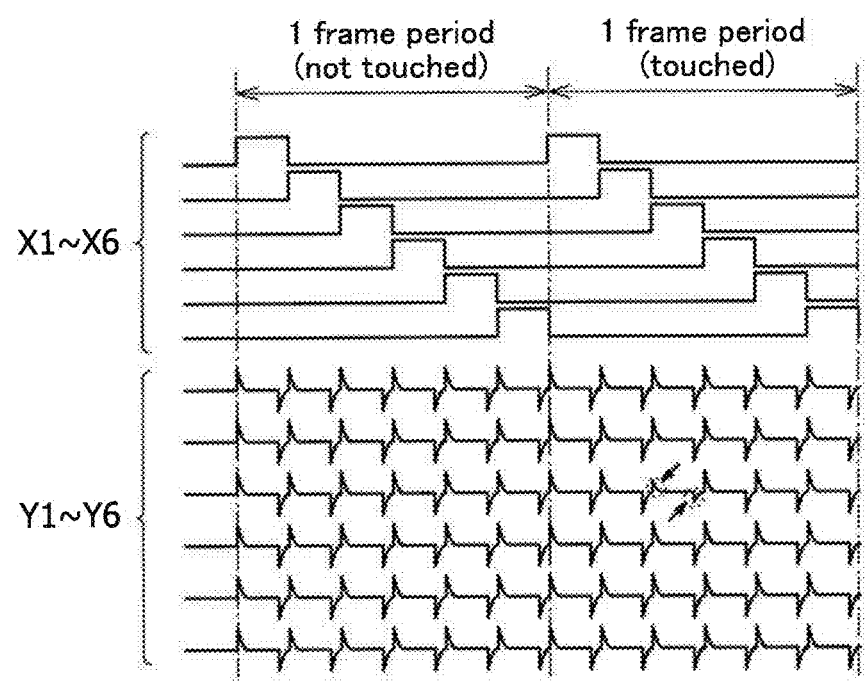

FIG. 34B is a timing chart showing input and output waveforms in the mutual capacitive touch sensor illustrated in FIG. 34A. In FIG. 34B, sensing of a sensing target is performed in all the rows and columns in one frame period. FIG. 34B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change in accordance with changes in the voltages of the wirings X1 to X6. The current value is decreased at the point of approach or contact of a sensing target and accordingly the waveform of the voltage value changes.

By detecting a change in mutual capacitance in this manner, the approach or contact of a sensing target can be sensed.

<5-6. Sensor Circuit>

Figure 35:
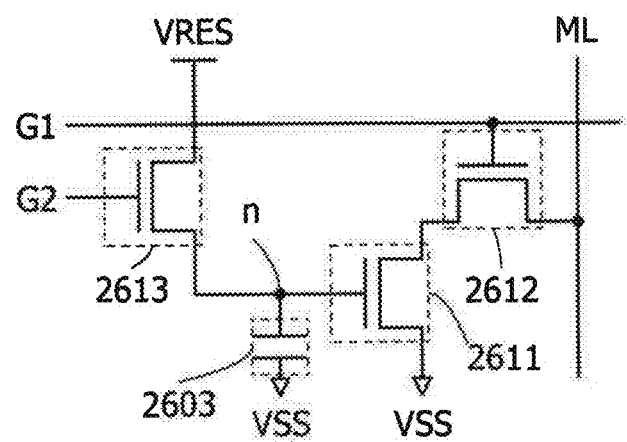
FIG. 35 is a circuit diagram of a touch sensor.

Although FIG. 34A illustrates a passive type touch sensor in which only the capacitor 2603 is provided at the intersection of wirings as a touch sensor, an active type touch sensor including a transistor and a capacitor may be used. FIG. 35 illustrates an example of a sensor circuit included in an active type touch sensor.

The sensor circuit in FIG. 35 includes the capacitor 2603 and transistors 2611, 2612, and 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 35 will be described. First, a potential for turning on the transistor 2613 is supplied as the signal G2, and a potential with respect to the voltage VRES is thus applied to the node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, any of the transistors described in the above embodiments can be used. In particular, it is preferable to use any of the transistors described in the above embodiments as the transistor 2613 because the potential of the node n can be held for a long time and the frequency of operation of resupplying VRES to the node n (refresh operation) can be reduced.

The structures described in this embodiment can be used in appropriate combination with any of the structures described in the other embodiments.

Embodiment 6

In this embodiment, a display module and electronic devices that include a semiconductor device of one embodiment of the present invention are described with reference to FIG. 36 and FIGS. 37A to 37G.

<6-1. Display Module>

Figure 36:
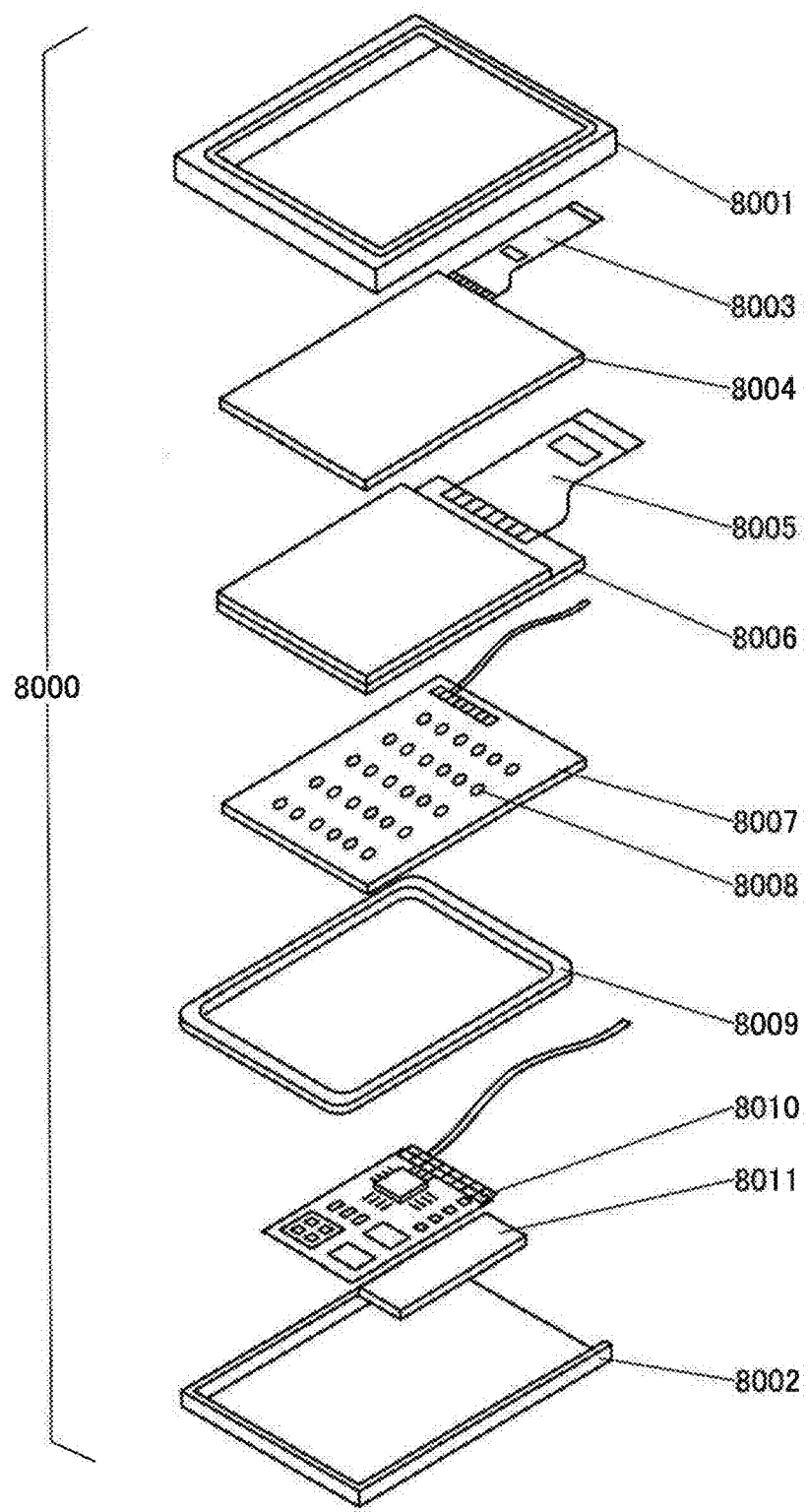
FIG. 36 illustrates a display module.

In a display module 8000 illustrated in FIG. 36, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap the display panel 8006. A counter substrate (sealing substrate) of the display panel 8006 can have a touch panel function. A photosensor may be provided in each pixel of the display panel 8006 to form an optical touch panel.

The backlight 8007 includes light sources 8008. Note that although a structure in which the light sources 8008 are provided over the backlight 8007 is illustrated in FIG. 36, one embodiment of the present invention is not limited to this structure. For example, a structure in which the light sources 8008 are provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

<6-2. Electronic Device>

FIGS. 37A to 37G illustrate electronic devices. These electronic devices can each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The electronic devices illustrated in FIGS. 37A to 37G can have a variety of functions, for example, a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting and receiving a variety of data with a wireless communication function, a function of reading a program or data stored in a storage medium and displaying the program or data on the display portion, and the like. Note that functions of the electronic devices illustrated in FIGS. 37A to 37G are not limited thereto, and the electronic devices can have a variety of functions. Although not illustrated in FIGS. 37A to 37G, the electronic devices may each have a plurality of display portions. The electronic devices may each have a camera or the like and a function of taking a still image, a function of taking a moving image, a function of storing the taken image in a storage medium (an external storage medium or a storage medium incorporated in the camera), a function of displaying the taken image on the display portion, and the like.

The electronic devices illustrated in FIGS. 37A to 37G will be described in detail below.

Figure 37A:
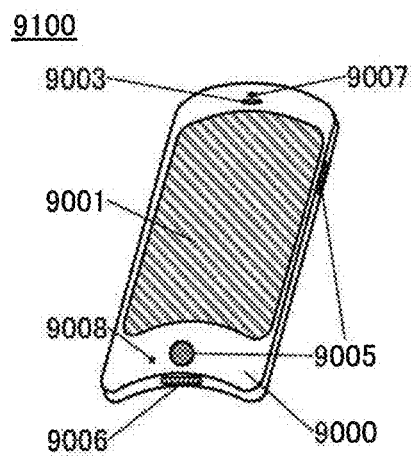
FIGS. 37A to 37G each illustrate an electronic device.

FIG. 37A is a perspective view of a portable information terminal 9100. The display portion 9001 of the portable information terminal 9100 is flexible and thus can be incorporated along the curved surface of the housing 9000. Furthermore, the display portion 9001 includes a touch sensor, and operation can be performed by touching a screen with a finger, a stylus, or the like. For example, by touching an icon displayed on the display portion 9001, an application can be started.

Figure 37D:
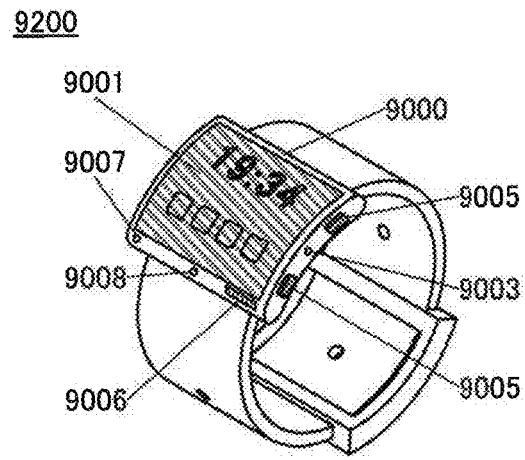
Figure 37B:
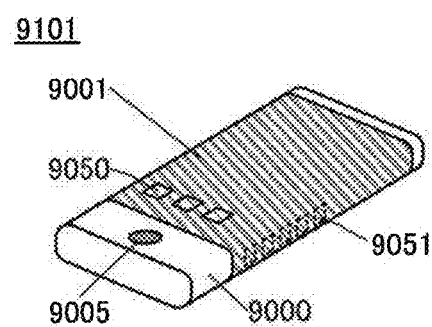

FIG. 37B is a perspective view of a portable information terminal 9101. The portable information terminal 9101 functions as, for example, one or more of a telephone set, a notebook, an information browsing system, and the like. Specifically, the portable information terminal 9101 can be used as a smartphone. Note that the speaker 9003, the connection terminal 9006, the sensor 9007, and the like, which are not illustrated in FIG. 37B, can be positioned in the portable information terminal 9101 as in the portable information terminal 9100 illustrated in FIG. 37A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include notification from a social networking service (SNS), display indicating reception of an e-mail or an incoming call, the title of the e-mail, the SNS, or the like, the sender of the e-mail, the SNS, or the like, the date, the time, remaining battery, and the reception strength of an antenna. Instead of the information 9051, the operation buttons 9050 or the like may be displayed in the position where the information 9051 is displayed.

Figure 37E:
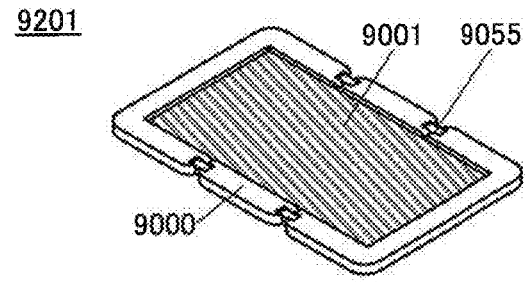
Figure 37C:
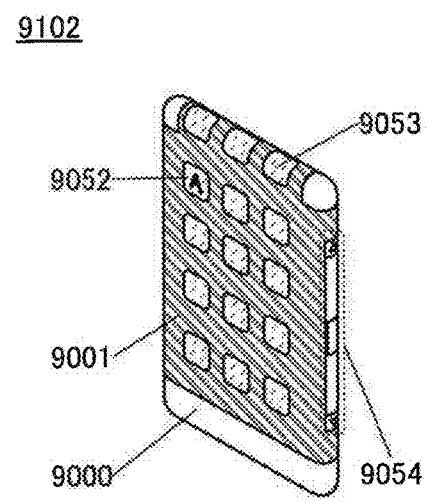

FIG. 37C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in the position that can be seen from above the portable information terminal 9102. Thus, the user can see the display without taking out the portable information terminal 9102 from the pocket and decide whether to answer the call.

FIG. 37D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is curved, and images can be displayed on the curved display surface. The portable information terminal 9200 can employ near field communication conformable to a communication standard. For example, hands-free calling can be achieved with mutual communication between the portable information terminal 9200 and a headset capable of wireless communication. Moreover, the portable information terminal 9200 includes the connection terminal 9006, and data can be directly transmitted to and received from another information terminal via a connector. Charging through the connection terminal 9006 is also possible. Note that the charging operation may be performed by wireless power feeding without using the connection terminal 9006.

Figure 37F:
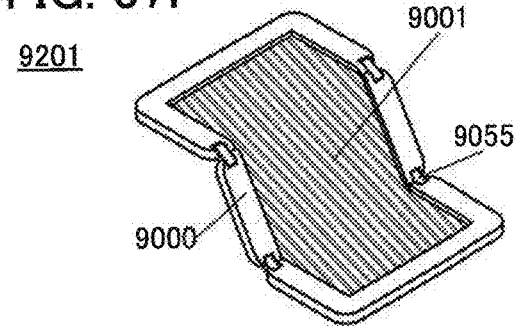
Figure 37G:
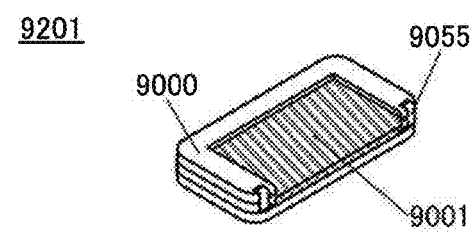

FIGS. 37E, 37F, and 37G are perspective views of a foldable portable information terminal 9201 that is opened, that is shifted from the opened state to the folded state or from the folded state to the opened state, and that is folded, respectively. The portable information terminal 9201 is highly portable when folded. When the portable information terminal 9201 is opened, a seamless large display region provides high browsability. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from the opened state to the folded state. For example, the portable information terminal 9201 can be bent with a radius of curvature of greater than or equal to 1 mm and less than or equal to 150 mm.

The electronic devices described in this embodiment each include the display portion for displaying some kinds of information. However, a semiconductor device according to one embodiment of the present invention can also be used for an electronic device that does not include a display portion. Furthermore, the display portions of the electronic devices described in this embodiment may also be non-flexible and can display images on a flat surface without limitation to a flexible mode capable of displaying images on a curved display surface or a foldable mode.

The structures described in this embodiment can be used in appropriate combination with any of the structures described in the other embodiments.

Example 1

In this example, the hydrogen concentration of an oxide semiconductor film included in the semiconductor device of one embodiment of the present invention, here, an IGZO film, was measured. Samples A1, A2, A3, and A4 described below were formed for evaluation in this example.

(Sample A1)

In Sample A1, an IGZO film was formed over a glass substrate. As the oxide semiconductor film of Sample A1, a 100-nm-thick IGZO film was formed with a sputtering apparatus. The IGZO film was deposited under the conditions where the substrate temperature was 170° C., a deposition gas (Ar/$O_2$=180/20 sccm (oxygen partial pressure=10%)) was introduced into a chamber, the pressure was 0.6 Pa, and an AC power of 2500 W was applied to a metal oxide sputtering target (In:Ga:Zn=4:2:4.1 in an atomic ratio).

(Sample A2)

In Sample A2, an IGZO film was formed over a glass substrate. As the oxide semiconductor film of Sample A2, a 100-nm-thick IGZO film was formed with a sputtering apparatus. The IGZO film was deposited under the conditions where the substrate temperature was 170° C., a deposition gas (Ar/$O_2$=160/40 sccm (oxygen partial pressure=20%)) was introduced into a chamber, the pressure was 0.6 Pa, and an AC power of 2500 W was applied to a metal oxide sputtering target (In:Ga:Zn=4:2:4.1 in an atomic ratio).

(Sample A3)

In Sample A3, an IGZO film was formed over a glass substrate. As the oxide semiconductor film of Sample A3, a 100-nm-thick IGZO film was formed with a sputtering apparatus. The IGZO film was deposited under the conditions where the substrate temperature was 170° C., a deposition gas (Ar/$O_2$=140/60 sccm (oxygen partial pressure=30%)) was introduced into a chamber, the pressure was 0.6 Pa, and an AC power of 2500 W was applied to a metal oxide sputtering target (In:Ga:Zn=4:2:4.1 in an atomic ratio).

(Sample A4)

In Sample A4, an IGZO film was formed over a glass substrate. As the oxide semiconductor film of Sample A4, a 100-nm-thick IGZO film was formed with a sputtering apparatus. The IGZO film was deposited under the conditions where the substrate temperature was 170° C., a deposition gas (Ar/$O_2$=100/100 sccm (oxygen partial pressure=50%)) was introduced into a chamber, the pressure was 0.6 Pa, and an AC power of 2500 W was applied to a metal oxide sputtering target (In:Ga:Zn=4:2:4.1 in an atomic ratio).

<Evaluation of Hydrogen Concentration in IGZO Film>

Figure 38:
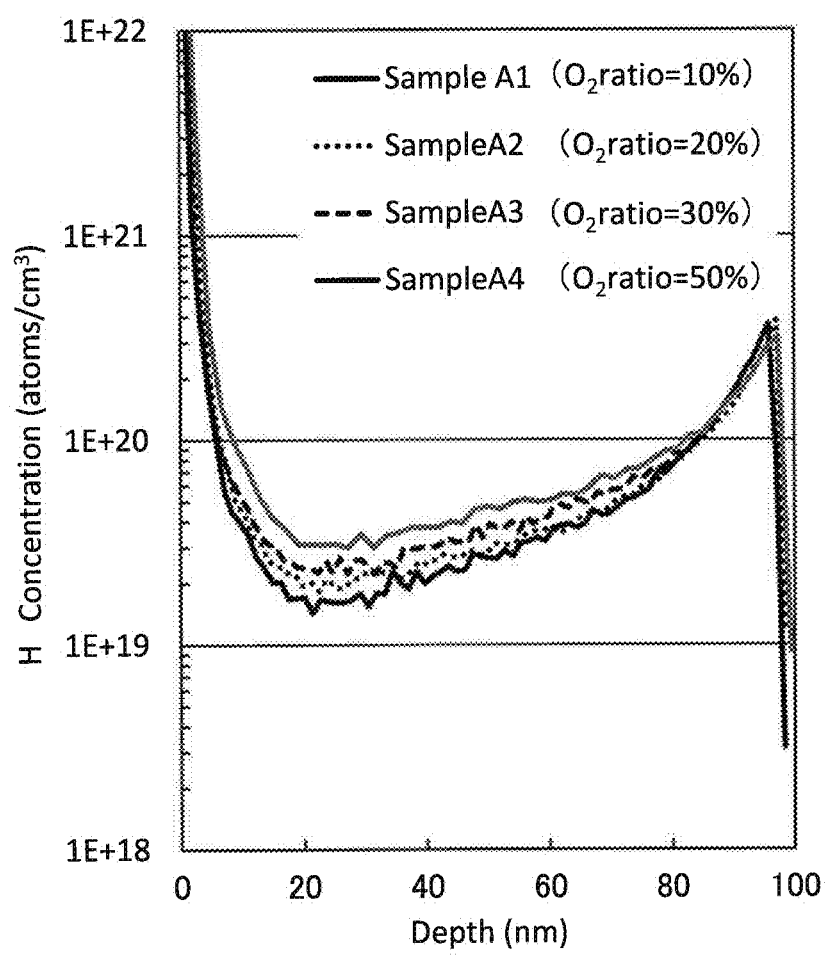
FIG. 38 shows hydrogen concentration depth profiles of samples in Example.

The hydrogen concentration in the IGZO films of Samples A1 to A4 was evaluated. For the evaluation of hydrogen concentration, a SIMS analysis apparatus was used. FIG. 38 shows hydrogen concentration depth profiles of Samples A1 to A4. Furthermore, the hydrogen concentrations in the vicinity of the depth of 50 nm from the surfaces of the IGZO films in Samples A1 to A4 are shown in Table 1.

TABLE 1

|  | Oxygen partial pressure | Hydrogen concentration [atoms/cm$^3$] |
|---|---|---|
| Sample A1 | 10% | 2.64E+19 |
| Sample A2 | 20% | 3.12E+19 |
| Sample A3 | 30% | 3.90E+19 |
| Sample A4 | 50% | 4.73E+19 |

As shown in FIG. 38 and Table 1, when the oxygen partial pressure in deposition of the IGZO film is low, the hydrogen concentration of the IGZO film becomes low.

The structure described in this example can be used as appropriate in combination with any of the structures described in the other embodiments or the other example.

Example 2

In this example, transistors corresponding to the transistor 270B in FIGS. 15C and 15D were formed and tests for electrical characteristics and reliability were performed. In this example, Samples B1 to B3 and Samples C1 to C3 were formed and used for evaluation. Note that Samples B1, B2, C1, and C2 are transistors of one embodiment of the present invention, and Samples B3 and C3 are transistors for comparison. Samples B1 to B3 each included ten transistors with a channel length L of 3 μm and a channel width W of 50 μm over a substrate. In addition, Samples C1 to C3 each included ten transistors with a channel length L of 6 μm and a channel width W of 50 μm over a substrate.

Samples B1 to B3 and Samples C1 to C3 formed in this example will be described below. Note that the reference numerals used for the transistor 270B in FIGS. 15C and 15D are used in the following description.

(Samples B1 and C1)

First, the conductive film 204 was formed over the substrate 202. A glass substrate was used as the substrate 202. As the conductive film 204, a 100-nm-thick tungsten film was formed with a sputtering apparatus.

Next, the insulating films 206 and 207 were formed over the substrate 202 and the conductive film 204. As the insulating film 206, a 400-nm-thick silicon nitride film was formed with a PECVD apparatus. As the insulating film 207, a 50-nm-thick silicon oxynitride film was formed with a PECVD apparatus.

Then, the oxide semiconductor film 208 (the oxide semiconductor film 208b and the oxide semiconductor film 208c) was formed over the insulating film 207. As the oxide semiconductor film 208b, a 10-nm-thick IGZO film was formed with a sputtering apparatus. The oxide semiconductor film 208b was deposited under the conditions where the substrate temperature was 170° C., a deposition gas (Ar/$O_2$=180/20 sccm (oxygen partial pressure=10%)) was introduced into a chamber, the pressure was 0.6 Pa, and an AC power of 2500 W was applied to a metal oxide sputtering target (In:Ga:Zn=4:2:4.1 in an atomic ratio). As the oxide semiconductor film 208c, a 15-nm-thick IGZO film was formed with a sputtering apparatus. The oxide semiconductor film 208c was deposited under the conditions where the substrate temperature was 170° C., a deposition gas (Ar/$O_2$=100/100 sccm (oxygen partial pressure=50%)) was introduced into a chamber, the pressure was 0.6 Pa, and an AC power of 2500 W was applied to a metal oxide sputtering target (In:Ga:Zn=1:1:1.2 in an atomic ratio).

Next, the conductive films 212a and 212b were formed over the insulating film 207 and the oxide semiconductor film 208. As the conductive films 212a and 212b, a 50-nm-thick tungsten film, a 400-nm-thick aluminum film, and a 100-nm-thick titanium film were successively formed in vacuum with a sputtering apparatus.

Then, a surface of the oxide semiconductor film 208c was cleaned. The cleaning was performed in such a manner that a chemical solution obtained by diluting an 85% phosphoric acid solution by 100 times was applied onto the oxide semiconductor film 208c and the oxide semiconductor film 208c was processed for 15 seconds.

Next, the oxide insulating films 214a and 214b were formed over the insulating film 207, the oxide semiconductor film 208, and the conductive films 212a and 212b. As the oxide insulating film 214a, a 50-nm-thick silicon oxynitride film was formed with a PECVD apparatus. As the oxide insulating film 214b, a 400-nm-thick silicon oxynitride film was formed with a PECVD apparatus. Note that the oxide insulating films 214a and 214b were formed successively in vacuum with a PECVD apparatus.

The oxide insulating film 214a was deposited under the conditions where the substrate temperature was 220° C., a silane gas at a flow rate of 50 sccm and a dinitrogen monoxide gas at a flow rate of 2000 sccm were introduced into a chamber, the pressure was 20 Pa, and an RF power of 100 W was supplied between parallel-plate electrodes provided in the PECVD apparatus. The oxide insulating film 214b was deposited under the conditions where the substrate temperature was 220° C., a silane gas at a flow rate of 160 sccm and a dinitrogen monoxide gas at a flow rate of 4000 sccm were introduced into a chamber, the pressure was 200 Pa, and an RF power of 1500 W was supplied between parallel-plate electrodes provided in the PECVD apparatus.

Then, first heat treatment was performed. The first heat treatment was performed at 350° C. in a nitrogen atmosphere for 1 hour.

Next, the protective film 230 was formed over the oxide insulating film 214b. As the protective film 230, a 5-nm-thick ITSO film was used. The ITSO film was deposited under the conditions where the substrate temperature was room temperature, an argon gas at a flow rate of 72 sccm and an oxygen gas at a flow rate of 5 sccm were introduced into a chamber, the pressure was 0.15 Pa, and a DC power of 1000 W was supplied to a metal oxide target ($In_2O_3$:$SnO_2$:$SiO_2$=85:10:5 [wt. %]) provided in a sputtering apparatus.

Next, oxygen addition treatment was performed on the oxide insulating films 214a and 214b through the protective film 230. The oxygen addition treatment was performed with an ashing apparatus under the conditions where the substrate temperature was 40° C., an oxygen gas at a flow rate of 250 sccm was introduced into a chamber, the pressure was 15 Pa, and an RF power of 4500 W was supplied for 120 sec. between parallel-plate electrodes provided in the ashing apparatus so that a bias would be applied to the substrate side.

Then, the protective film 230 was removed. The protective film 230 was removed using a wet-etching apparatus in such a manner that etching was performed using a 5% oxalic acid solution for 300 sec. and then etching was performed using a 0.5% hydrofluoric acid for 15 sec.

Next, the nitride insulating film 218 was formed over the oxide insulating film 214b. As the nitride insulating film 218, a 100-nm-thick silicon nitride film was formed with a PECVD apparatus. The nitride insulating film 218 was deposited under the conditions where the substrate temperature was 350° C.; a silane gas at a flow rate of 50 sccm, a nitrogen gas at a flow rate of 5000 sccm, and an ammonia gas at a flow rate of 100 sccm were introduced into a chamber; the pressure was 100 Pa; and an RF power of 1000 W was supplied between parallel-plate electrodes provided in the PECVD apparatus.

Next, the opening 252c reaching the conductive film 212b and the openings 252a and 252b reaching the conductive film 204 were formed. The openings 252a, 252b, and 252c were formed with a dry etching apparatus.

Next, a conductive film was formed over the nitride insulating film 218 to cover the openings 252a, 252b, and 252c and processed to form the conductive films 220a and 220b. As the conductive films 220a and 220b, a 100-nm-thick ITSO film was formed with a sputtering apparatus. The composition of a target used for forming the ITSO film was the same as that used to form the protective film 230.

Then, second heat treatment was performed. The second heat treatment was performed at 250° C. for 1 hour in a nitrogen atmosphere.

Through the above process, Samples B1 and C1 were formed.

(Samples B2 and C2)

Samples B2 and C2 are formed through the same steps as those for Samples B1 and C1 except the following steps.

The oxide semiconductor film 208 (the oxide semiconductor film 208b and the oxide semiconductor film 208c) was formed over the insulating film 207. As the oxide semiconductor film 208b, a 10-nm-thick IGZO film was formed with a sputtering apparatus. The oxide semiconductor film 208b was deposited under the conditions where the substrate temperature was 170° C., a deposition gas (Ar/$O_2$=140/60 sccm (oxygen partial pressure=30%)) was introduced into a chamber, the pressure was 0.6 Pa, and an AC power of 2500 W was applied to a metal oxide sputtering target (In:Ga:Zn=4:2:4.1 in an atomic ratio). As the oxide semiconductor film 208c, a 15-nm-thick IGZO film was formed with a sputtering apparatus. The oxide semiconductor film 208c was deposited under the conditions where the substrate temperature was 170° C., a deposition gas (Ar/$O_2$=100/100 sccm (oxygen partial pressure=50%)) was introduced into a chamber, the pressure was 0.6 Pa, and an AC power of 2500 W was applied to a metal oxide sputtering target (In:Ga:Zn=1:1:1.2 in an atomic ratio).

(Samples B3 and C3)

Samples B3 and C3 are formed through the same steps as those for Samples B1 and C1 except the following steps.

The oxide semiconductor film 208 (the oxide semiconductor film 208b and the oxide semiconductor film 208c) was formed over the insulating film 207. As the oxide semiconductor film 208b, a 10-nm-thick IGZO film was formed with a sputtering apparatus. The oxide semiconductor film 208b was deposited under the conditions where the substrate temperature was 170° C., a deposition gas (Ar/$O_2$=100/100 sccm (oxygen partial pressure=50%)) was introduced into a chamber, the pressure was 0.6 Pa, and an AC power of 2500 W was applied to a metal oxide sputtering target (In:Ga:Zn=4:2:4.1 in an atomic ratio). As the oxide semiconductor film 208c, a 15-nm-thick IGZO film was formed with a sputtering apparatus. The oxide semiconductor film 208c was deposited under the conditions where the substrate temperature was 170° C., a deposition gas (Ar/

O$_2$=100/100 sccm (oxygen partial pressure=50%)) was introduced into a chamber, the pressure was 0.6 Pa, and an AC power of 2500 W was applied to a metal oxide sputtering target (In:Ga:Zn=1:1:1.2 in an atomic ratio).

Through the above-described steps, Samples B1 to B3 and Samples C1 to C3 were formed.

<Evaluation of Electrical Characteristics>

Figure 41A:
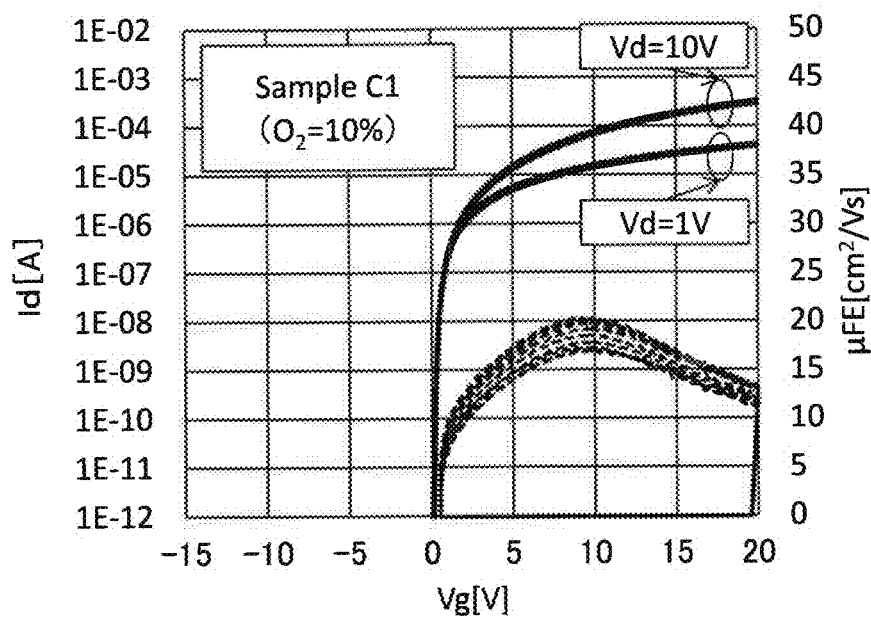
FIGS. 41A and 41B show electrical characteristics measurement results of transistors in Example.
Figure 41B:
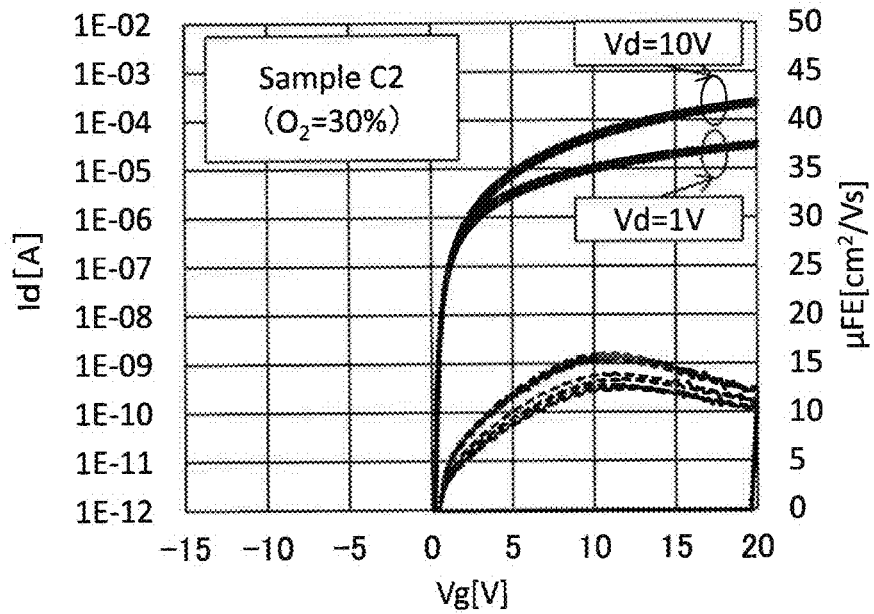
Figure 42:
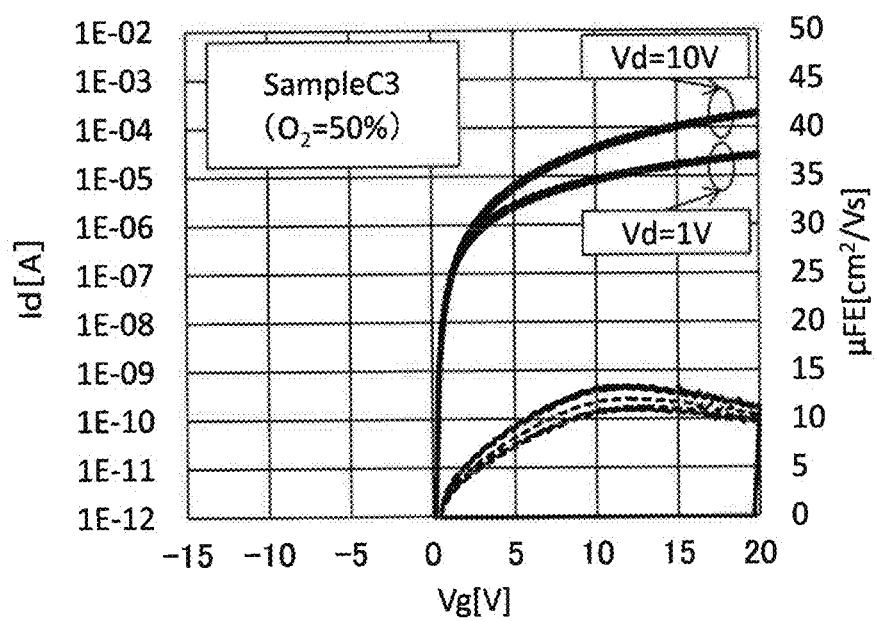
FIG. 42 shows electrical characteristics measurement results of transistors in Example.

Electrical characteristics of Samples B1 to B3 and Samples C1 to C3 were evaluated. The evaluation results of Samples B1 to B3 are shown in FIGS. 39A and 39B and FIG. 40, and the evaluation results of Samples C1 to C3 are shown in FIGS. 41A and 41B and FIG. 42.

Figure 39A:
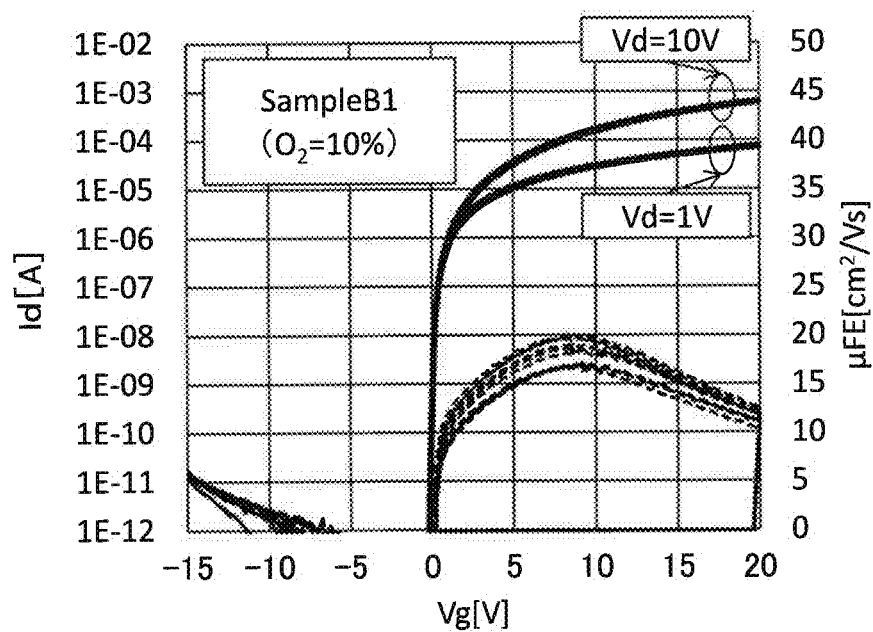
FIGS. 39A and 39B show electrical characteristics measurement results of transistors in Example.
Figure 39B:
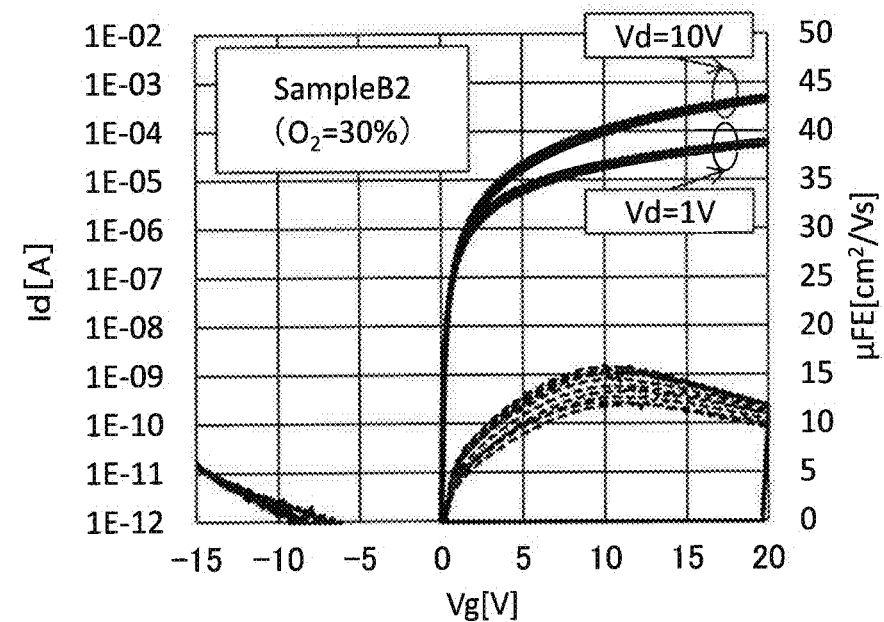
Figure 40:
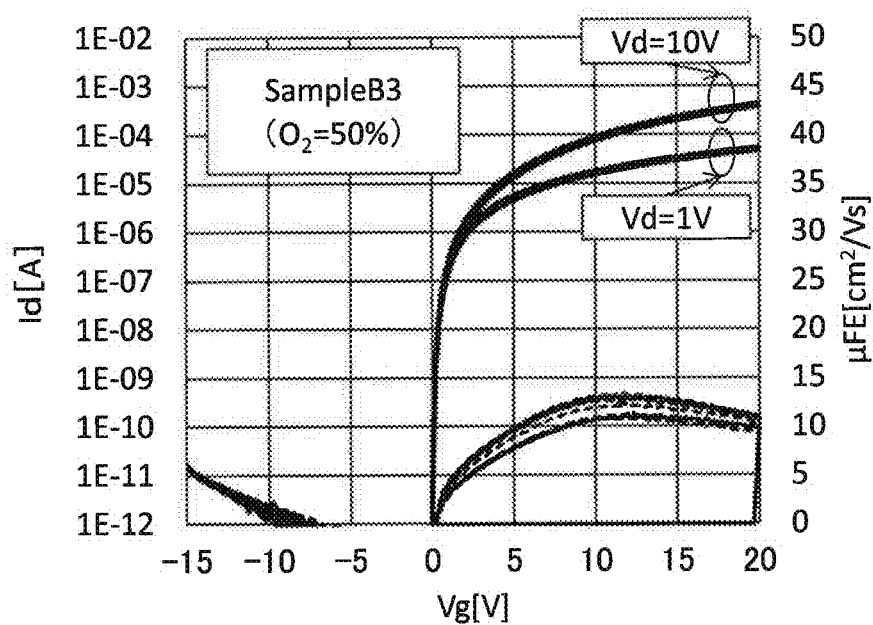
FIG. 40 shows electrical characteristics measurement results of transistors in Example.

FIG. 39A shows electrical characteristics of Sample B1, FIG. 39B shows electrical characteristics of Sample B2, and FIG. 40 shows electrical characteristics of Sample B3. FIG. 41A shows electrical characteristics of Sample C1, FIG. 41B shows electrical characteristics of Sample C2, and FIG. 42 shows electrical characteristics of Sample C3.

In FIGS. 39A and 39B, FIG. 40, FIGS. 41A and 41B, and FIG. 42, the voltage ($V_d$) between the source electrode and the drain electrode was set at 1 V and 10 V, and $V_g$ was applied from −15 V to 20 V at intervals of 0.25 V. Furthermore, the first vertical axis shows the drain current ($I_d$), the second vertical axis shows the mobility μFE (cm$^2$/Vs) when $V_d$ is 10 V, and the horizontal axis shows the gate voltage ($V_g$). The solid line represents $I_d$, the broken line represents μFE, and data of ten transistors are shown for each of them.

The results shown in FIGS. 39A and 39B, FIG. 40, FIGS. 41A and 41B, and FIG. 42 have revealed that Samples B1 to B3 and Samples C1 to C3 have small variations among the transistors and have favorable rising characteristics in the vicinity of 0 V. Samples B1 and B2 of one embodiment of the present invention have higher mobilities μFE than Comparative Sample B3. Samples C1 and C2 of one embodiment of the present invention have higher mobilities μFE than Comparative Sample C3.

Thus, it was confirmed that a transistor with favorable electrical characteristics can be obtained by setting the oxygen partial pressure to be lower than 50% in forming an IGZO film used as the oxide semiconductor film 208b.

<Evaluation of Reliability Based on GBT Test>

Next, reliabilities of Samples C1 to C3 were evaluated. For the reliability evaluation, a bias-temperature stress test (hereinafter, referred to as gate bias temperature (GBT) test) was employed.

Note that the GBT test is one kind of accelerated test and a change in characteristics, caused by long-term usage, of transistors can be evaluated in a short time. In particular, the amount of shift in threshold voltage ($\Delta V_{th}$) of the transistor between before and after the GBT test is an important indicator for examining the reliability. The smaller the shift in the threshold voltage ($\Delta V_{th}$) between before and after the GBT test is, the higher the reliability of the transistor is.

The GBT tests in this example were performed under the conditions where the gate voltage ($V_g$) was ±30 V; the drain voltage ($V_d$) and the source voltage ($V_s$) were 0 V (COMMON); the stress temperature was 60° C.; the time for stress application was 1 hour; and two kinds of measurement environments, a dark environment and a photo environment (irradiation with light having approximately 10000 lx with a white LED), were employed. In other words, the source electrode and the drain electrode of the transistor were set at the same potential, and a potential different from that of the source and drain electrodes was applied to the gate electrode for a certain time (one hour, here). A case where the potential applied to the gate electrode is higher than that of the source and drain electrodes is called positive stress, and a case where the potential applied to the gate electrode is lower than that of the source and drain electrodes is called negative stress. Therefore, in combination with the measurement environments, the GBT stress test was performed under four stress conditions: dark positive stress, dark negative stress, photo positive stress, and photo negative stress.

Figure 43A:
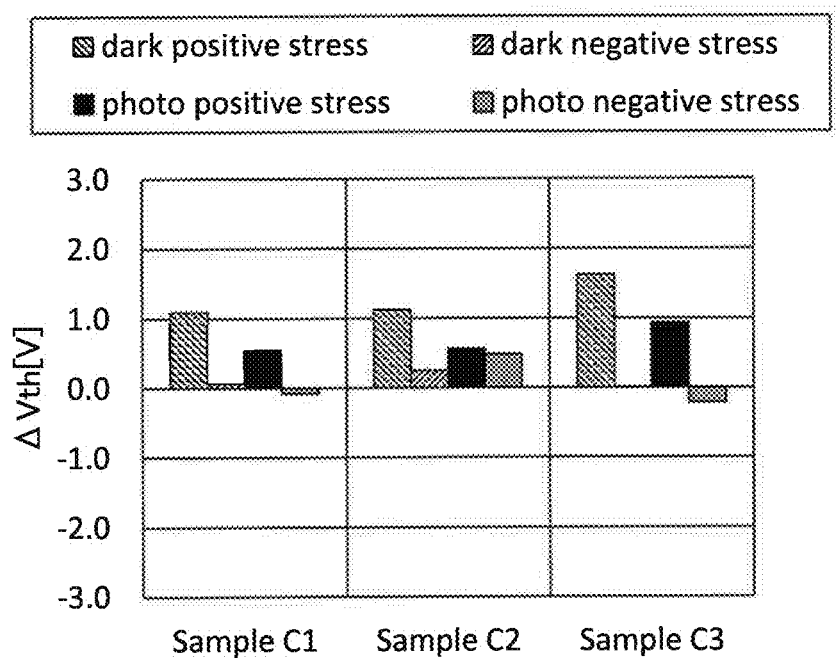
FIGS. 43A and 43B show results of GBT stress tests and ΔVth with respect to stress time of transistors in Example.

FIG. 43A shows GBT test results of Samples C1 to C3. In FIG. 43A, the vertical axis shows the amount of shift in the threshold voltage ($\Delta V_{th}$) of a transistor, and the horizontal axis shows sample name.

The results in FIG. 43A show that the amount of shift in the threshold voltage ($\Delta V_{th}$) in the GBT stress test is small in Samples C1 and C2 of one embodiment of the present invention. In particular, under photo positive stress, the amounts of shift in the threshold voltage ($\Delta V_{th}$) of Samples C1 and C2 is smaller than that of comparative Sample C3.

Thus, the transistors of Samples C1 and C2 of one embodiment of the present invention have small variations.

<Life Estimation of Device Based on Positive GBT Test>

Next, a positive GBT test was performed on Samples C1 to C3. Here, the conditions of the GBT stress test were as follows: the substrate temperature was 60° C.; the measurement environment was a dark environment; the gate voltage was +30 V; and stress time was varied.

The amount of shift in the threshold voltage ($\Delta V_{th}$) was measured by varying the stress time to 0.03 h, 0.14 h, 0.42 h, 0.56 h, and 1 h.

Figure 43B:
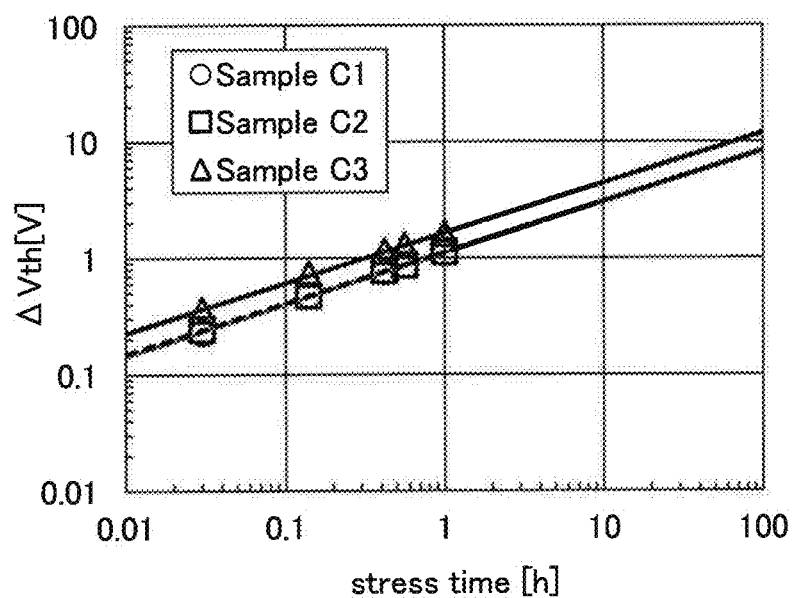

FIG. 43B shows $\Delta V_{th}$ under each conditions of stress time of Samples C1 to C3, and approximate curves obtained from the values $\Delta V_{th}$. Note that all the approximate curves in FIG. 43B are power approximate curves. In FIG. 43B, a gray solid line is the power approximate curve of Sample C1, a black broken line is the power approximate curve of Sample C2, and a black solid line is the power approximate curve of Sample C3. In FIG. 43B, the vertical axis represents the logarithmic $\Delta V_{th}$, and the horizontal axis represents the logarithmic stress time. In FIG. 43B, data and power approximate curves of Samples C1 and C2 substantially overlap each other.

According to the results in FIG. 43B, the amount of shift in the threshold voltage ($\Delta V_{th}$) with respect to the stress time of Samples C1 and C2 of one embodiment of the present invention is smaller than that of comparative Sample C3.

Thus, the transistors of Samples C1 and C2 of one embodiment of the present invention are highly reliable.

The structure described in this example can be used as appropriate in combination with any of the structures described in the other embodiments or the other example.

Reference Example

Here, the oxygen concentration in an oxide insulating film and an oxide semiconductor film in contact with the oxide insulating film was evaluated by forming Samples D1 to D5 described below.

(Sample D1)

In Sample D1, an oxide semiconductor film was formed over a glass substrate. As the oxide semiconductor film, a 35-nm-thick IGZO film was formed with a sputtering apparatus. The IGZO film was deposited under the conditions where the substrate temperature was 170° C., a deposition gas (Ar/O$_2$=100/100 sccm (oxygen partial pressure=50%)) was introduced into a chamber, the pressure was 0.6 Pa, and an AC power of 2500 W was applied to a metal oxide sputtering target (In:Ga:Zn=1:1:1.2 in an atomic ratio).

Then, first heat treatment was performed. As the first heat treatment, heat treatment was performed at 450° C. for 1 hour in a nitrogen atmosphere and then heat treatment was performed at 450° C. for 1 hour in a mixed atmosphere of nitrogen and oxygen.

Next, an oxide insulating film was formed over the oxide semiconductor film. The conditions similar to those for forming the oxide insulating films 214a and 214b in Example 2 were used for forming the oxide insulating film. Note that in Reference Example, the oxide insulating film is abbreviated as SiON or SiON film.

Then, second heat treatment was performed. The second heat treatment was performed at a temperature of 350° C. for one hour in a nitrogen atmosphere.

Through the above process, Sample D1 was formed.
(Sample D2)

In Sample D2, after the steps similar to those for forming Sample D1 are performed, an ITSO film was formed over the oxide insulating film. The conditions similar to those for forming the protective film 230 in Example 2 were used for forming the ITSO film.

Next, oxygen addition treatment was performed on the oxide insulating films through the ITSO film. The oxygen addition treatment was performed with an ashing apparatus under the conditions where the substrate temperature was 40° C., an oxygen gas ($^{16}O$) at a flow rate of 150 sccm and an oxygen gas ($^{18}O$) at a flow rate of 100 sccm were introduced into a chamber, the pressure was 15 Pa, and an RF power of 4500 W was supplied for 120 sec. between parallel-plate electrodes provided in the ashing apparatus so that a bias would be applied to the substrate side. Since the SiON film included oxygen ($^{16}O$) at a main component level, an oxygen gas ($^{18}O$) was used to exactly measure the amount of oxygen added by the oxygen addition treatment.

Through the above process, Sample D2 was formed.
(Sample D3)

In Sample D3, after the steps similar to those for forming Sample D2 are performed, a step of removing the ITSO film was performed. The conditions similar to those in the method for removing the protective film 230 in Example 2 were used for the step of removing the ITSO film.

Through the above process, Sample D3 was formed.
(Sample D4)

In Sample D4, after the steps similar to those for forming Sample D3 are performed, a nitride insulating film was formed over the oxide insulating film. The conditions similar to those for forming the nitride insulating film 218 in Example 2 were used for forming the nitride insulating film.

Through the above process, Sample D4 was formed.
(Sample D5)

In Sample D5, after the steps similar to those for forming Sample D4 are performed, third heat treatment was performed. The third heat treatment was performed at 250° C. in a nitrogen atmosphere for 1 hour.

Through the above process, Sample D5 was formed.
<Evaluation of Oxygen Concentration in SiON Film and IGZO Film>

Figure 44:
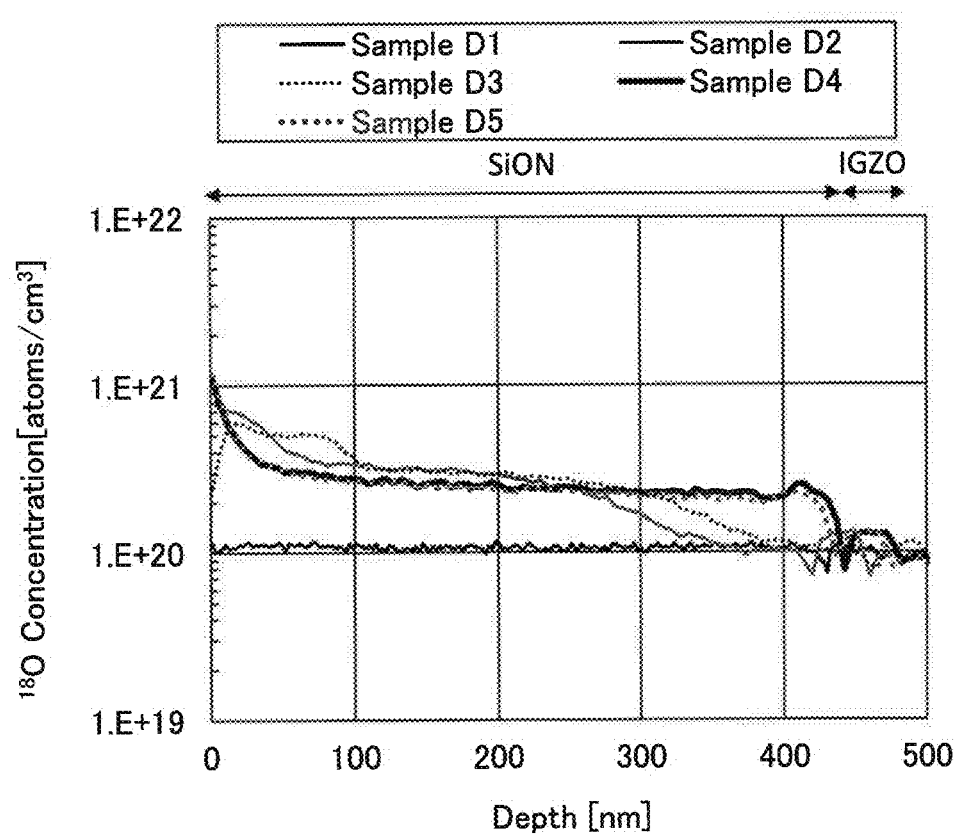
FIG. 44 shows oxygen concentration depth profiles of samples in Reference Example.

Next, the oxygen concentration in the SiON film and the IGZO film in Samples D1 to D5 was evaluated. For the evaluation of oxygen concentration, a SIMS analysis apparatus was used. FIG. 44 shows oxygen concentration depth profiles of Samples D1 to D5. Note that the oxygen concentration depth profiles in FIG. 44 are results of substrate side depth profile (SSDP)-SIMS.

As shown in FIG. 44, oxygen ($^{18}O$) is not detected substantially in the SION film and the IGZO film of Sample D1 because the oxygen addition treatment was not performed on Sample D1. Oxygen ($^{18}O$) exists at only a natural abundance of 0.2%. Thus, the SiON film and the IGZO film of Sample D1 include little oxygen ($^{18}O$).

In contrast, oxygen ($^{18}O$) was detected from the SiON film of Sample D2 subjected to the oxygen addition treatment. Furthermore, in Sample D3 that was formed through steps in addition to the steps for Sample D2, oxygen ($^{18}O$) is diffused to approximately 50 nm in the depth direction in the SiON film. However, oxygen ($^{18}O$) is not diffused to the IGZO film in Samples D2 and D3.

Moreover, in Samples D4 and D5 that was formed through steps in addition to the steps for Sample D3, since the nitride insulating film is provided, the SiON film is heated at 350° C. when the nitride insulating film is formed. Although oxygen ($^{18}O$) is detected only in the SiON film in Samples D2 and D3, this heat treatment makes oxygen ($^{18}O$) diffuse to the vicinity of the surface of the IGZO film or into the IGZO film in Samples D4 and D5.

As described above, by addition of oxygen to the oxide insulating film, the added oxygen is diffused toward the oxide semiconductor film.

This application is based on Japanese Patent Application serial no. 2014-186092 filed with Japan Patent Office on Sep. 12, 2014, the entire contents of which are hereby incorporated by reference.

What is claimed is:

1. A manufacturing method of a semiconductor device comprising the steps of:
    forming an oxide semiconductor film with a sputtering apparatus;
    forming an oxide insulating film over and in contact with the oxide semiconductor film;
    forming a protective film over and in contact with the oxide insulating film; and
    adding oxygen to the oxide insulating film through the protective film,
    wherein the protective film comprises at least one element selected from In, Zn, Ga, Sn, Ti, W, Ta, and Mo, and
    wherein the oxide semiconductor film is formed at a condition in which an oxygen partial pressure in the sputtering apparatus is higher than 0% and lower than 50%.

2. The manufacturing method of a semiconductor device according to claim 1, further comprising a step of heating the oxide insulating film before forming the protective film.

3. The manufacturing method of a semiconductor device according to claim 1,
    wherein an oxygen gas is used for a sputtering gas at the step of forming the oxide semiconductor film, and
    wherein the oxygen gas has a dew point of −40° C. or lower.

4. The manufacturing method of a semiconductor device according to claim 1, further comprising a step of heating the oxide semiconductor film before forming the oxide insulating film,
    wherein an oxygen vacancy is formed in the oxide semiconductor film in the step of heating the oxide semiconductor film.

5. The manufacturing method of a semiconductor device according to claim 4,
    wherein the step of heating the oxide semiconductor film is performed in an atmosphere in which an oxygen partial pressure is lower than or equal to 1%.

6. The manufacturing method of a semiconductor device according to claim 1,
    wherein the oxide semiconductor film comprises In, Zn, and M, and wherein M is any one of Ti, Ga, Y, Zr, La, Ce, Nd, Sn, and Hf.

7. The manufacturing method of a semiconductor device according to claim 1,
wherein the oxide semiconductor film comprises a crystal part.

8. The manufacturing method of a semiconductor device according to claim 1, wherein the protective film further comprises Si.

9. The manufacturing method of a semiconductor device according to claim 1, wherein the step of adding oxygen is performed with a plasma treatment apparatus.

10. A manufacturing method of a semiconductor device comprising the steps of:
    forming an oxide semiconductor film with a sputtering apparatus;
    forming an oxide insulating film over and in contact with the oxide semiconductor film;
    forming a protective film over and in contact with the oxide insulating film;
    adding oxygen to the oxide insulating film through the protective film;
    removing the protective film; and
    forming an insulating film over and in contact with the oxide insulating film after removing the protective film,
    wherein the protective film comprises at least one element selected from In, Zn, Ga, Sn, Ti, W, Ta, and Mo, and
    wherein the oxide semiconductor film is formed at a condition in which an oxygen partial pressure in the sputtering apparatus is higher than 0% and lower than 50%.

11. The manufacturing method of a semiconductor device according to claim 10, further comprising a step of heating the oxide insulating film before forming the protective film.

12. The manufacturing method of a semiconductor device according to claim 10,
wherein the insulating film is a nitride insulating film.

13. The manufacturing method of a semiconductor device according to claim 10,
wherein an oxygen gas is used for a sputtering gas at the step of forming the oxide semiconductor film, and
wherein the oxygen gas has a dew point of −40° C. or lower.

14. The manufacturing method of a semiconductor device according to claim 10, further comprising a step of heating the oxide semiconductor film before forming the oxide insulating film,
wherein an oxygen vacancy is formed in the oxide semiconductor film in the step of heating the oxide semiconductor film.

15. The manufacturing method of a semiconductor device according to claim 14,
wherein the step of heating the oxide semiconductor film is performed in an atmosphere in which an oxygen partial pressure is lower than or equal to 1%.

16. The manufacturing method of a semiconductor device according to claim 10,
wherein the oxide semiconductor film comprises In, Zn, and M, and
wherein M is any one of Ti, Ga, Y, Zr, La, Ce, Nd, Sn, and Hf.

17. The manufacturing method of a semiconductor device according to claim 10,
wherein the oxide semiconductor film comprises a crystal part.

18. The manufacturing method of a semiconductor device according to claim 10, wherein the protective film further comprises Si.

19. The manufacturing method of a semiconductor device according to claim 10, wherein the step of adding oxygen is performed with a plasma treatment apparatus.

* * * * *